United States Patent
Taguchi et al.

(10) Patent No.: US 11,635,557 B2
(45) Date of Patent: Apr. 25, 2023

(54) LAMINATE, KIT, METHOD FOR PRODUCING LAMINATE, AND OPTICAL SENSOR

(71) Applicant: FUJIFILM Corporation, Tokyo (JP)

(72) Inventors: Yoshinori Taguchi, Shizuoka (JP); Keisuke Arimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1160 days.

(21) Appl. No.: 16/230,836

(22) Filed: Dec. 21, 2018

(65) Prior Publication Data

US 2019/0135951 A1    May 9, 2019

Related U.S. Application Data

(63) Continuation of application No. PCT/JP2017/025059, filed on Jul. 10, 2017.

(30) Foreign Application Priority Data

Jul. 15, 2016 (JP) .............................. JP2016-140307

(51) Int. Cl.
| | |
|---|---|
| *G02B 5/28* | (2006.01) |
| *C08F 220/18* | (2006.01) |
| *C08F 2/50* | (2006.01) |
| *G03F 7/031* | (2006.01) |
| *C08F 220/28* | (2006.01) |
| *G03F 7/033* | (2006.01) |
| *G03F 7/038* | (2006.01) |
| *G03F 7/105* | (2006.01) |
| *H05K 3/28* | (2006.01) |

(52) U.S. Cl.
CPC .............. *G02B 5/281* (2013.01); *C08F 2/50* (2013.01); *C08F 220/1807* (2020.02); *C08F 220/283* (2020.02); *G03F 7/031* (2013.01); *G03F 7/033* (2013.01); *G03F 7/0388* (2013.01); *G03F 7/105* (2013.01); *H05K 3/287* (2013.01)

(58) Field of Classification Search
CPC ... G02B 5/281; G02B 5/20; C08F 2/50; C08F 220/1807; C08F 220/283; C08F 220/22; C08F 220/54; G03F 7/031; G03F 7/033; G03F 7/0388; G03F 7/105; G03F 7/028; H05K 3/287; B32B 7/023; B32B 27/08; B32B 27/20; B32B 2307/4026
See application file for complete search history.

(56) References Cited

U.S. PATENT DOCUMENTS

| | | | |
|---|---|---|---|
| 2006/0147673 A1 | 7/2006 | Ueda et al. | |
| 2015/0000544 A1 | 1/2015 | Shiraki et al. | |
| 2015/0168618 A1* | 6/2015 | Nakajima | ................ G02B 5/26 359/359 |
| 2015/0372037 A1* | 12/2015 | Tomeba | ............ H01L 27/14645 252/586 |

FOREIGN PATENT DOCUMENTS

| | | |
|---|---|---|
| CN | 104203588 A | 12/2014 |
| JP | 2006-340675 A | 12/2006 |
| JP | 2013-63659 A | 4/2013 |
| JP | 2015-34961 A | 2/2015 |
| JP | 2016-17141 A | 2/2016 |
| TW | 200426025 A | 12/2004 |
| TW | I252162 B | 4/2006 |
| TW | 201420659 A | 6/2014 |
| WO | WO 2004/076172 A1 | 9/2004 |
| WO | WO 2013/145949 A1 | 10/2013 |

OTHER PUBLICATIONS

Korean Office Action dated Apr. 9, 2020, for corresponding Korean Patent Application No. 10-2018-7037784, with English translation.
Japanese Office Action, dated Nov. 26, 2019, for corresponding Japanese Application No. 2018-527588, with an English translation.
Taiwanese Office Action and Search Report for corresponding Taiwanese Application No. 106123032, dated Jan. 12, 2021, with English translation.
International Preliminary Report on Patentability and the Written Opinion of the International Searching Authority (Forms PCT/IB/326, PCT/IB/373 and PCT/ISA/237) for International Application No. PCT/JP2017/025059, dated Jan. 24, 2019, with English translation of the Written Opinion.
International Search Report (form PCT/ISA/210) dated Oct. 10, 2017, for International Application No. PCT/JP2017/025059, with English translation.

* cited by examiner

*Primary Examiner* — Jessica M Roswell
(74) *Attorney, Agent, or Firm* — Birch, Stewart, Kolasch & Birch, LLP

(57) ABSTRACT

Provided is a laminate having a good whiteness and a high infrared-shielding property. Provided are also a kit forming the above-mentioned laminate, a method for producing a laminate, and an optical sensor. The laminate includes an infrared-shielding layer and a white layer, in which the infrared-shielding layer is a layer that shields at least a part of a wavelength range at 800 to 1,500 nm, and the white layer has a value of L* of 35 to 100, a value of a* of −20 to 20, and a value of b* of −40 to 30 in a L*a*b* color coordinate system of CIE 1976.

8 Claims, 1 Drawing Sheet

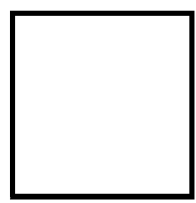 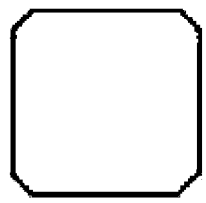 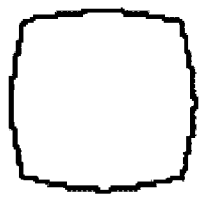 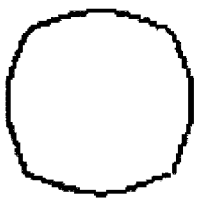 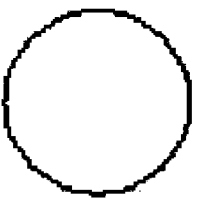
(a)　　　　(b)　　　　(c)　　　　(d)　　　　(e)

LAMINATE, KIT, METHOD FOR PRODUCING LAMINATE, AND OPTICAL SENSOR

CROSS-REFERENCE TO RELATED APPLICATIONS

This application is a Continuation of PCT International Application No. PCT/JP2017/025059 filed on Jul. 10, 2017, which claims priority under 35 U.S.C. § 119(a) to Japanese Patent Application No. 2016-140307 filed on Jul. 15, 2016. Each of the above application(s) is hereby expressly incorporated by reference, in its entirety, into the present application.

BACKGROUND OF THE INVENTION

1. Field of the Invention

The present invention relates to a laminate, a kit, a method for producing a laminate, and an optical sensor.

2. Description of the Related Art

Production of a film using a composition including a pigment has been performed. Further, production of a white film using a composition including a white pigment such as titanium oxide has recently been performed (see JP2015-034961A).

SUMMARY OF THE INVENTION

In recent years, it has been studied to use a white film in an optical sensor and the like. The present inventors have conducted extensive studies on an optical sensor using a white film, and as a result, they have found that there is tendency that sensing with high accuracy can be carried out by enhancing an infrared-shielding property of the white film. Further, there is neither description nor disclosure of the infrared-shielding property in JP2015-034961A.

Therefore, an object of the present invention is to provide a laminate having a good whiteness and a high infrared-shielding property. Another object of the present invention is to provide a kit forming the above-mentioned laminate, a method for producing a laminate, and an optical sensor.

Under these circumstances, the present inventors have conducted extensive studies, and as a result, they have found that the objects can be accomplished with a laminate which will be described later, thus leading to completion of the present invention. The present invention provides the followings.

<1> A laminate comprising:
an infrared-shielding layer; and
a white layer,
in which the infrared-shielding layer is a layer that shields at least a part of a wavelength range at 800 to 1,500 nm, and
the white layer has a value of L* of 35 to 100, a value of a* of −20 to 20, and a value of b* of −40 to 30 in a L*a*b* color coordinate system of CIE 1976.

<2> The laminate as described in <1>,
in which the white layer has a value of L* of 35 to 100, a value of a* of −10 to 0, and a value of b* of −35 to 0 in a L*a*b* color coordinate system of CIE 1976.

<3> The laminate as described in <1> or <2>,
in which the white layer includes a white pigment.

<4> The laminate as described in <3>,
in which the white pigment is in the form of particles having an average primary particle diameter of 50 to 150 nm.

<5> The laminate as described in <4>,
in which the content of the particles having an average primary particle diameter of 50 to 150 nm is 30% to 60% by mass with respect to the total solid content of the white layer.

<6> The laminate as described in any one of <3> to <5>,
in which the white pigment is titanium oxide.

<7> The laminate as described in any one of <1> to <6>,
in which the infrared-shielding layer includes a compound having a maximum absorption wavelength in the range of 800 to 1,500 nm.

<8> The laminate as described in any one of <1> to <7>,
in which the infrared-shielding layer contains at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex.

<9> The laminate as described in any one of <1> to <7>,
in which the infrared-shielding layer contains tungsten oxide containing an alkali metal.

<10> A kit for forming a laminate having an infrared-shielding layer and a white layer, comprising:
a composition for forming an infrared-shielding layer containing a compound having a maximum absorption wavelength in a wavelength range at 800 to 1,500 nm; and
a composition for forming a white layer, including a white pigment and having a value of L* of 35 to 75 in a L*a*b* color coordinate system of CIE 1976 in a case of forming a film with a thickness of 3 μm.

<11> The kit as described in <10>, which is a kit for forming the laminate as described in any one of <1> to <9>.

<12> The kit as described in <10> or <11>,
in which the composition for forming a white layer includes an alkali-soluble resin.

<13> The kit as described in any one of <10> to <12>,
in which the composition for forming a white layer includes a radically polymerizable compound and a photopolymerization initiator.

<14> The kit as described in any one of <10> to <13>,
in which the composition for forming a white layer includes a chain transfer agent.

<15> The kit as described in any one of <10> to <14>,
in which the white pigment is in the form of particles having an average primary particle diameter of 50 to 150 nm.

<16> The kit as described in <15>,
in which the content of the particles having an average primary particle diameter of 50 to 150 nm is 30% to 60% by mass with respect to the total solid content of the composition for forming a white layer.

<17> The kit as described in any one of <10> to <16>,
in which the white pigment is titanium oxide.

<18> The kit as described in any one of <10> to <17>,
in which the composition for forming an infrared-shielding layer contains at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex.

<19> The kit as described in any one of <10> to <17>, in which the composition for forming an infrared-shielding layer contains tungsten oxide containing an alkali metal.

<20> A method for producing a laminate including an infrared-shielding layer and a white layer, comprising:

a step of forming the infrared-shielding layer on a support; and a step of forming the white layer on the infrared-shielding layer, in which the infrared-shielding layer is a layer that shields at least a part of a wavelength range at 800 to 1,500 nm, and the white layer has a value of L* of 35 to 100, a value of a* of −20 to 20, and a value of b* of −40 to 30 in a L*a*b* color coordinate system of CIE 1976.

<21> An optical sensor comprising the laminate as described in any one of <1> to <9>.

According to the present invention, it is possible to provide a laminate having a good whiteness and a high infrared-shielding property. It is also possible to provide a kit forming the above-mentioned laminate, a method for producing a laminate, and an optical sensor.

BRIEF DESCRIPTION OF THE DRAWING

FIG. 1 is a view showing an evaluation standard for a pattern shape.

DESCRIPTION OF THE PREFERRED EMBODIMENTS

Hereinafter, the contents of the present invention will be described in detail.

Description of configuration requirements described below may be made on the basis of representative embodiments of the present invention, but the present invention is not limited to such embodiments.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "(meth)acrylate" represents acrylate and methacrylate, "(meth)acryl" represents acryl and methacryl, and "(meth)acryloyl" represents acryloyl and methacryloyl.

In the present specification, Me in a formula represents a methyl group, Et represents an ethyl group, Pr represents a propyl group, Bu represents a butyl group, and Ph represents a phenyl group.

In the present specification, "exposure" includes, unless otherwise specified, not only exposure using light but also lithography by particle rays such as electron beams and ion beams. Incidentally, light to be used in exposure means actinic rays or radiation such as a bright line spectrum of a mercury lamp, far ultraviolet rays typified by an excimer laser, extreme ultraviolet rays (EUV light), X-rays, and electron beams.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm (inner diameter)×15.0 cm) as columns, and a 10-mmol/L lithium bromide N-methylpyrrolidinone (NMP) solution as an eluent.

<Laminate>

The laminate of an embodiment of the present invention includes an infrared-shielding layer and a white layer, in which the infrared-shielding layer is a layer that shields at least a part of a wavelength range at 800 to 1,500 nm, and the white layer has a value of L* of 35 to 100, a value of a* of −20 to 20, and a value of b* of −40 to 30 in a L*a*b* color coordinate system of CIE 1976.

Since the laminate of the embodiment of the present invention has a value of L* of 35 to 100, a value of a* of −20 to 20, and a value of b* of −40 to 30 for the white layer, the whiteness is also excellent. Further, since the laminate has the infrared-shielding layer, the infrared-shielding property is excellent. Therefore, the laminate of the embodiment of the present invention is excellent in the whiteness and the infrared-shielding property. Further, since noise caused by infrared rays can be reduced by using the laminate as an optical sensor, sensing with high accuracy can be carried out. The white layer preferably has a value of L* of 35 to 100, a value of a* of −10 to 0, and a value of b* of −35 to 0. Further, the value of L*, the value of a*, and the value of b* in a L*a*b* color coordinate system of CIE 1976 are the values measured by the methods described in Examples which will be described later.

The value of L* of the white layer in the laminate of the embodiment of the present invention is preferably 40 or more, more preferably 50 or more, and still more preferably 60 or more. According to this aspect, a white layer having excellent whiteness can be obtained. Further, the value of L* of the white layer is preferably 95 or less, more preferably 90 or less, and still more preferably 85 or less. According to this aspect, a white layer having appropriate visible transparency can be obtained.

For the white layer in the laminate of the embodiment of the present invention, the value of L* of the white layer in a case where the film thickness of the white layer was set to 3 μm is preferably 35 to 75. The lower limit is preferably 40 or more, more preferably 50 or more, and still more preferably 60 or more. Further, the upper limit is preferably 70 or less. According to this aspect, a white layer having excellent whiteness and visible transparency can be obtained.

The value of a* of the white layer in the laminate of the embodiment of the present invention is preferably −15 or more, more preferably −10 or more, and still more preferably −5 or more. Further, the value of a* of the white layer is preferably 10 or less, more preferably 5 or less, and still more preferably 0 or less. According to this aspect, a white layer having excellent whiteness can be obtained.

The value of b* of the white layer in the laminate of the embodiment of the present invention is preferably −35 or more, more preferably −30 or more, and still more preferably −25 or more. Further, the value of b* of the white layer is preferably 20 or less, more preferably 10 or less, and still more preferably 0 or less. According to this aspect, a white layer having excellent whiteness can be obtained.

In the laminate of the embodiment of the present invention, the film thickness of the white layer is preferably 3 to 40 µm. The upper limit of the film thickness is preferably 30 µm or less, more preferably 20 µm or less, and still more preferably 15 µm or less. The lower limit of the film thickness is preferably 5 µm or more, more preferably 7 µm or more, and still more preferably 9 µm or more. In a case where the film thickness of the white layer is within the range, an effect of reduction in the film thickness of a sensor and improvement of a device optical sensitivity due to inhibition of cross torques can be expected.

In the laminate of the embodiment of the present invention, the average transmittance in a wavelength range at 400 to 700 nm of the white layer is preferably 1% or more, more preferably 10% or more, and particularly preferably 30% or more. The upper limit of the average transmittance is preferably 50% or less.

In the laminate of the embodiment of the present invention, the white layer preferably includes a white pigment. Further, in the present invention, the white pigment includes not only pure white pigments, but also bright grey close to white (for example, off-white and light grey) pigments.

The content of the white pigment in the white layer is preferably 1% to 75% by mass with respect to the total solid content of the white layer. The lower limit is preferably 3% by mass or more, more preferably 5% by mass or more, still more preferably 25% by mass or more, and particularly preferably 35% by mass or more. The upper limit is preferably 60% by mass or less, more preferably 55% by mass or less, still more preferably 50% by mass or less, even still more preferably 45% by mass or less, and particularly preferably 42% by mass or less. In a case where the content of the white pigment is within the range, the whiteness is good. In addition, a color mixture and the like of a white layer in a case where the white layer is formed on the infrared-shielding layer can be effectively suppressed. The white layer may include only one kind or two or more kinds of white pigments. In a case where the white layer includes two or more kinds of the white pigments, the total amount thereof preferably falls within the range.

The white pigment is preferably in the form of particles having a refractive index to light at a wavelength of 589 nm of 2.10 or more. The above-mentioned refractive index is preferably 2.10 to 2.75, and more preferably 2.50 to 2.75. In a case where the refractive index to light at a wavelength of 589 nm of the particles is 2.10 or more, the value of L* can be increased, which is thus preferable.

The refractive index of the white pigment can be measured by the following method. First, a dispersion liquid is prepared using a white pigment and a resin (dispersant) having a known refractive index, and propylene glycol monomethyl ether acetate. Thereafter, the prepared dispersion liquid and a resin having a known refractive index are mixed to prepare coating liquids having concentrations of the white pigment of 10% by mass, 20% by mass, 30% by mass, and 40% by mass in the total solid content of the coating liquid. After these coating liquids are used on a silicon wafer to form a film in 300 nm, and then the refractive index of the obtained film is measured using ellipsometry (Lambda Ace RE-3300 (trade name), Dainippon Screen Mfg. Co., Ltd.). Thereafter, by plotting the white pigment concentration and the refractive index on a graph and performing extrapolation, the refractive index of the white pigment is derived.

After extracting the white pigment from the white layer by the following method, the refractive index of the white pigment can also be measured by the method. As for a method for extracting the white pigment from the white layer, for example, 2 to 6 mol/L of a basic solution can be added to a white layer in the amount of 10% to 30% by mass with respect to the mass of the white layer, heated and refluxed for 12 hours, and then filtered and washed to extract a white pigment.

The average primary particle diameter of the white pigment is preferably 50 to 300 nm, more preferably 50 to 200 nm, still more preferably 50 to 150 nm, even still more preferably 50 to 130 nm, and particularly preferably 50 to 100 nm. In a case where the average primary particle diameter of the white pigment is within the range, a white layer having good whiteness can be obtained. Above all, in a case where the average primary particle diameter of the white pigment is 50 to 150 nm (preferably 50 to 130 nm, and more preferably 50 to 100 nm), a white layer having good whiteness can be obtained while increasing visible transparency. In addition, the temporal stability of the composition used for the formation of a white layer can be increased. For example, sedimentation of the white pigment and the like can be effectively suppressed. The average primary particle diameter of the white pigment can be determined by observing the white pigment with a transmission electron microscope (TEM), and a portion in which the particles of the white pigment are not aggregated (primary particles). In the present invention, with regard to the average primary particle diameter of the white pigment, a number-based arithmetic mean diameter calculated from the particle size distribution was taken as an average primary particle diameter. In the present invention, with regard to the particle size distribution of the white pigment is determined by taking a transmission electron microscopic image of the primary particles of the white pigment using a transmission electron microscope, and then measuring the particle size distribution with an image treatment device using the image. An electron microscope (H-7000) manufactured by Hitachi High-Technologies Corporation can be used as the transmission electron microscope. LUZEX AP manufactured by NIRECO Corporation can be used as the image treatment device.

The content of the particles having an average primary particle diameter of 50 to 150 nm in the white layer is preferably 30% to 60% by mass, and more preferably 35% to 50% by mass, with respect to the total solid content of the white layer. According to this aspect, a white layer having good whiteness can be obtained while increasing the visible transparency. In addition, the temporal stability of the composition used for the formation of a white layer can be increased.

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably in the form of particles having titanium atom, and more preferably titanium oxide. As the titanium oxide, the titanium oxide described in "Titanium Oxide-Physical Properties and Applied Technology, written by Manabu Kiyono, published on Jun. 25, 1991, published by Shuppan Co., Ltd." can also be suitably used.

With regard to titanium oxide, the content (purity) of titanium dioxide ($TiO_2$) is preferably 70% by mass or more, more preferably 80% by mass or more, and still more preferably 85% by mass or more. Titanium oxide is a lower titanium oxide represented by $Ti_nO_{2n-1}$ (n represents a number of 2 to 4), and the content of titanium oxynitride and the like is preferably 30% by mass or less, more preferably 20% by mass or less, and still more preferably 15% by mass or less.

The titanium oxide may be either anatase type titanium oxide or rutile type titanium oxide, but from the viewpoints of a coloring property, and the temporal stability of the composition, the rutile type titanium oxide is preferable. In particular, the rutile type titanium oxide has a small change in the color difference even with heating and has a good coloring property. In addition, the reutilization rate of titanium oxide is preferably 95% or more, and more preferably 99% or more.

As the rutile type titanium oxide, known ones can be used. As a method for producing the rutile type titanium oxide, there are two kinds of methods, a sulfuric acid method and a chlorine method, and in the present invention, rutile type titanium oxide produced by any of the methods can be suitably used. Here, the sulfuric acid method refers to a method in which ilmenite ore or titanium slag is used as a raw material, which is dissolved in concentrated sulfuric acid to separate iron as iron sulfate, the solution is hydrolyzed to obtain a precipitate of hydroxide, and the hydroxide is calcined at a high temperature to recover rutile type titanium oxide. On the other hand, the chlorine method refers to a production method in which synthetic rutile or natural rutile used as a raw material is reacted with chlorine gas and carbon at a high temperature of about 1,000° C. to synthesize titanium tetrachloride, which is oxidized to extract rutile type titanium oxide. The rutile type titanium oxide is preferably rutile type titanium oxide obtained by the chlorine method.

As the specific surface area of titanium oxide, a value thereof as measured by a Brunauer, Emmett, and Teller (BET) method is preferably 10 to 400 m$^2$/g, more preferably 10 to 200 m$^2$/g, still more preferably 10 to 150 m$^2$/g, particularly preferably 10 to 40 m$^2$/g, and most preferably 10 to 20 m$^2$/g.

The pH of titanium oxide is preferably 6 to 8.

The oil absorption amount of titanium oxide is preferably 10 to 60 (g/100 g), and more preferably 10 to 40 (g/100 g).

For titanium oxide, the total amount of $Fe_2O_3$, $Al_2O_3$, $SiO_2$, $Nb_2O_5$, and $Na_2O$ is preferably 0.1% by mass or less, more preferably 0.05% by mass or less, and still more preferably 0.02% by mass or less, and particularly preferably, titanium oxide is not substantially included.

The shape of titanium oxide is not particularly limited. Examples thereof include shapes such as an isotropic shape (for example, a spherical shape and a polyhedral shape), an anisotropic shape (for example, a needle-like shape, a rod-like shape, and a plate-like shape), and an amorphous shape.

The hardness (Mohs hardness) of titanium oxide is preferably 5 to 8, and more preferably 7 to 7.5.

The true specific gravity (density) of titanium oxide is preferably 1.0 to 6.0 g/cm$^3$, and more preferably 3.9 to 4.5 g/cm$^3$.

The volume gravity of titanium oxide is preferably 0.1 g/cm$^3$ to 1.0 g/cm$^3$, and more preferably 0.2 g/cm$^3$ to 0.4 g/cm$^3$.

A white pigment such as titanium oxide may be a material which has been subjected to a surface treatment with a surface treating agent such as an organic compound. Examples of the surface treating agent used for the surface treatment of the white pigment include a polyol, aluminum oxide, aluminum hydroxide, silica (silicon oxide), hydrated silica, alkanolamine, stearic acid, organosiloxane, zirconium oxide, hydrogenphosphite dimethicone, a silane coupling agent, and a titanate coupling agent. Among those, the silane coupling agent is preferable. Further, the white pigment such as titanium oxide is preferably a material which has been subjected to a surface treatment with any at least one surface treating agent selected from the group consisting of aluminum (Al), silicon (Si), Zr, or an organic substance. The surface treatment can be carried out with only one kind of surface treating agent or a combination of two or more kinds of surface treating agents. Further, it is also preferable that the surface of a white pigment such as titanium oxide is coated with oxides such as aluminum oxide, silica, and zirconium oxide. Thus, the light resistance and the dispersibility are further improved.

It is also preferable that a white pigment such as titanium oxide is coated with a basic metal oxide or a basic metal hydroxide. Examples of the basic metal oxide or the basic metal hydroxide include metal compounds containing magnesium, zirconium, cerium, strontium, antimony, barium, calcium, or the like.

The white pigment coated with a basic metal oxide or a basic metal hydroxide can be obtained, for example, as follows.

The white pigment is dispersed in water or a liquid including water as a main component to obtain a slurry. The white pigment is pulverized using a sand mill, a ball mill, or the like, as desired. Then, the pH of the slurry is adjusted to make the slurry neutral or alkaline, or acidic, as desired. Thereafter, a water-soluble salt thereof which serves as a raw material for a coating material is added to the slurry to coat the surface of the white pigment. Thereafter, the slurry is neutralized to recover the white pigment. The recovered white pigment may be dried or dry-pulverized.

It is preferable that the white pigment such as titanium oxide may be a material formed by surface-treating the surface of inorganic particles having an acidic site with a compound capable of reacting with the acidic site. Examples of the compound capable of reacting with the acidic site include polyhydric alcohols such as trimethylolpropane, trimethylolethane, ditrimethylolpropane, trimethylolpropane ethoxylate, and pentaerythritol, alkanolamines such as monoethanolamine, monopropanolamine, diethanolamine, dipropanolamine, triethanolamine, and tripropanolamine, chlorosilanes, and alkoxysilanes.

Examples of a method for treating the surface of inorganic particles having an acidic site with a compound capable of reacting with the acidic site include (1) a method in which the compound and the inorganic particles are put into a dry pulverizer such as a fluid energy pulverizer and an impact pulverizer, and the inorganic particles are pulverized, (2) a method in which the compound and the dry-pulverized inorganic particles are stirred and mixed using a high-speed stirrer such as a Henschel mixer and a super mixer, and (3) a method in which the compound is added to an aqueous slurry of the inorganic particles, and stirred.

As the white pigment, a commercially available product can be preferably used. The commercially available product may be used as it is or may be used after performing a classification treatment. Examples of a commercially available product of titanium oxide include:

trade names TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-401L, PT-501A, PT-501R, UT771, TTO-51C, TTO-80A, TTO-S-2, A-220, MPT-136, MPT-140, and MPT-141, manufactured by ISHIHARA SANGYO KAISHA, LTD.;

trade names R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, STR-100A-LP, STR-100C-LP, and TCA-123E, manufactured by Sakai Chemical Industry Co., Ltd.;

trade names JR, JRNC, JR-301, JR-403, JR-405, JR-600 A, JR-600 E, JR-603, JR-605, JR-701, JR-800, JR-805, JR-806, JR-1000, MT-01, MT-05, MT-10 EX, MT-100 S, MT-100 TV, MT-100 Z, MT-100 AQ, MT-100 WP, MT-100 SA, MT-100HD, MT-150 EX, MT-150 W, MT-300HD, MT-500B, MT-500 SA, MT-500HD, MT-600B, MT-600 SA, MT-700B, MT-700BS, MT-700HD, and MT-700Z, manufactured by TAYCA CORPORATION;

trade names KR-310, KR-380, KR-380N, and ST-485SA15, manufactured by Titan Kogyo, Ltd.;

trade names TR-600, TR-700, TR-750, TR-840, and TR-900, manufactured by Fuji Titanium Industry Co., Ltd.; and trade name Brilliant 1500 manufactured by Shiraishi Calcium Kaisha, Ltd. Further, titanium oxide described in paragraph Nos. 0025 to 0027 of JP2015-067794A can also be used.

In addition, examples of a commercially available product of strontium titanate include SW-100 (manufactured by Titan Kogyo, Ltd.). Examples of a commercially available product of barium sulfate include BF-1L (manufactured by Sakai Chemical Industry Co., Ltd.). Examples of a commercially available product of zinc oxide include Zincox Super F-1 (manufactured by Hakusui Tech Co., Ltd.). Examples of a commercially available product of zirconium oxide include Z-NX (manufactured by Taiyo Engineering Corporation).

In the present invention, it is preferable that as the white pigment, not only particles including only singular inorganic substance, but also composite particles including other materials may be used. It is preferable to use, for example, particles having pores or other materials therein, particles having a number of inorganic particles attached to core particles, or core-shell composite particles including core particles including polymer particles and a shell layer including inorganic fine nanoparticles. With regard to the core-and-shell composite particles including core particles including polymer particles and a shell layer including inorganic fine nanoparticles, reference can be made to, for example, the descriptions in paragraph Nos. 0012 to 0042 of JP2015-047520A, the contents of which are incorporated herein by reference.

In the present invention, as the white pigment, hollow inorganic particles can also be used. The hollow inorganic particles refer to inorganic particles having a structure with a cavity therein, which have a hole enclosed by a shell. As the hollow inorganic particles, the hollow inorganic particles described in JP2011-075786A, WO2013-061621A, JP2015-164881A, and the like can be used, the contents of which are incorporated herein by reference.

The diameters of the hollow portions of the hollow inorganic particles are not particularly limited. The diameters of the hollow portions of the hollow inorganic particles are preferably 5 to 900 nm, more preferably 20 to 800 nm, and particularly preferably 50 to 500 nm.

The shell materials of the hollow inorganic particles, that is, the materials surrounding the hollow portions of the hollow inorganic particles are not particularly limited, but various inorganic substances are used. Examples thereof include zinc sulfide, barium sulfate, lead carbonate, lead oxide, antimony oxide, potassium titanate, barium titanate, zinc oxide, zirconium oxide, cerium oxide, lanthanum oxide, and titanium oxide, and titanium oxide is preferable.

The average particle diameter (preferably an average secondary particle diameter) of the hollow inorganic particles is preferably 100 to 1,000 nm, more preferably 150 to 600 nm, and particularly preferably 200 to 500 nm.

The porosity of the hollow inorganic particles is preferably 5% to 90% by volume, more preferably 10% to 80% by volume, and particularly preferably 30% to 70% by volume. Incidentally, the porosity of the hollow inorganic particles is a total percent by volume of the hollow portions of the hollow inorganic particles in a case where the entire volume of the hollow inorganic particles is taken as 100% by volume. The porosity of the hollow inorganic particle can be determined by calculation using the refractive index of the hollow inorganic particles and a theoretical value of the refractive index calculated from the material of the hollow inorganic particles. Further, the porosity of the hollow inorganic particles can also be determined, for example, by cutting a layer (white layer) including the hollow inorganic particles, observing the shape and size of the multiple hollow inorganic particles shown on the cut surface, and the shapes and the sizes of the hollow portions of the hollow inorganic particles, and calculating the total volume of the hollow inorganic particles and the total volume of the hollow portions of the hollow inorganic particles.

In a case where the white layer contains hollow inorganic particles as the white pigment, it is preferable that hollow inorganic particles having an average particle diameter of 100 to 1,000 nm is contained in the proportion of 35% to 50% by mass with respect to the total solid content of the white layer. According to this aspect, it is easy to form a white layer having excellent whiteness.

The white layer can be formed using a composition including a white pigment (hereinafter also referred to as a composition for forming a white layer). The details of the composition for forming a white layer will be described later.

In the laminate of the embodiment of the present invention, the infrared-shielding layer is a layer that shields at least a part of a wavelength range at 800 to 1,500 nm. In the infrared-shielding layer, the transmittance of at least a part of the wavelength range at 800 to 1,200 nm is preferably 50% or less, more preferably 25% or less, and still more preferably 10% or less.

The infrared-shielding layer preferably has at least one of the following spectral characteristics.

(1) The transmittance of at least a part of the wavelength range at 800 nm or more and less than 850 nm is preferably 50% or less, more preferably 25% or less, and still more preferably 10% or less. Further, the average transmittance of the wavelength range at 800 nm or more and less than 850 nm is preferably 50% or less, more preferably 25% or less, and still more preferably 10% or less.

(2) The transmittance of at least a part of the wavelength range at 850 nm or more and less than 900 nm is preferably 50% or less, more preferably 25% or less, and still more preferably 10% or less. Further, the average transmittance of the wavelength range at 850 nm or more and less than 900 nm is preferably 50% or less, more preferably 25% or less, and still more preferably 10% or less.

(3) The transmittance of at least a part of the wavelength range at 900 nm or more and less than 950 nm is preferably 50% or less, more preferably 25% or less, and still more preferably 10% or less. Further, the average transmittance of the wavelength range at 900 nm or more and less than 950 nm is preferably 50% or less, more preferably 25% or less, and still more preferably 10% or less.

(4) The transmittance of at least a part of the wavelength range at 950 nm or more and less than 1,000 nm is preferably 50% or less, more preferably 25% or less, and still more preferably 10% or less. Further, the average transmittance of the wavelength range at 950 nm or more and less than 1,000 nm is preferably 50% or less, more preferably 25% or less, and still more preferably 10% or less.

(5) The transmittance of at least a part of the wavelength range at 1,000 nm or more and less than 1,050 nm is preferably 50% or less, more preferably 25% or less, and still more preferably 10% or less. Further, the average transmittance of the wavelength range at 1,000 nm or more and less than 1,050 nm is preferably 50% or less, more preferably 25% or less, and still more preferably 10% or less.

(6) The transmittance of at least a part of the wavelength range at 1,050 nm or more and less than 1,100 nm is preferably 50% or less, more preferably 25% or less, and still more preferably 10% or less. Further, the average transmittance of the wavelength range at 1,050 nm or more and less than 1,100 nm is preferably 50% or less, more preferably 25% or less, and still more preferably 10% or less.

(7) The transmittance of at least a part of the wavelength range at 1,100 nm or more and less than 1,150 nm is preferably 50% or less, more preferably 25% or less, and still more preferably 10% or less. Further, the average transmittance of the wavelength range at 1,100 nm or more and less than 1,150 nm is preferably 50% or less, more preferably 25% or less, and still more preferably 10% or less.

(8) The transmittance of at least a part of the wavelength range at 1,150 nm or more and less than 1,200 nm is preferably 50% or less, more preferably 25% or less, and still more preferably 10% or less. Further, the average transmittance of the wavelength range at 1,150 nm or more and less than 1,200 nm is preferably 50% or less, more preferably 25% or less, and still more preferably 10% or less.

In the laminate of the embodiment of the present invention, it is preferable that the average transmittance in a wavelength range of 400 to 700 nm of the infrared-shielding layer is preferably 60% to 100%, more preferably 70% to 100%, and particularly preferably 80% to 100%. It is preferable that the average transmittance in this wavelength range is high.

In the laminate of the embodiment of the present invention, as the infrared-shielding layer, any layer that has the above-mentioned spectral characteristic can be preferably used. For example, examples of the infrared-shielding layer include a layer including an infrared absorber, and a dielectric multilayer film. Further, as the infrared-shielding layer, a combination of the layer including an infrared absorber and the dielectric multilayer film can also be used.

(Layer Including Infrared Absorber)

Examples of the infrared absorber used in the layer including an infrared absorber include a compound having a maximum absorption wavelength in the range of 700 to 1,500 nm. The infrared absorber is preferably a compound having a maximum absorption wavelength in the range of 800 to 1,500 nm, more preferably a compound having a maximum absorption wavelength in the range of 800 to 1,300 nm, and still more preferably a compound having a maximum absorption wavelength in the range of 800 to 1,200 nm. Further, the infrared absorber used in the layer including an infrared absorber is preferably at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex, more preferably tungsten oxide containing an alkali metal, a pyrrolopyrrole compound, or a copper complex, and still more preferably tungsten oxide containing an alkali metal. According to this aspect, a laminate having excellent light resistance or heat resistance can be obtained.

In the present invention, as the tungsten oxide containing an alkali metal (hereinafter also referred to as tungsten oxide), cesium tungsten oxide is preferable. Further, the tungsten oxide is also preferably a compound represented by Formula (Composition Formula) (I).

$$M_xW_yO_z \qquad (I)$$

M represents an alkali metal, W represents tungsten, and O represents oxygen.

$0.001 \leq x/y \leq 1.1$ $2.2 \leq z/y \leq 3.0$

As the alkali metal represented by M, Rb or Cs is preferable, and Cs is more preferable.

In a case where the value of $x/y$ is 0.001 or more, it is possible to sufficiently shield infrared rays, and in a case where the value of $x/y$ is 1.1 or less, it is possible to avoid the generation of impurity phases in the tungsten oxide. The value of $x/y$ is preferably from 0.22 to 0.5.

In a case where the value of $z/y$ is 2.2 or more, it is possible to further improve the chemical stability as a material, and in a case where the value of $z/y$ is 3.0 or less, it is possible to sufficiently shield infrared rays. The value of $z/y$ is preferably from 2.45 to 3.00.

Specific examples of the compound represented by Formula (I) include $Cs_{0.33}WO_3$, $Rb_{0.33}WO_3$, and $K_{0.33}WO_3$, $Cs_{0.33}WO_3$ or $Rb_{0.33}WO_3$ is preferable, and $Cs_{0.33}WO_3$ is more preferable.

Examples of a commercially available product of the tungsten oxide include YMS-01A-2 (a dispersion liquid of cesium tungsten oxide particles) manufactured by Sumitomo Metal Mining Co., Ltd.

The average secondary particle diameter (D90) of the tungsten oxide is preferably 100 nm or less, more preferably 50 nm or less, and still more preferably 25 nm or less. With the average secondary particle diameter of the tungsten oxide within such a range, the visible transparency can be improved. From the viewpoint of avoiding light scattering, a smaller average particle diameter of the tungsten oxide is preferable, but for reasons of ease in handling during production, the average secondary particle diameter (D90) of the tungsten oxide is preferably 1 nm or more.

The average secondary particle diameter of the tungsten oxide particles is a particle diameter (a value (D90) at 90% of an integrated value of the particle size distribution) on a volume basis, obtained by measuring using Microtrac UPA-EX150 manufactured by Nikkiso Co., Ltd.

With regard to the tungsten oxide, reference can be made to the description of paragraph Nos. 0050 to 0072 of JP2009-062411A, the contents of which are incorporated herein by reference.

Examples of the pyrrolopyrrole compound in the present invention include the compounds described in paragraph Nos. 0016 to 0058 of JP2009-263614A, the compounds described in paragraph Nos. 0037 to 0052 of JP2011-068731A, and the compounds described in paragraph Nos. 0010 to 0033 WO2015/166873A, the contents of which are incorporated herein by reference. Examples of the squarylium compound include the compounds described in paragraph Nos. 0044 to 0049 of JP2011-208101A, the contents of which are incorporated herein by reference. Examples of the cyanine compound include the compounds described in paragraph Nos. 0044 and 0045 JP2009-108267A, and the compounds described in paragraph Nos. 0026 to 0030 of JP2002-194040A, the contents of which are incorporated herein by reference. Examples of the diimmonium compound include the compounds described in JP2008-528706A, the contents of which are incorporated herein by reference. Examples of the phthalocyanine compound and the tetraazaporphyrin compound include the compounds described in paragraph No. 0093 of JP2012-077153A, the oxytitanium phthalocyanine described in JP2006-343631A, and the compounds described in paragraph Nos. 0013 to 0029 of JP2013-195480A, the contents of which are incorporated herein by reference. Examples of the naphthalocyanine compound include the compounds described in paragraph No. 0093 of JP2012-077153A, the contents of which are incorporated herein by reference. Further, as the cyanine compound, the phthalocyanine compound, the naphthalocyanine compound, the tetraazaporphyrin compound, the diimmonium compound, and the squarylium compound, the compounds described in paragraph Nos. 0010 to 0081 of JP2010-111750A may be used, the content of which are incorporated herein by reference. Further, with regard to the cyanine compound, reference can be made to, for example, "Functional Colorants, written by Makoto Okawara/Masaru Matsuoka/Teijiro Kitao/Tsuneoka Hirashima, published by Kodansha Scientific Ltd.", the content of which is incorporated herein by reference. Examples of the copper complex include the copper complexes described in paragraph Nos. 0009 to 0049 of WO2016/068037A, the phosphoric ester copper complexes described in paragraph Nos. 0022 to 0042 of JP2014-041318A, and the copper sulfonate complexes described in paragraph Nos. 0021 to 0039 of JP2015-043063A, the contents of which are incorporated herein by reference.

In the present invention, the pyrrolopyrrole compound is preferably a compound represented by Formula (PP). According to this aspect, it is easy to obtain a laminate having excellent heat resistance or light resistance.

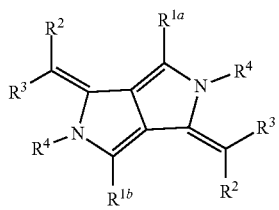

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may be covalently or coordinately bonded to at least one selected from $R^{1a}$, $R^{1b}$, or $R^3$, and $R^{4A}$ and $R^{4B}$ each independently represent a substituent. With regard to the details of Formula (PP), reference can be made to the descriptions in paragraph Nos. 0017 to 0047 of JP2009-263614A, paragraph Nos. 0011 to 0036 of JP2011-068731A, paragraph Nos. 0010 to 0024 of WO2015/166873A, the contents of which are incorporated herein by reference.

Specific examples of the compound represented by Formula (PP) include the following compounds. In the following structural formulae, Ph represents a phenyl group.

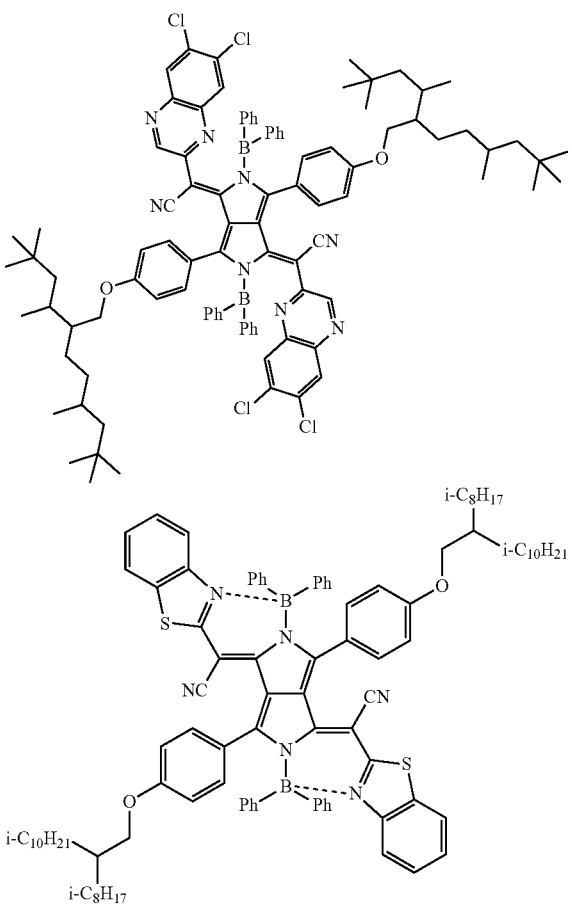

In the present invention, as the diimmonium compound, a compound represented by Formula (Im) is preferable.

Formula (Im)

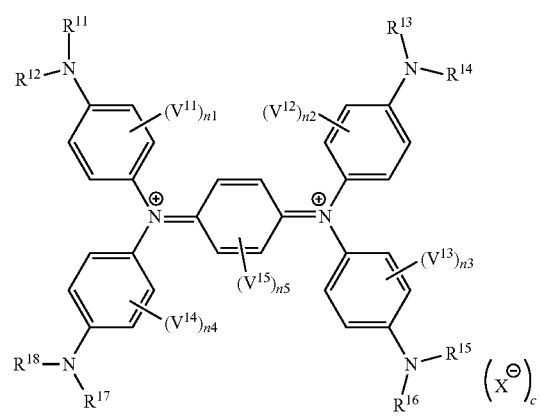

In the formula, $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, X represents an anion, c represents a number that is necessary to balance the charge, and n1 to n5 each independently represent 0 to 4. With regard to the details of Formula (Im), reference can be made to the description of paragraph Nos. 0034 to 0058 of JP2008-528706A, the contents of which are incorporated herein by reference.

Specific examples of the compound represented by Formula (Im) include the following compounds. In the following structural formula, Bu represents a butyl group.

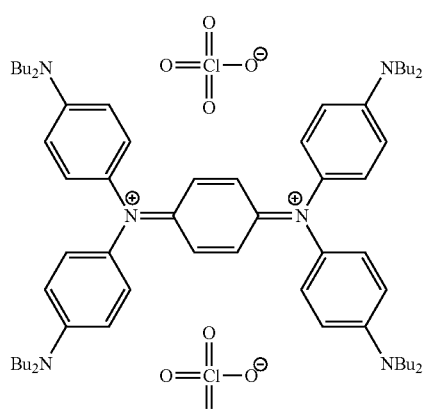

In the present invention, as the squarylium compound, a compound represented by Formula (SQ) is preferable.

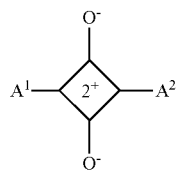
(SQ)

In Formula (SQ), $A^1$ and $A^2$ each independently represent an aryl group, a heteroaryl group, or a group represented by Formula (A-1);

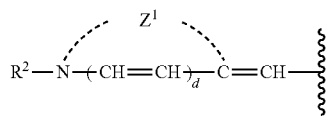
(A-1)

In Formula (A-1), $Z^1$ represents a non-metal atomic group that forms a nitrogen-containing heterocycle, $R^2$ represents an alkyl group, an alkenyl group, or an aralkyl group, a represents 0 or 1, and the wavy line represents a bond.

With regard to the details of Formula (SQ), reference can be made to the descriptions in paragraph Nos. 0020 to 0049 of JP2011-208101A, the contents of which are incorporated herein by reference.

Furthermore, the cation in Formula (SQ) exists as being delocalized as follows.

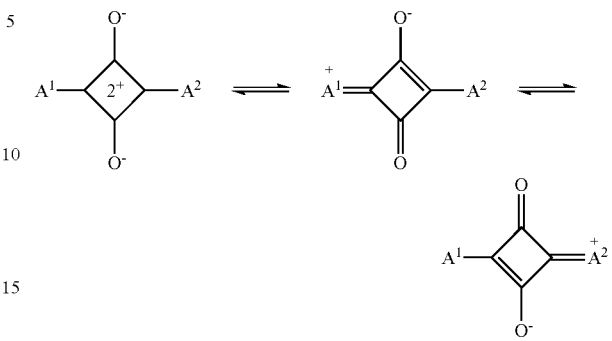

Specific examples of the compound represented by Formula (SQ) include the following compound.

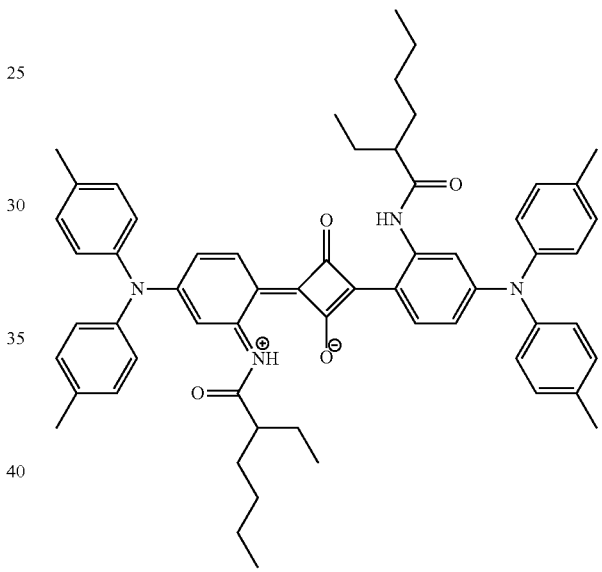

In the present invention, as the copper complex, a complex of copper and a compound (ligand) having a coordination site to copper is preferable. Examples of the coordination site to copper include a coordination site for coordination with an anion, and a coordinating atom for coordination with an unshared electron pair. The copper complex may have two or more ligands. In a case where the copper complex has two or more ligands, the respective ligands may be the same as or different from each other. Examples of the copper complex include a four-coordinate copper complex, a five-coordinate copper complex, and a six-coordinate copper complex, the four-coordinate copper complex and the five-coordinate copper complex are more preferable, and the five-coordinate copper complex is still more preferable. In addition, in the copper complex, a five-membered ring and/or a six-membered ring is preferably formed by copper and a ligand. Such a copper complex has a stable shape and is excellent in complex stability.

The copper complex can be obtained, for example, by mixing and reacting the compound (ligand) having a coordination site to copper with a copper component (copper or a compound including copper). The compound (ligand)

having a coordination site to copper may be a low molecular compound or a polymer, both of which may also be used in combination.

The copper component is preferably a compound including divalent copper. Only one kind or two or more kinds of the copper components may be used. As the copper component, for example, a copper oxide or a copper salt can be used. As the copper salt, for example, copper carboxylate (such as copper acetate, copper ethyl acetoacetate, copper formate, copper benzoate, copper stearate, copper naphthenate, copper citrate, and copper 2-ethylhexanoate), copper sulfonate (such as copper methanesulfonate), copper phosphate, phosphoric acid ester copper, copper phosphonate, phosphonic acid ester copper, copper phosphinate, copper amide, copper sulfonamide, copper imide, copper acyl sulfonimide, copper bissulfonimide, copper methide, alkoxycopper, phenoxycopper, copper hydroxide, copper carbonate, copper sulfate, copper nitrate, copper perchlorate, copper fluoride, copper chloride, and copper bromide are preferable, copper carboxylate, copper sulfonate, copper sulfonamide, copper imide, copper acyl sulfonimide, copper bissulfonimide, alkoxycopper, phenoxycopper, copper hydroxide, copper carbonate, copper fluoride, copper chloride, copper sulfate, and copper nitrate are more preferable, copper carboxylate, copper acyl sulfonimide, phenoxycopper, copper chloride, copper sulfate, and copper nitrate are still more preferable, and copper carboxylate, copper acyl sulfonimide, copper chloride, and copper sulfate are particularly preferable.

(Low Molecular Type Copper Complex)

As the copper complex, for example, a copper complex represented by Formula (Cu-1) can be used. This copper complex is a copper complex in which a ligand L coordinates to copper as a central metal, and the copper is usually divalent copper. This copper complex can be obtained, for example, by reacting the compound or a salt thereof serving as a ligand L with a copper component.

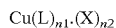.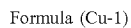     Formula (Cu-1)

In the formula, L represents a ligand that coordinates to copper and X represents a counter ion. n1 represents an integer of 1 to 4. n2 represents an integer of 0 to 4.

X represents a counter ion. In some cases, the copper complex serves as a cation complex or an anion complex, in addition to a neutral complex having no charge. In this case, a counter ion exits, as described, so as to neutralize a copper complex.

In a case where the counter ion is a negative counter ion (counter anion), it may be, for example, an inorganic anion or an organic anion.

Moreover, the counter anion is preferably a weakly nucleophilic anion. The weakly nucleophilic anionic structure is generally an anionic structure formed by an acid having a low pKa, called a super acid, dissociating a proton. The definition of the super acid varies depending on the documents, but super acids collectively refer to acids having a lower pKa than that of methanesulfonic acid, and the structures described in J. Org. Chem. 2011, 76, 391-395 Equilibrium Acidities of Superacids are known. The pKa of the weakly nucleophilic anion is, for example, preferably −11 or less, and preferably −11 to −18. The pKa can be measured by the method described in, for example, J. Org. Chem. 2011, 76, 391-395. The pKa value in the present specification is a pKa in 1,2-dichloroethane unless otherwise specified. In a case where the counter anion is a weakly nucleophilic anion, it is difficult for a decomposition reaction of a copper complex or a resin to occur, and the heat resistance is good. The weakly nucleophilic anion is more preferably a tetrafluoroboric acid ion, a tetraaryl boric acid ion (including aryl substituted with a halogen atom or a fluoroalkyl group), a hexafluorophosphate ion, an imide ion (including amide substituted with an acyl group or a sulfonyl group), or a methide ion (including methide substituted with an acyl group or a sulfonyl group), and particularly preferably a tetraaryl boric acid ion (including aryl substituted with a halogen atom or a fluoroalkyl group), an imide ion (including amide substituted with a sulfonyl group), or a methide ion (including methide substituted with a sulfonyl group).

Incidentally, in the present invention, the counter anion is also preferably a halogen anion, a carboxylate ion, a sulfonate ion, a boron ion, a sulfonate ion, or an imide ion.

In a case where the counter ion is a positive counter ion (counter cation), examples thereof include inorganic or organic ammonium ions (for example, tetraalkyl ammonium ions such as a tetrabutylammonium ion, a triethylbenzylammonium ion, a pyridinium ion), phosphonium ions (for example tetraalkylphosphonium ions such as a tetrabutylphosphonium ion, alkyl triphenyl phosphonium ions, and a triethyl tetraphenylphosphonium ion), alkali metal ions, and protons.

In addition, the counter ion may be a metal complex ion (for example, a copper complex ion).

The ligand L is a compound having a coordination site to copper, and examples thereof include a compound having at least one of a coordination site for coordination to copper with an anion or a coordination atom for coordination to copper with an unshared electron pair. The coordination site for coordination with an anion may be dissociate or non-dissociated. The ligand L is preferably a compound having two or more coordination sites of copper (polydentate ligand). Further, it is preferable that the ligand L does not have a plurality of consecutive bonds with π-conjugated systems such as an aromatic substance in order to improve the visible transparency. As the ligand L, a combination of a compound having one coordination site to copper (monodentate ligand) and a compound having two or more coordination sites to copper (polydentate ligand) can be used. Examples of the monodentate ligand include a monodentate ligand that coordinates to an anion or an unshared electron pair.

The anion contained in the ligand L may be one capable of coordinating to a copper atom, and is preferably an oxygen anion, a nitrogen anion, or a sulfur anion.

Other examples of the coordination site for coordination with an anion include a monoanionic coordination site. The monoanionic coordination site represents a site for coordination to a copper atom through a functional group having one negative charge. Examples thereof include an acid group having an acid dissociation constant (pKa) of 12 or less. Specifically, an acid group containing a phosphorus atom (a phosphoric diester group, a phosphonic acid monoester group, a phosphinic acid group, and the like), a sulfo group, a carboxyl group, and an imidic acid group, and the sulfo group or the carboxyl group is preferable.

The coordinating atom that coordinates with an unshared electron pair is preferably an oxygen atom, a nitrogen atom, a sulfur atom, or a phosphorus atom, more preferably an oxygen atom, a nitrogen atom, or a sulfur atom, still more preferably an oxygen atom or a nitrogen atom, and particularly preferably a nitrogen atom. In a case where the coordinating atom that coordinates with an unshared electron pair is a nitrogen atom, the atom adjacent to the nitrogen atom is preferably a carbon atom or a nitrogen atom, and more preferably a carbon atom.

Preferred examples of the copper complex include the following aspects of (1) to (5), and the copper complex is more preferably (2) to (5), still more preferably (3) to (5), and even still more preferably (4) or (5).

(1) A copper complex having one or two of the compounds having two coordination sites as a ligand.

(2) A copper complex having a compound having three coordination sites as a ligand.

(3) A copper complex having a compound having three coordination sites and a compound having two coordination sites as a ligand.

(4) A copper complex having a compound having four coordination sites as a ligand.

(5) A copper complex having a compound having five coordination sites as a ligand.

Specific examples of the copper complex include the following compounds.

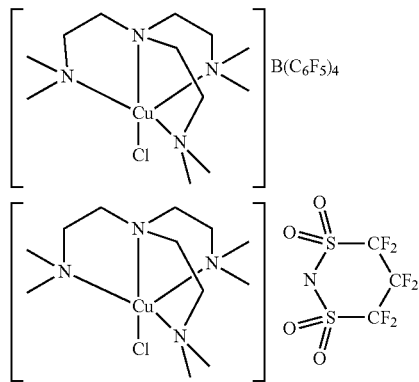

In the present invention, as the copper complex, a copper containing polymer having a copper complex site in the polymer side chain can be used. Examples of the copper complex site include copper and a site for coordination to the copper (coordination site). Examples of the site for coordination to the copper include a site for coordination with an anion or an unshared electron pair. Further, the copper complex site preferably has a site for tetradentate coordination or pentadentate coordination to copper. With regard to the details of the coordination site, reference can be made to those described as the above-mentioned low molecular type copper compound, and a preferred range thereof is also the same.

Examples of the copper containing polymer include a polymer including a coordination site (also referred to as a polymer (B1)), a polymer obtained by the reaction with a copper component or a polymer having a reactive site for a polymer side chain (hereinafter also referred to as a polymer (B2)), and a polymer obtained by the reaction with a copper complex having a functional group capable of reacting with a reactive site contained in the polymer (B2). The weight-average molecular weight of the copper containing polymer is preferably 2,000 or more, more preferably 2,000 to 2,000,000, and still more preferably 6,000 to 200,000.

In the present invention, the content of the infrared absorber in the layer including an infrared absorber can be appropriately adjusted depending on the type of the infrared absorber. For example, in a case of the tungsten oxide containing an alkali metal, the content thereof is preferably 10% to 50% by mass, and more preferably 20% to 40% by mass, with respect to the total solid content of the layer including an infrared absorber. Incidentally, in a case of an organic colorant such as a pyrrolopyrrole compound, a cyanine compound, a phthalocyanine compound, a tetraazaporphyrin compound, a diimmonium compound, and a squarylium compound, the content thereof is preferably 10% to 50% by mass, and more preferably 20% to 40% by mass, with respect to the total solid content of the layer including an infrared absorber. Further, in a case of a copper complex, the content thereof is preferably 10% to 50% by mass, and more preferably 20% to 40% by mass, with respect to the total solid content of the layer including an infrared absorber.

In the present invention, the film thickness of the layer including an infrared absorber can be appropriately adjusted depending on the type of the infrared absorber. For example, in a case of tungsten oxide containing an alkali metal, the film thickness of the layer including an infrared absorber is preferably 0.5 to 10.0 μm, and more preferably 2.0 to 5.0 μm. Further, in a case of an organic colorant such as a pyrrolopyrrole compound, a cyanine compound, a phthalocyanine compound, a tetraazaporphyrin compound, a diimmonium compound, and a squarylium compound, the film thickness of the layer including an infrared absorber is preferably 0.1 to 5.0 μm, and more preferably 0.5 to 2.0 μm. Incidentally, in a case of a copper complex, the film thickness of the layer including an infrared absorber is preferably 10 to 300 μm, and more preferably 50 to 200 μm. In a case where the film thickness is within the above range, the infrared-shielding property is good. In addition, an effect that the transmitted light can be detected by a photodiode without being diffused into the white layer can be expected.

The layer including an infrared absorber can be formed using a composition including an infrared absorber (hereinafter also referred to as a composition for forming an infrared-shielding layer) can be formed. The details of the composition for forming an infrared-shielding layer will be described later.

(Dielectric Multilayer Film)

In the present invention, the dielectric multilayer film is a film that shields infrared rays or the like by utilizing an effect of interference of light. Specifically, the dielectric multilayer film is a film formed by alternately laminating two or more dielectric layers having different refractive indices (high-refractive-index layers and low-refractive-index layers).

As the material constituting the high-refractive-index layer, a material having a refractive index of 1.7 or more (preferably a material having a refractive index of 1.7 to 2.5) can be used. Examples thereof include a material containing a small amount of titanium oxide, tin oxide, and/or cerium oxide with titanium oxide, zirconium oxide, tantalum pentoxide, niobium pentoxide, lanthanum oxide, yttrium oxide, zinc oxide, zinc sulfide, or indium oxide as main components.

As the material constituting the low-refractive-index layer, a material having a refractive index of 1.6 or less (preferably a material having a refractive index of 1.2 to 1.6) can be used. Examples thereof include silica, alumina, lanthanum fluoride, magnesium fluoride, and sodium aluminum hexafluoride.

The thickness of each layer of the high-refractive-index layers and the low-refractive-index layers is preferably a thickness of 0.1λ to 0.5λ in the wavelength λ (nm) of infrared rays to be shielded. By setting the thickness within the range, it is easy to control the shielding and/or transmission of light at a specific wavelength. The number of the stacked layers in the dielectric multilayer film is preferably 2 to 100, more preferably 2 to 60, and still more preferably 2 to 40.

The film thickness of the dielectric multilayer film (a total thickness of the high-refractive-index layers and the low-refractive-index layers) is appropriately designed by the refractive indices and the spectroscopic design of the high-refractive-index layers and the low-refractive-index layers.

The laminate of the embodiment of the present invention can be used after being laminated on a support. In a case where the laminate is laminated on a support, it is a preferred aspect that an infrared-shielding layer is formed on the support, and thus, a white layer is formed is on the infrared-shielding layer. According to this aspect, it is possible to adopt a configuration in which a white layer is disposed on the viewing side, thereby improving the whiteness. Examples of the support include a silicon wafer, glass, a resin, germanium, gallium arsenide (GaAs), gallium arsenide phosphide, gallium nitride (GaN), silicon carbide (SiC), and indium gallium arsenide (InGaAs).

The laminate of the embodiment of the present invention can be used after being incorporated into various optical sensors such as a solid-state imaging device, or image display devices (for example, a liquid crystal display device and an organic electroluminescence (organic EL) display device). For example, the laminate can be used as a member that appropriately shields or transmits light or as a member that scatters light after being incorporated into various optical sensors, image display devices, or the like. In addition, the laminate of the embodiment of the present invention can also be used as a material in applications for adjusting the appearance of an optical member. In addition, the laminate of the embodiment of the present invention can also be used in light emitting diode (LED) reflecting applications, organic EL light-scattering layer applications, conductive materials, insulating materials, materials for a solar cell, and the like.

<Method for Producing Laminate>

The laminate of the embodiment of the present invention can be produced through a step of forming an infrared-shielding layer and a step of forming a white layer. A procedure for forming the infrared-shielding layer and the white layer is not particularly limited. After forming the infrared-shielding layer, the white layer may be formed on the infrared-shielding layer. Also, after forming the white layer, the infrared-shielding layer may be formed on the white layer. Between them, for a reason that a configuration in which the white layer is disposed on the side of a viewing side can be adopted, it is preferable that after forming the infrared-shielding layer, the white layer is formed. Further, in this case, it is preferable that the infrared-shielding layer is formed on the support. That is, the laminate of the embodiment of the present invention is preferably produced through a step of forming an infrared-shielding layer on a support and a step of forming a white layer on the infrared-shielding layer.

(Step of Forming Infrared-Shielding Layer)

[Method for Forming Infrared-Shielding Layer Formed of Layer Including Infrared Absorber]

The infrared-shielding layer formed of a layer including an infrared absorber can be produced through a step of applying a composition for forming an infrared-shielding layer onto a support or the like to form a composition layer, a step of drying the composition layer, and the like. A step of forming a pattern may further be included.

Examples of the method of applying the composition for forming an infrared-shielding layer, known methods can be used. Examples thereof include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), discharge system printing such as nozzle jet, flexographic printing, screen printing, gravure printing, reverse offset printing, and metal mask printing; a transfer method using a mold or the like; and a nanoimprint method. Examples of the application method employing ink jet include the method (in particular, pp. 115 to 133) described in "Extension of Use of Injector-Infinite Possibilities in Patent-" (February, 2005, S.B. Research Co., Ltd.) and the methods described in JP2003-262716A, JP2003-185831A, JP2003-261827A, JP2012-126830A, JP2006-169325A, and the like. In the application in the spin coating method, from the viewpoint of coatability, spin coating is preferably carried out in the range of 300 to 6,000 rpm, and more preferably carried out in the range of 400 to 3,000 rpm. Further, a substrate temperature for spin coating is preferably 10° C. to 100° C., and more preferably 20° C. to 70° C. Within the range, a film having excellent coating unevenness is easily produced.

In a case of the dropwise addition method (drop cast), it is preferable that a dropwise addition region of a composition for forming an infrared-shielding layer having a photoresist as a partition wall is formed on a support such that an even film with a predetermined thickness may be obtained. A composition layer with a desired film thickness is obtained by controlling the dropwise addition amount and the concentration of the solid content of the composition for forming an infrared-shielding layer, and the dropwise addition area of the composition for forming an infrared-shielding layer. The thickness of the composition layer after drying is not particularly limited and can be appropriately selected according to the purpose.

The support is not particularly limited and can be appropriately selected according to applications. Examples of the support include alkali-free glass used in a liquid crystal display device and the like, soda glass, PYREX (registered trademark) glass, quartz glass, a substrate obtained by attaching a transparent conductive film to the substrate, a photoelectric conversion element substrate, a silicon substrate, or the like used in a solid-state imaging device or the like, and a complementary metal oxide film semiconductor (CMOS). Moreover, an undercoat layer may be provided on these substrates, as desired, for the purpose of improving the adhesiveness to an upper layer, preventing the diffusion of materials, or planarizing the surface. The undercoat layer is preferably provided (preferably applied) on a substrate in order to increase the adhesiveness.

In the step of drying the composition layer, it is preferable that the drying conditions vary depending on the types or blend amounts of the respective components, and the like. The drying conditions are preferably as follows: the temperature is 60° C. to 150° C., and the time is 30 seconds to 15 minutes.

The composition layer after drying may be further subjected to a step of forming a pattern, as desired. In the step of forming a pattern, a pattern may be formed using a photolithography method or using a dry etching method. Examples of the pattern forming method using the photolithography method include a method including a step of patternwise exposing the composition layer and a step of removing the unexposed area by development to form a pattern.

In the exposing step, it is preferable that the composition layer is patternwise exposed. For example, the composition layer can be patternwise exposed by performing exposure through a mask having a predetermined mask pattern, using an exposure device such as a stepper. Thus, the exposed area can be cured.

As the radiation (light) which can be used during the exposure, ultraviolet rays such as g-rays and i-rays (particularly preferably i-rays) are preferably used. For example, the irradiation dose (exposure dose) is preferably 0.03 to 2.5 $J/cm^2$, and more preferably 0.05 to 1.0 $J/cm^2$.

The oxygen concentration during the exposure can be appropriately selected, and the exposure may also be performed, for example, in a low-oxygen atmosphere having an oxygen concentration of 19% by volume or less (for example, 15% by volume or less, 5% by volume or less, and in particular, substantially oxygen-free) or in a high-oxygen atmosphere having an oxygen concentration of more than 21% by volume (for example, 22% by volume or more, further, 30% by volume or more, and in particular, 50% by volume or more). Further, the exposure illuminance can be appropriately set, and can be usually selected from the range of 1,000 $W/m^2$ to 100,000 $W/m^2$ (for example, 5,000 $W/m^2$ or more, further, 15,000 $W/m^2$ or more, and in particular, 35,000 $W/m^2$ or more). The conditions of the oxygen concentration and the exposure illuminance may be appropriately combined, and for example, a combination of an oxygen concentration of 10% by volume and an illuminance of 10,000 $W/m^2$, a combination of an oxygen concentration of 35% by volume and an illuminance of 20,000 $W/m^2$, or the like is available.

Next, the unexposed area is preferably removed by development to form a pattern. The removal of the unexposed area by development can be carried out using a developer. Thus, the composition layer of the unexposed area in the exposing step is eluted into the developer, and as a result, only a photocured portion remains. As the developer, an alkali developer causing no damage on an underlying circuit or the like is preferable. As the developer, a solvent described in the present specification may also be used to perform development. The temperature of the developer is preferably, for example, 20° C. to 30° C. The development time is preferably 20 to 180 seconds, and more preferably 20 to 90 seconds.

Examples of the alkali agent used in the alkali developer include organic alkaline compounds such as aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-diazabicyclo-[5,4,0]-7-undecene, and dimethylbis(2-hydroxyethyl)ammonium hydroxide, and inorganic alkaline compounds such as sodium hydroxide, potassium hydroxide, sodium carbonate, sodium hydrogen carbonate, sodium silicate, and sodium metasilicate. An aqueous alkaline solution obtained by diluting the alkali agent with pure water to have a concentration of 0.001% to 10% by mass, and preferably 0.01% to 1% by mass is preferably used as the developer. Furthermore, a surfactant may also be used in the developer. Examples of the surfactant include the surfactants described as the composition for forming a white layer which will be described later, or the like, and the surfactant is preferably a non-ionic surfactant.

Incidentally, in a case where a developer composed of such an aqueous alkaline solution is used, it is generally preferable that washing (rinsing) with pure water is performed after development.

The method for producing an infrared-shielding layer may include other steps. Such other steps are not particularly limited, and can be appropriately selected depending on the purpose. Examples of such other steps include a surface treatment step for a support, a pre-heating step (pre-baking step), a curing step, and a post-heating step (post-baking step). After development, at least one of heating or exposure may further be carried out. According to this aspect, curing of the infrared-shielding layer can further be performed to produce an infrared-shielding layer which has been more rigidly cured.

A heating temperature in the pre-heating step and the post-heating step is preferably 80° C. to 200° C. The upper limit is more preferably 150° C. or lower. The lower limit is more preferably 90° C. or higher. Incidentally, a heating time in the pre-heating step and the post-heating step is preferably 30 to 240 seconds. The upper limit is more preferably 180 seconds or less. The lower limit is more preferably 60 seconds or more.

Examples of a method for the heating treatment include a method of heating the entire area of the formed infrared-shielding layer. Due to the heating treatment, the film strength of the pattern can be improved. The heating temperature is preferably 100° C. to 260° C. The lower limit is more preferably 120° C. or higher, and particularly preferably 160° C. or higher. The upper limit is more preferably 240° C. or lower, and particularly preferably 220° C. or lower. In a case where the heating temperature is within the range, a film having excellent strength is easily obtained. The heating time is preferably 1 to 180 minutes. The lower limit is more preferably 3 minutes or more. The upper limit is more preferably 120 minutes or less. A heating device is not particularly limited and can be appropriately selected from well-known devices, and examples thereof include a dry oven, a hot plate, and an infrared heater.

[Method for Forming Infrared-Shielding Layer Formed of Dielectric Multilayer Film]

The infrared-shielding layer formed of a dielectric multilayer film can be produced, for example, by forming a dielectric multilayer film in which high-refractive-index layers and low-refractive-index layers are alternately laminated is formed on a support by a method such as a chemical vapor deposition (CVD) method, a sputtering method, and a vacuum deposition method. Further, the infrared-shielding layer formed of a dielectric multilayer film can also be obtained by alternately applying compositions for forming a high-refractive-index layer and compositions for forming a low-refractive-index layer on a support, followed by drying.

(Step of Forming White Layer)

A white layer can be produced through a step of applying a composition for forming a white layer onto an infrared-shielding layer to form a composition layer, a step of drying the composition layer, and the like. A step of forming a pattern can be further included. With regard to the details of these steps, reference can be made to the method described in the above-mentioned step of forming an infrared-shielding layer formed of a layer including an infrared absorber.

<Composition for Forming White Layer>

Next, the composition for forming a white layer will be described.

The composition for forming a white layer is preferably a composition having a value of L* of 35 to 75 in a L*a*b* color coordinate system of CIE 1976 in a case of forming a film with a thickness of 3 µm. The lower limit of the value of L* is more preferably 50 or more, and particularly preferably 60 or more.

Furthermore, in a L*a*b* color coordinate system of CIE 1976 in a case of forming a film with a thickness of 3 µm using a composition for forming a white layer, the value of a* is preferably −20 to 20, and more preferably −10 to 0. Further, in a L*a*b* color coordinate system of CIE 1976 in a case of forming a film with a thickness of 3 µm using a composition for forming a white layer, the value of b* is preferably −40 to 30, and more preferably −35 to 0.

The sedimentation of the solid content of the composition for forming a white layer at centrifugation under the conditions of room temperature (25° C.) and 3,500 revolutions per minute (rpm) for 47 minutes is preferably 10% by mass or less, and more preferably 5% by mass or less. Examples of a method for reducing the sedimentation of the solid content of the composition for forming a white layer include a method of increasing the viscosity of the composition for forming a white layer, a method of decreasing the concentration of the solid content of the composition for forming a white layer, a method of increasing the dispersibility of the solid content (preferably particles) in the composition for forming a white layer, a method of decreasing the density of particles, and a method of decreasing the particle diameters of particles. The "solid content" in the present specification means a "solid content before a centrifugation treatment" which will be described later unless otherwise specified. The sedimentation of the solid content in terms of a percentage is calculated by dividing a difference between a "solid content after a centrifugation treatment" which will be described later and the "solid content before the centrifugation treatment" by the "solid content before the centrifugation treatment".

The concentration of the solid content of the composition for forming a white layer is preferably 20% to 75% by mass. The upper limit is more preferably 60% by mass or less. The lower limit is more preferably 30% by mass or more. By setting the concentration of the solid content of the composition for forming a white layer within the range, the viscosity of the composition for forming a white layer can be increased, sedimentation of the particles, and the like can be effectively suppressed, and the temporal liquid stability of the composition for forming a white layer can be improved.

<<White Pigment>>

The composition for forming a white layer preferably contains a white pigment. With regard to the details of the white pigment, reference can be made to the white pigments described in the above-mentioned section of the white layer, and a preferred range thereof is also the same.

The content of the white pigment in the composition for forming a white layer is preferably 1% by mass or more, more preferably 3% by mass or more, still more preferably 5% by mass or more, particularly preferably 25% by mass or more, and most preferably 35% by mass or more, with respect to the total solid content of the composition for forming a white layer. The upper limit is not particularly limited, but is preferably 75% by mass or less, more preferably 60% by mass or less, still more preferably 55% by mass or less, even still more preferably 45% by mass or less, and particularly preferably 42% by mass or less, with respect to the total solid content of the composition for forming a white layer. In a case where the content of the white pigment is within the range, it is possible to form a white layer having a good whiteness. In addition, a color mixture and the like of the white layer while forming the white layer on the infrared-shielding layer can be effectively suppressed. The composition for forming a white layer may include only one kind or two or more kinds of the white pigments. In a case where the composition for forming a white layer includes two or more kinds of the white pigments, the total amount thereof preferably falls within the range.

<<Other Coloring Agents>>

The composition for forming a white layer may contain, in addition to the white pigment, other coloring agents. By incorporation of such other coloring agents, it is easy to control a* and b* in a L*a*b* color coordinate system of CIE 1976 in a case of forming a film with a thickness of 3 µm using the composition to preferred ranges. Examples of such other coloring agents include a chromatic coloring agent and a black coloring agent.

(Chromatic Coloring Agent)

The composition for forming a white layer may contain a chromatic coloring agent. In the present invention, the chromatic coloring agent means a coloring agent (including a white pigment) other than the white coloring agent, and a coloring agent other than the black coloring agent. By incorporation of the chromatic coloring agent into the composition for forming a white layer, it is possible to stabilize visible evaluation of the color tint of the composition (L*, a*, and b* in a L*a*b* color coordinate system of CIE 1976) by aging, heating, or the like, for example. The chromatic coloring agent is preferably a coloring agent having a maximum absorption wavelength in a wavelength range of 400 nm or more and less than 650 nm.

The chromatic coloring agent may be either a chromatic pigment or a dye. The chromatic pigment is preferably an organic pigment. The organic pigment is not particularly limited, and known chromatic pigments can be used. Examples of the organic pigment include the following pigments, but the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all red pigments), C. I. Pigment Green 7, 10, 36, 37, 58, 59, and the like (all green pigments), C. I. Pigment Violet 1, 19, 23, 27, 32, 37, 42, and the like (all violet pigments), C. I. Pigment Blue 1, 2, 15, 15:1, 15:2, 15:3, 15:4, 15:6, 16, 22, 60, 64, 66, 79, 80, and the like (all blue pigments).

The organic pigments may be used singly or in combination of two or more kinds thereof.

The dye is not particularly limited, and known dyes can be used. In terms of the chemical structure, it is possible to use a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyrromethane-based dye, or the like. Incidentally, multimers of these dyes may be used. Further, the dyes described in JP2015-028144A and JP2015-034966A can also be used. In addition, an acidic dye and a derivative thereof can be suitably used as the dye. In addition, a direct dye, a basic dye, a mordant dye, an acidic mordant dye, an azoic dye, a dispersed dye, an oil-soluble dye, a food dye, and derivatives thereof can also be usefully employed. Specific examples of the acidic dye are shown below, but the present invention is not limited thereto. For example, the following dyes and derivatives of these dyes are included.

Acid Alizarin violet N,

Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, 324:1, Acid Chrome violet K, Acid Fuchsin; acid green 1, 3, 5, 9, 16, 25, 27, 50, Acid Orange 6, 7, 8, 10, 12, 50, 51, 52, 56, 63, 74, 95, Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274, Acid Violet 6B, 7, 9, 17, 19, Acid Yellow 1, 3, 7, 9, 11, 17, 23, 25, 29, 34, 36, 42, 54, 72, 73, 76, 79, 98, 99, 111, 112, 114, 116, 184, 243, Food Yellow 3.

In addition to the above-described dyes, an azo-based acidic dye, a xanthene-based acidic dye, and a phthalocyanine-based acidic dye are also preferable, and acidic dyes such as C. I. Solvent Blue 44 and 38; C. I. Solvent Orange 45; and Rhodamine B and Rhodamine 110, and derivatives of these dyes are also preferably used.

In a case where the composition for forming a white layer contains a chromatic coloring agent, the content of the chromatic coloring agent is preferably 0.1% to 70% by mass in the total solid content of the composition for forming a white layer. The lower limit is more preferably 0.5% by mass or more, and particularly preferably 1.0% by mass or more. The upper limit is more preferably 60% by mass or less, and particularly preferably 50% by mass or less. In a case where the composition for forming a white layer includes two or more kinds of the chromatic coloring agents, the total amount thereof preferably falls within the range.

(Black Coloring Agent)

The composition for forming a white layer can contain a black coloring agent. The black coloring agent may be either an inorganic black coloring agent or an organic black coloring agent.

Examples of the organic black coloring agent include a bisbenzofuranone compound, an azomethine compound, a perylene compound, and an azo-based compound, and the bisbenzofuranone compound and the perylene compound are preferable. Examples of the bisbenzofuranone compound include those described in JP2010-534726A, JP2012-515233A, and JP2012-515234A, and are available as, for example, "Irgaphor Black" manufactured by BASF Corporation. Examples of the perylene compound include C. I. Pigment Black 31 and 32. Examples of the azomethine compound include those described in JP1989-170601A (JP-H01-170601A), JP1990-034664A (JP-H02-034664A), and the like, and are available as, for example, "CHROMOFINE BLACK A1103" manufactured by Dainichiseika Color & Chemicals Mfg. Co., Ltd.

The inorganic black coloring agent is not particularly limited and known inorganic black coloring agents can be used. Examples thereof include carbon black, titanium black, and graphite, and the inorganic black coloring agent is preferably carbon black or titanium black, and more preferably titanium black. The titanium black is a black particle containing a titanium atom, and preferably lower titanium oxide, titanium oxynitride, or the like. The titanium black can have a surface modified, as desired, for the purpose of improvement of dispersibility, suppression of an aggregating property, and the like. It is possible to coat a surface of the titanium black with silicon oxide, titanium oxide, germanium oxide, aluminum oxide, magnesium oxide, or zirconium oxide. In addition, it is also possible to perform a treatment using a water-repellant as shown in JP2007-302836A. Specific examples of the black pigment include C. I. Pigment Black 1 and 7, and a titanium black pigment.

It is preferable that in titanium black, the primary particle diameters of the respective particles and the average primary particle diameter thereof are both small. Specifically, the average primary particle diameter is preferably in the range of 10 to 45 nm.

The specific surface area of titanium black is not particularly limited, but a value thereof as measured by a BET method is preferably from 5 to 150 $m^2/g$, and more preferably from 20 to 120 $m^2/g$. Examples of commercially available product of titanium black include titanium black 10S, 12S, 13R, 13M, 13M-C, 13R, 13R-N, and 13M-T (trade names, manufactured by Mitsubishi Materials Corporation), and Tilack D (trade name: manufactured by Akokasei Co., Ltd.).

The titanium black can also be used as a dispersion. Examples thereof include a dispersion that includes titanium black particles and silica particles, and the content ratio of Si atoms to Ti atoms in the dispersion is adjusted to the range of 0.20 to 0.50. With regard to the dispersion, reference can be made to the description in paragraph Nos. 0020 to 0105 of JP2012-169556A, the contents of which are incorporated herein by reference.

<<Resin>>

The composition for forming a white layer preferably includes a resin. The resin is blended in, for example, an application for dispersing particles such as a pigment in the composition or an application as a binder. Incidentally, a resin which is used mainly for dispersing particles in a composition is also referred to as a dispersant. However, such uses of the resin are only exemplary, and the resin can also be used for other purposes, in addition to such uses.

The weight-average molecular weight (Mw) of the resin is preferably 1,000 to 200,000, and more preferably 2,000 to 100,000. The weight-average molecular weight (Mw) within the ranges is preferable from the viewpoints of compatibility and whitening.

The content of the resin is preferably 5% to 90% by mass, and more preferably 10% to 60% by mass, with respect to the total solid content of the composition for forming a white layer. The content within these ranges is preferable from the viewpoints of a pattern shape, heat resistance, and L*. One kind or two or more kinds of the resins may be included. In a case where two or more kinds of the resins are used, the total amount thereof preferably falls within the range.

(Binder)

The composition for forming a white layer preferably includes a binder as the resin. By incorporation of the binder, the film characteristics are improved. As the binder, any of known binders can be used. Preferably a resin which is soluble or swellable in water or weakly alkaline water is chosen so as to allow water development or weakly alkaline water development. For example, alkali development can be performed using an alkali-soluble resin. Examples of such the resin include a radical polymer having a carboxyl group in the side chain, for example, the polymers described in JP1984-044615A (JP-S59-044615A), JP1979-034327B (JP-S54-034327B), JP1983-012577B (JP-S58-012577B), and JP1979-025957B (JP-S54-025957B), JP1979-092723A (JP-S54-092723A), JP1984-053836A (JP-S59-053836A), and JP1984-071048A (JP-S59-071048A), that is, a resin obtained by homopolymerizing or copolymerizing a monomer having a carboxyl group; a resin obtained by homopolymerizing or copolymerizing a monomer having an acid anhydride, and subjecting the acid anhydride unit to hydrolysis, semi-esterification or semi-amidation; and an epoxy acrylate obtained by modifying an epoxy resin with an unsaturated monocarboxylic acid and an acid anhydride. Examples of the monomers having a carboxyl group include acrylic acid, methacrylic acid, itaconic acid, crotonic acid, maleic acid, fumaric acid, and 4-carboxylstyrene, and examples of the monomers having an acid anhydride include maleic anhydride. Further, other examples thereof include an acidic cellulose derivative having a carboxyl group in a side chain, and in addition, a polymer having a hydroxyl group with a cyclic acid anhydride, and the like. The binder is preferably a resin which is soluble in an alkali developer. The composition of the present invention preferably includes an alkali-soluble resin. Further, a resin that is a thermosetting compound, such as an epoxy resin and a melamine resin, can also be used as the binder.

The alkali-soluble resin can be appropriately selected from polymers having at least one group enhancing alkali solubility. Examples of the group enhancing alkali solubility (hereinafter also referred to as an acid group) include a carboxyl group, a phosphoric acid group, a sulfo group, and a phenolic hydroxyl group, and the carboxyl group is preferable. The acid group may be of one kind or of two or more kinds.

The number-average molecular weight (Mn) of the alkali-soluble resin is preferably 1,000 to 20,000. The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

As the alkali-soluble resin, a polyhydroxystyrene-based resin, a polysiloxane-based resin, an acrylic resin, an acrylamide-based resin, or an acryl/acrylamide copolymer resin is preferable from the viewpoint of heat resistance, and an acrylic resin, an acrylamide-based resin, or an acryl/acrylamide copolymer resin is preferable from the viewpoint of controlling developability.

The alkali-soluble resin is preferably a polymer having a carboxyl group in a side chain thereof, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac type resin, or the like; an acidic cellulose derivative having a carboxyl group in a side chain thereof; and a product obtained by adding an acid anhydride to a polymer having a hydroxyl group. In particular, a copolymer of a (meth)acrylic acid and another monomer which is copolymerizable therewith is preferable as the alkali-soluble resin. Examples of such the other monomer which is copolymerizable with the (meth)acrylic acid include the monomers described in paragraph Nos. 0017 to 0019 of JP2015-034961A, for example, alkyl (meth)acrylate, aryl (meth)acrylate, and a vinyl compound.

As the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can also be preferably used. Further, copolymers obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. In addition, as a commercially available product thereof, for example, FF-426 (manufactured by Fujikura Kasei Co., Ltd.) or the like can also be used.

Moreover, an alkali-soluble resin having a polymerizable group may be used as the alkali-soluble resin. According to this aspect, the solvent resistance of a film thus obtained tends to be improved. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

It is also preferable that the alkali-soluble resin includes a polymer obtained by polymerizing monomer components including at least one of a compound represented by Formula (ED1) or a compound represented by Formula (ED2) (these compounds are hereinafter also referred to as an "ether dimer" in some cases). With regard to the polymer obtained by polymerizing monomer components including an ether dimer, reference can be made to paragraph Nos. 0022 to 0031 of JP2015-034961A, the contents of which are incorporated herein by reference.

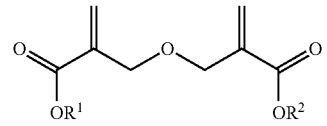

(ED1)

In Formula (ED1), $R^1$ and $R^2$ each independently represent a hydrogen atom, or a hydrocarbon group having 1 to 25 carbon atoms, which may have a substituent.

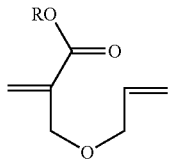
(ED2)

In Formula (ED2), R represents a hydrogen atom or an organic group having 1 to 30 carbon atoms. With regard to the specific examples of Formula (ED2), reference can be made to the descriptions in JP2010-168539A.

With regard to the specific examples of the ether dimer, reference can be made to paragraph No. 0317 of JP2013-029760A, the contents of which are incorporated herein by reference. The ether dimers may be of one kind or of two or more kinds thereof.

The alkali-soluble resin may include a structural unit derived from a compound represented by Formula (X).

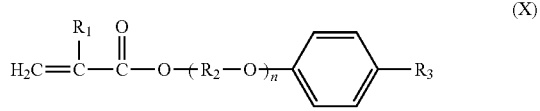
(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

Specific examples of the alkali-soluble resin include the following resins. Other examples thereof include the resins described in paragraph No. 0037 of JP2015-034961A. Among these resins, an alkali-soluble resin having a polymerizable group, such as C-2, is preferable from the viewpoint of solvent resistance.

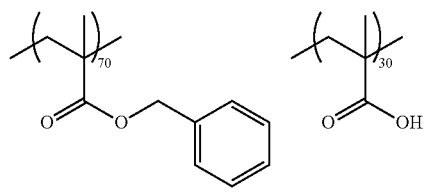
C-1

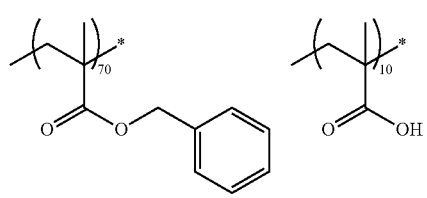
C-2

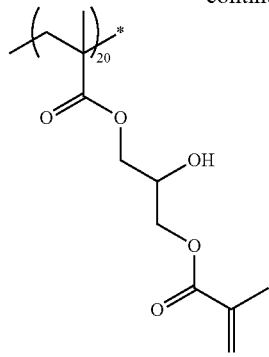

With regard to the alkali-soluble resin, reference can be made to the descriptions in paragraph Nos. 0558 to 0571 of JP2012-208494A (paragraph Nos. 0685 to 0700 of the corresponding US2012/0235099A), the contents of which are incorporated herein by reference. Moreover, it is possible to use the copolymers (B) described in paragraph Nos. 0029 to 0063 of JP2012-032767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein by reference.

As the binder, a resin having a refractive index to light at a wavelength of 589 nm of 1.5 or less may be used.

Examples of the resin having a refractive index to light at a wavelength of 589 nm of 1.5 or less include a fluorine-based resin and a polysiloxane-based resin. The polysiloxane-based resin is preferable. The refractive index of the resin can be measured by the following method in an uncured state. A specific measurement method is as follows: a film formed of only a resin to be measured on a Si wafer to 300 nm, and then the refractive index of the obtained film is measured using an ellipsometry (Lambda Ace RE-3300 (trade name), Dainippon Screen Mfg. Co., Ltd.).

—Fluorine-Based Resin—

The fluorine-based resin is not particularly limited as long as the resin includes a fluorine atom. Examples thereof include a resin having a repeating unit derived from a monomer represented by Formula (F1).

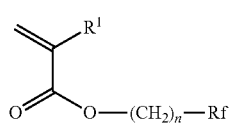
Formula (F1)

In Formula (F1), Rf is a substituent containing a fluoroalkyl group or a perfluoroalkyl group, n represents 1 or 2, and $R^1$ represents hydrogen or a methyl group.

Rf is preferably a substituent containing a fluoroalkyl group or a perfluoroalkyl group having 9 or more fluorine atoms. Specific examples of the substituent containing a fluoroalkyl group or a perfluoroalkyl group having 9 or more fluorine atoms include fluoroalkyl (meth)acrylates as follows.

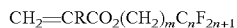

$CH_2=CRCO_2(CH_2)_m C_n F_{2n+1}$ (m represents 1 or 2, n represents an integer of 4 to 12. Further, R represents an alkyl group having 1 to 4 carbon atoms.)

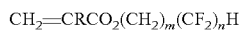

$CH_2=CRCO_2(CH_2)_m(CF_2)_n H$ (m represents 1 or 2, n represents an integer of 4 to 12. Further, R represents an alkyl group having 1 to 4 carbon atoms.)

In particular, the number of fluorine atom per substituent containing a fluoroalkyl group or a perfluoroalkyl group is preferably 9 to 30, and more preferably 13 to 25.

Furthermore, a polymer compound having a repeating unit derived from a fluorine atom-containing unsaturated monomer is also preferably used as the fluorine-based resin. Examples of the fluorine atom-containing unsaturated monomer include a radically polymerizable monomer having a polyfluoroalkyl group or a polyfluoroether group, and as the perfluoroalkyl group, a perfluoromethyl group, a perfluoroethyl group, a perfluoropropyl group, a perfluorobutyl group, a perfluorohexyl group, a perfluorooctyl group, a perfluorodecyl group, a perfluorododecyl group, or a perfluorotetradecyl group is suitable.

The fluorine atom-containing unsaturated monomers may be used singly or in combination of two or more kinds thereof. As the fluorine atom-containing unsaturated monomer, commercially available products thereof can also be used. Examples thereof include trade names LIGHT ESTER FM-108, LIGHT ESTER M-3F, and LIGHT ESTER M-4F, manufactured by Kyoeisha Chemical Co., Ltd.; and trade names CHEMINOX FAAC, CHEMINOX FAMAC, CHEMINOX FAAC-M, CHEMINOX FAMAC-M, CHEMINOX PFAE, and CHEMINOX PFOE, manufactured by Nihon Mectron Co., Ltd.

Furthermore, it is also preferable that the fluorine-based resin further has a repeating unit having a group enhancing alkali solubility. Such a resin can be used as an alkali-soluble resin.

With regard to examples of the fluorine-based resin, reference can be made to the fluorine-based surfactants described in the upper right column through the lower right column at page 6 of JP1990-000804A (JP-H02-000804A), the contents of which are incorporated herein by reference.

—Polysiloxane-Based Resin—

The polysiloxane-based resin is not particularly limited. For example, as the polysiloxane-based resin, a polysiloxane-based resin obtained by condensation by monohydrolysis from a compound represented by Formula (1), or a polysiloxane-based resin obtained by cohydrolysis and condensation of the compound represented by Formula (1) and another silane compound can be used. With regard to the polysiloxane-based resin, reference can be made to the descriptions in paragraph Nos. 0014 to 0035 of JP2014-066988A, the contents of which are incorporated herein by reference.

It is preferable to use a polysiloxane-based resin obtained by cohydrolysis and condensation of an alkoxysilane compound further including a compound represented by Formula (2), in addition to the compound represented by Formula (1), from the viewpoint of enhancing the solvent resistance.

It is preferable to use a polysiloxane-based resin obtained by cohydrolysis and condensation of an alkoxysilane compound including the compound represented by Formula (1) and further including a compound represented by Formula (3) from the viewpoint of enhancing an acid value of the polysiloxane-based resin and improving the pattern shape. Further, a polysiloxane-based resin obtained by cohydrolysis and condensation of an alkoxysilane compound including the compound represented by Formula (3) can also be used as the alkali-soluble resin.

$R^1{}_2Si(OR^2)_2$   Formula (1)

In Formula (1), $R^1$'s each independently an alkyl group or a phenyl group, and $R^2$'s each independently represent a hydrogen atom or an alkyl group.

In Formula (1), $R^1$ and $R^2$ are each preferably an alkyl group having 1 to 6 carbon atoms, more preferably an alkyl group having 1 to 4 carbon atoms, particularly preferably an alkyl group having 1 to 3 carbon atoms, more particularly preferably an alkyl group having 1 or 2 carbon atoms, and most preferably a methyl group. Specific examples thereof include a methyl group, an ethyl group, an n-propyl group, an isopropyl group, an n-butyl group, a sec-butyl group, a tert-butyl group, a pentyl group, a hexyl group, and a cyclohexyl group, and among those, the methyl group or the ethyl group is particularly preferable. Further, in a case where a plurality of $R^1$'s are present in the same molecule, they may be the same as or different from each other, which also applies to $R^2$ in Formula (1). The alkyl group in $R^1$ and $R^2$ in Formula (1) may be linear, branched, or cyclic, and is preferably linear.

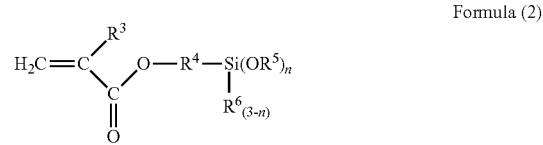

Formula (2)

In Formula (2), $R^3$ represents a methyl group or a hydrogen atom, $R^4$ represents an alkylene group having 1 to 4 carbon atoms, $R^5$'s each independently represent a hydrogen atom or an alkyl group having 1 to 4 carbon atoms, $R^6$'s each independently an alkyl group having 1 to 6 carbon atoms, and n represents an integer of 1 to 3.

$R^4$ in Formula (2) is preferably an alkylene group having 1 to 3 carbon atoms, and more preferably an alkylene group having 3 carbon atoms.

Preferred ranges of $R^6$ and $R^5$ in Formula (2) are the same as the preferred ranges of $R^1$ and $R^2$ in Formula (1).

n in Formula (2) is preferably 2 or 3, and more preferably 3.

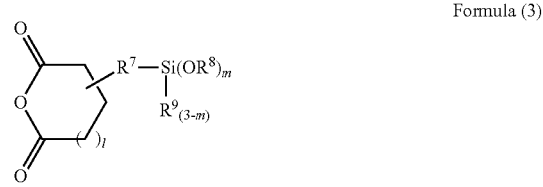

Formula (3)

In Formula (3), 1 represents an integer of 0 to 2, m represents an integer of 0 to 2, $R^7$ represents an alkylene group having 1 to 4 carbon atoms, $R^8$'s each independently represent a hydrogen atom or an alkyl group having 1 to 4 carbon atoms, and $R^9$'s each independently represent an alkyl group having 1 to 6 carbon atoms.

l in Formula (3) is more preferably 1.

m in Formula (3) is preferably 2 or 3, and more preferably 3.

$R^7$ in Formula (3) is preferably an alkylene group having 1 to 3 carbon atoms, and more preferably an alkylene group having 3 carbon atoms.

Preferred ranges of $R^9$ and $R^8$ in Formula (3) are the same as the preferred ranges of $R^1$ and $R^2$ in Formula (1).

The proportion of the compound represented by Formula (1) in the alkoxysilane compound to be subjected to cohydrolysis and condensation is preferably 25% to 75% by mole, more preferably 35% to 75% by mole, and particularly preferably 50% to 70% by mole. Further, the proportion of dimethoxydiphenylsilane, diethoxydiphenylsilane, and dihydroxydiphenylsilane in the alkoxysilane compound to be subjected to cohydrolysis and condensation is preferably 0% to 50% by mole, more preferably 0% to 45% by mole, particularly preferably 0% to 30% by mole, and more particularly preferably 0% to 10% by mole.

The proportion of the compound represented by Formula (2) in the alkoxysilane compound to be subjected to cohydrolysis and condensation is preferably 10% to 45% by mole, more preferably 10% to 30% by mole, and particularly preferably 15% to 20% by mole. By using the compound represented by Formula (2) as the alkoxysilane compound to be subjected to cohydrolysis and condensation, the solvent resistance can be enhanced.

The proportion of the compound represented by Formula (3) in the alkoxysilane compound to be subjected to cohydrolysis and condensation is preferably 1% to 30% by mole, and more preferably 1% to 25% by mole from the viewpoint of increasing the acid value of the polysiloxane-based resin to improve the pattern shape, and the proportion is particularly preferably 1% to 20% by mole from the viewpoint of suppressing the concentration unevenness after passage of one month.

The alkoxysilane compound to be subjected to cohydrolysis and condensation may include alkoxysilane compounds other than the compounds represented by Formulae (1) to (3). Examples of such other alkoxysilane compounds other than the compounds represented by Formulae (1) to (3) include phenethyltrimethoxysilane, naphthyltrimethoxysilane, phenethyltriethoxysilane, naphthyltriethoxysilane, tetramethoxysilane, and tetraethoxysilane.

(Dispersant)

The composition of the present invention can contain a dispersant as the resin. The dispersant preferably includes at least one selected from an acidic resin, a basic resin, and an amphoteric resin, and more preferably at least one selected from the acidic resin and the amphoteric resin. According to the aspect, the dispersibility of particles is good.

In the present invention, the acidic resin is a resin having an acid group, which has an acid value of 5 mgKOH/g or more and an amine value of less than 5 mgKOH/g. It is preferable that the acidic resin does not have a basic group. Examples of the acid group contained in the acidic resin include a carboxyl group, a phosphoric acid group, a sulfonic acid group, and a phenolic hydroxyl group, with the phosphoric acid group and the carboxyl group being preferable. The acid value of the acidic resin is preferably 5 to 200 mgKOH/g. The lower limit is more preferably 10 mgKOH/g or more, and still more preferably 20 mgKOH/g or more. The upper limit is more preferably 100 mgKOH/g or less, and still more preferably 60 mgKOH/g or less.

Further, the amine value of the acidic resin is preferably 2 mgKOH/g or less, and more preferably 1 mgKOH/g or less.

In the present invention, the basic resin is a resin having a basic group, which has an amine value of 5 mgKOH/g or more and an acid value of less than 5 mgKOH/g. It is preferable that the basic resin does not have an acid group. As the basic group contained in the basic resin, an amino group is preferable. The amine value of the basic resin is preferably 5 to 200 mgKOH/g, more preferably 5 to 150 mgKOH/g, and still more preferably 5 to 100 mgKOH/g.

In the present invention, the amphoteric resin is a resin having an acid group and a basic group, which has an acid value of 5 mgKOH/g or more and an amine value of 5 mgKOH/g or more. Examples of the acid group include the above-mentioned groups, with the carboxyl group being preferable. As the basic group, an amino group is preferable.

The amphoteric resin preferably has an acid value of 5 mgKOH/g or more and an amine value of 5 mgKOH/g or more. The acid value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The amine value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The ratio of the acid value to the amine value of the amphoteric resin, acid value:amine value, is preferably 1:4 to 4:1, and more preferably 1:3 to 3:1.

Examples of the dispersant include a polymer dispersant [for example, a resin having an amine group (a polyamidoamine and a salt thereof), an oligoimine-based resin, a polycarboxylic acid and a salt thereof, a high-molecular-weight unsaturated acid ester, a modified polyurethane, a modified polyester, a modified poly(meth)acrylate, a (meth) acrylic copolymer, and a naphthalene sulfonic acid/formalin polycondensate]. The polymer dispersants can further be classified into a linear polymer, a terminal-modified polymer, a graft type polymer, and a block type polymer, depending on its structure.

The dispersant preferably has a site having an adsorptive ability onto a pigment (hereinafter also totally referred to as an "adsorptive site"). Examples of the adsorptive site include a monovalent substituent having at least one group selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. The adsorptive site is preferably an acid-based adsorptive site. Examples of the acid-based adsorptive site include an acid group. Among those, the acid-based adsorptive site is preferably at least one of a phosphorus atom-containing group or a carboxyl group. Examples of the phosphorus atom-containing group include a phosphoric acid ester group, a polyphosphoric acid ester group, and a phosphoric acid group. With regard to the details of the adsorptive site, reference can be made to paragraph Nos. 0073 to 0080 of JP2015-034961A, the contents of which are incorporated herein by reference.

In the present invention, the resin (dispersant) is preferably a resin represented by Formula (111).

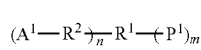  (111)

In Formula (111), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. n $A^1$'s and n $R^2$'s may be same as or different from each other, respectively. m represents a positive number of 8 or less, n represents 1 to 9, and m+n satisfies an integer of 3 to 10. $P^1$ represents a monovalent polymer chain. m $P^1$'s may be the same as or different from each other.

Since the substituent $A^1$ which is contained in the resin represented by Formula (111) can interact with a pigment (for example, a white pigment such as titanium oxide), the resin represented by Formula (111) may have n (1 to 9) substituents $A^1$'s to firmly interact with a pigment (for example, a white pigment such as titanium oxide), thereby improving the dispersibility of the pigment in the composition. In addition, in the resin represented by Formula (111), m polymer chains $P^1$'s contained in the resin can function as a sterically repulsive group, and thus, such m polymer chains $P^1$'s can exhibit good steric repulsion force, and thus, uniformly disperse a pigment (for example, a white pigment such as titanium oxide).

In Formula (111), $R^1$ represents an (m+n)-valent linking group. Examples of the (m+n)-valent linking group include a group including 1 to 100 carbon atoms, 0 to 10 nitrogen atoms, 0 to 50 oxygen atoms, 1 to 200 hydrogen atoms, and 0 to 20 sulfur atoms. With regard to the details of the (m+n)-valent linking group, reference can be made to paragraph Nos. 0076 to 0084 of JP2007-277514A, the contents of which are incorporated herein by reference.

In Formula (111), $P^1$ represents a monovalent polymer chain. The monovalent polymer chain is preferably a monovalent polymer chain having a repeating unit derived from a vinyl compound. With regard to the details of the polymer chain, reference can be made to paragraph Nos. 0087 to 0098 of JP2007-277514A, the contents of which are incorporated herein by reference.

In Formula (111), $R^2$ represents a single bond or a divalent linking group. Examples of the divalent linking group include a group including 1 to 100 carbon atoms, 0 to 10 nitrogen atoms, 0 to 50 oxygen atoms, 1 to 200 hydrogen atoms, and 0 to 20 sulfur atoms, and the divalent linking group may be unsubstituted or may further, have a substituent. With regard to the details of the divalent linking group, reference can be made to paragraph Nos. 0071 to 0075 of JP2007-277514A, the contents of which are incorporated herein by reference.

In Formula (111), with regard to the details of the monovalent substituent represented by $A^1$, reference can be made to paragraph Nos. 0041 to 0070 of JP2007-277514A, the contents of which are incorporated herein by reference.

With regard to the resin represented by the Formula (111), reference can be made to the descriptions in paragraph No. 0039 of JP2007-277514A (paragraph No. 0053 of the corresponding US2010/0233595A), the descriptions in paragraph Nos. 0081 to 0117 of JP2015-034961A, and the descriptions in JP5909468B, JP5894943B, and JP5894944B, the contents of which are incorporated herein by reference. Further, specific examples of the resin represented by Formula (111) include the following resins.

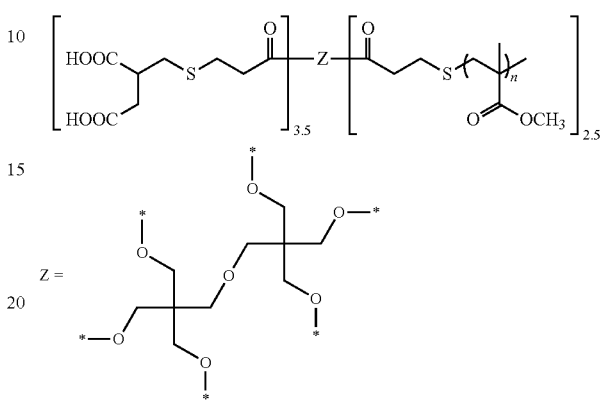

In the present invention, as the resin (dispersant), a graft copolymer including a repeating unit represented by any one of Formulae (11) to (14) can also be used.

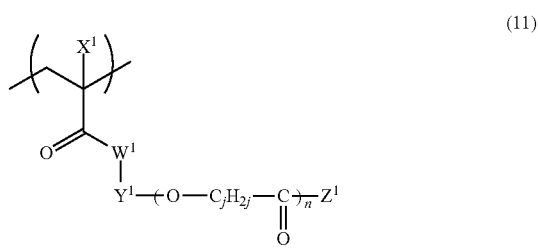  (11)

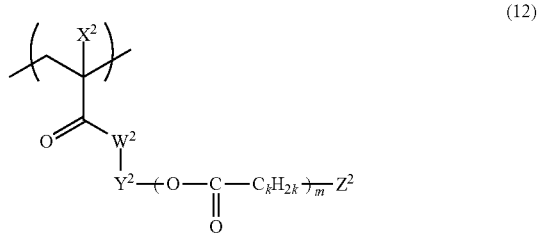  (12)

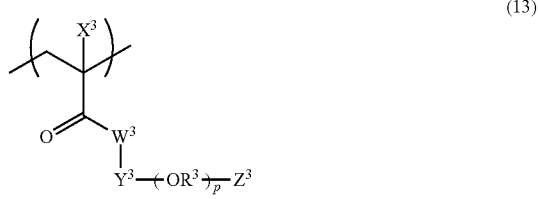  (13)

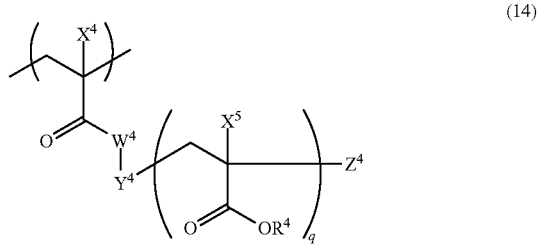  (14)

In Formulae (11) to (14), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p is 2 to 500, $R^3$'s which are present in plural numbers may be the same as or different from each other, and in Formula (14), in a case where q is 2 to 500, $X^5$'s and $R^4$'s which are present in plural numbers may be the same as or different from each other.

With regard to the graft copolymer, reference can be made to the descriptions in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

Here, the basic nitrogen atom is not particularly limited as long as it is a nitrogen atom exhibiting basicity, but it is preferable that the resin contains a structure having a nitrogen atom with a pKb of 14 or less, and more preferably contains a structure having a nitrogen atom with a pKb of 10 or less. In the present invention, the pKb (base strength) refers to a pKb at a water temperature of 25° C., is one of the indices for quantitatively representing the intensity of a base, and has the same definition as the basicity constant. The base strength pKb and the acid strength pKa are in a relationship of pKb=14-pKa.

The functional group with a pKa of 14 or less contained in the partial structure X is not particularly limited, and its structure or the like is not particularly limited as long as the physical properties satisfy the condition. The functional group with a pKa of 12 or less is particularly preferable, and the functional group with a pKa of 11 or less is most preferable.

The oligoimine-based dispersant is preferably a resin having a repeating unit containing a basic nitrogen atom to which the partial structure X having a functional group with a pKa of 14 or less is bonded, and an oligomer chain or polymer chain Y having 40 to 10,000 atoms in a side chain.

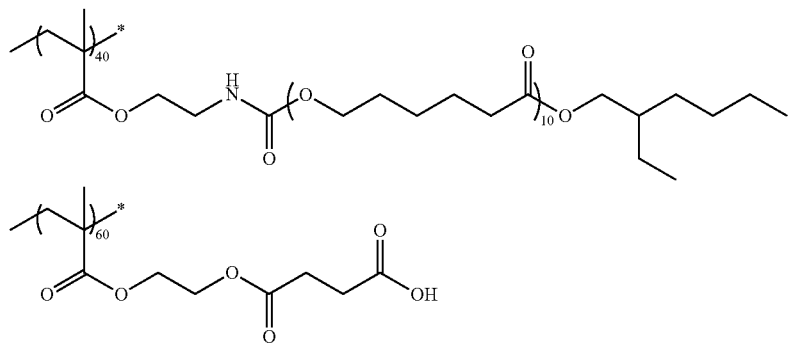

In the present invention, as the resin (dispersant), an oligoimine-based dispersant having a basic nitrogen atom in at least one of the main chain or a side chain is also preferable. As the oligoimine-based dispersant, a resin including a repeating unit having a partial structure X having a functional group with a pKa of 14 or less and a side chain including an oligomer chain or polymer chain Y having 40 to 10,000 atoms, and having a basic nitrogen atom in at least one of the main chain or the side chain is preferable. This resin interacts with a pigment (for example, inorganic particles such as titanium oxide) at both a nitrogen atom and a functional group contained in the structure X, with a pKa of 14 or less, and the resin has an oligomer chain or polymer chain Y having 40 to 10,000 atoms. Therefore, for example, the oligomer chain or polymer chain Y functions as a sterically repulsive group and thus exhibits good dispersibility, and thus, inorganic particles such as titanium oxide can be uniformly dispersed. Further, the oligomer chain or polymer chain Y interacts with a solvent, and thus, sedimentation of inorganic particles such as titanium oxide can be suppressed for a long period of time. In addition, the oligomer chain or polymer chain Y functions as a sterically repulsive group, and thus, aggregation of a pigment (for example, a white pigment such as titanium oxide) is prevented, and therefore, even in a case where the content of the pigment (preferably titanium oxide and the like) is increased, excellent dispersibility is obtained.

From the viewpoint of the dispersibility, the dispersion stability and the developability, the number of atoms of the oligomer chain or polymer chain Y is preferably 50 to 5,000, and more preferably 60 to 3,000. In addition, it is possible to measure the number-average molecular weight of Y using a value in terms of polystyrene according to a GPC method. The number-average molecular weight of Y is preferably 1,000 to 50,000, and more preferably 1,000 to 30,000.

Examples of the oligoimine-based dispersant include a resin including at least one of a repeating unit represented by Formula (I-1), a repeating unit represented by Formula (I-2), or a repeating unit represented by Formula (I-2a).

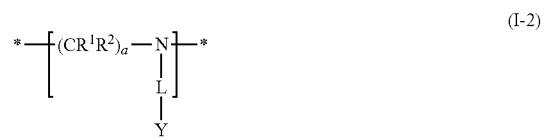

-continued

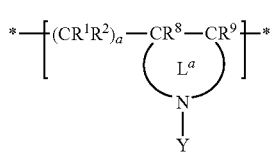
(I-2a)

$R^1$ and $R^2$ each independently represent a hydrogen atom, a halogen atom, or an alkyl group (preferably having 1 to 6 carbon atoms).

a's each independently represents an integer from 1 to 5.

* represents a linking moiety between the repeating units.

$R^8$ and $R^9$ are each a group having the same definition as $R^1$.

L is a single bond, an alkylene group (preferably having 1 to 6 carbon atoms), an alkenylene group (preferably having 2 to 6 carbon atoms), an arylene group (preferably having 6 to 24 carbon atoms), a heteroarylene group (preferably having 1 to 6 carbon atoms), an imino group (preferably having 0 to 6 carbon atoms), an ether group, a thioether group, a carbonyl group, or a linking group which is related to a combination thereof. Among these, a single bond or —$CR^5R^6$—$NR^7$— (an imino group bonds with X or Y) is preferable. Here, $R^5$ and $R^6$ each independently represent a hydrogen atom, a halogen atom or an alkyl group (preferably having 1 to 6 carbon atoms). $R^7$ is a hydrogen atom or an alkyl group having 1 to 6 carbon atoms.

$L^a$ is a structural site which forms a ring structure along with $CR^8CR^9$ and N, and is preferably a structural site which forms a non-aromatic heterocycle which has 3 to 7 carbon atoms along with the carbon atoms of $CR^8CR^9$. A structural site which forms a non-aromatic heterocycle which has 5 to 7 members along with the carbon atoms of $CR^8CR^9$ and N (a nitrogen atom) is more preferable, a structural site which forms a non-aromatic heterocycle which has 5 members is even more preferable, and a structural site which forms pyrrolidine is particularly preferable. Here, the structural site may further have a substituent such as an alkyl group. X represents a group which has a functional group with a pKa of 14 or less. Y represents an oligomer chain or polymer chain which has 40 to 10,000 atoms.

The dispersant (oligoimine-based dispersant) may further, contain one or more selected from repeating units represented by Formulae (I-3), (I-4), and (I-5) as a copolymerization component. It is possible to further improve the dispersibility of the particles by incorporating such a repeating unit into the dispersant.

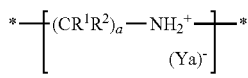
(I-3)

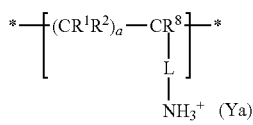
(I-4)

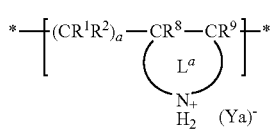
(I-5)

$R^1$, $R^2$, $R^8$, $R^9$, L, $L^a$, a, and * have the same definitions as in Formulae (I-1), (I-2), and (I-2a). Ya represents an oligomer chain or polymer chain having 40 to 10,000 atoms, which has an anion group.

With regard to the oligoimine-based dispersant, reference can be made to the descriptions in paragraph Nos. 0118 to 0190 of JP2015-034961A, the contents of which are incorporated herein by reference. As specific examples of the oligoimine-based dispersant, for example, the following resins or the resins described in paragraph Nos. 0169 to 0190 of JP2015-034961A can be used.

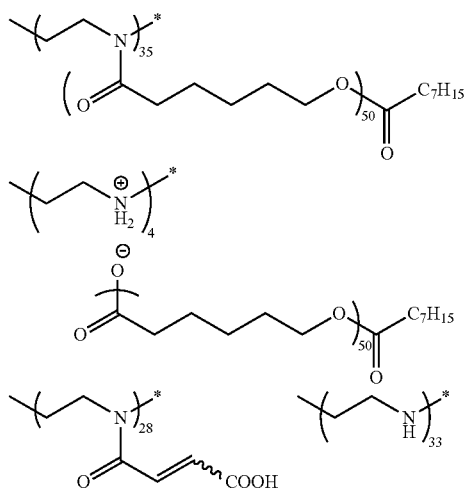

The dispersant can also be available as a commercially available product, and specific examples thereof include "Disperbyk-101 (polyamidoamine phosphate), 107 (carboxylate ester), 110 and 180 (a copolymer which includes an acid group), 130 (polyamide), 161, 162, 163, 164, 165, 166, and 170 (polymer copolymer)", and "BYK-P104 and P105 (high-molecular-weight unsaturated polycarboxylic acid)" manufactured by BYK Chemie Co., Ltd., "EFKA 4047, 4050, 4010, and 4165 (polyurethane-based), EFKA 4330 and 4340 (block copolymers), 4400 and 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA Ltd., "AJISPER PB821 and PB822" manufactured by Ajinomoto Fine-Techno Co., Inc., "FLOWREN TG-710 (urethane oligomer)" and "POLYFLOW No. 50E and No. 300 (acrylic copolymer)" manufactured by Kyoeisha Chemical Co., Ltd., "DISPARLON KS-860, 873SN, 874, and #2150 (aliphatic polycarboxylic acid), #7004 (polyether ester), DA-703-50, DA-705, and DA-725" manufactured by Kusumoto Chemicals, Ltd., "DEMOL RN and N (naphthalenesulfonic acid formalin polycondensate), and MS, C, and SN-B (aromatic sulfonic acid/formalin polycondensate)", "HOMOGENOL L-18 (polymer polycarboxylic acid)", "EMULGEN 920, 930, 935, and 985 (polyoxyethylene nonyl phenyl ether)" and "ACETAMIN 86 (stearylamine acetate)" manufactured by Kao Corp., "Solsperse 5000 (phthalocyanine derivative), 22000 (azo pigment derivative), 13240 (polyester amine), 3000, 17000, and 27000 (polymers which have a functional section in the terminal), 24000, 26000, 28000, 32000, 36000, and 38500 (graft type polymers), 41000, and 46000" manufactured by Lubrizol Corp., "NIKKOL T106 (polyoxyethylene sorbitan monooleate), and MYS-IEX (polyoxyethylene monostearate)" manufactured by Nikko Chemicals Co., Ltd., and the like.

Moreover, among the dispersants, a dispersant having a phosphorus atom-containing group (for example, a phosphoric acid group) as an acid-based adsorptive site, and a graft copolymer and oligoimine-based dispersant including a repeating unit represented by any one of Formulae (11) to (14) are preferable. As the acid-based adsorptive site, the dispersant having a phosphorus atom-containing group as an acid-based adsorptive site and the graft copolymer including a repeating unit represented by any one of Formulae (11) to (14) are more preferable from the viewpoint of a pattern shape.

Furthermore, a dispersant having a polyester structure, and preferably a polyester structure formed by ring-opening polymerization of ε-caprolactone, or δ-valerolactone, as a sterically repulsive group, in addition to the acid-based adsorptive site, is from the viewpoint of dispersion stability.

Examples of the commercially available product of the dispersant having a phosphorus atom-containing group as an acid-based adsorptive site include "Solsperse 26000, 36000 (having a polyester-based structure), and 41000 (having a polyether-based structure)" manufactured by Lubrizol Japan Ltd., which can be appropriately used. Among the commercially available products of the dispersant having a phosphorus atom-containing group as an acid-based adsorptive site, Solsperse 36000 manufactured by Lubrizol Japan Ltd. is preferable.

The dispersants can be used singly or in combination of two or more kinds thereof.

For the dispersant, the resin described for the binder as described above can also be used. Further, for the dispersant, a resin having a refractive index to light at a wavelength of 589 nm of 1.5 or less may be used.

As the dispersant, a dispersant having an acid group and a crosslinkable group can also be used. Preferred examples of the acid group include a sulfo group, a phosphoric acid group, a phosphonic acid group, and a carboxyl group, and the phosphoric acid group is preferable. Examples of the crosslinkable group include a group having an ethylenically unsaturated bond, an epoxy group, and a mercapto group, and the group having an ethylenically unsaturated bond is more preferable. Examples of commercially available products of the dispersant include LIGHT ESTER P-1M, LIGHT ESTER P-2M, LIGHT ESTER HO-MS, and LIGHT ESTER HO-HH (all manufactured by Kyoei-Sha Chemical Co., Ltd), PHOSMER M, PHOSMER PE, PHOSMER MH, Hosmer CL, and PHOSMER PP (all manufactured by Uni-Chemical Co., Ltd.), and TBAS-Q and TBAS-R (manufactured by MRC Unitech Co., Ltd.).

The content of the dispersant is preferably 1% to 80% by mass with respect to the total solid content of the composition for forming a white layer, from the viewpoints of a pattern shape and adhesiveness. The upper limit is preferably 70% by mass or less, and more preferably 60% by mass or less, with respect to the total solid content of the composition for forming a white layer. The lower limit is preferably 1.5% by mass or more, and more preferably 2% by mass or more.

Furthermore, the content of the dispersant is preferably 1 to 100 parts by mass with respect to 100 parts by mass of the white pigment. The upper limit is preferably 80 parts by mass or less, and more preferably 60 parts by mass or less. The lower limit is preferably 2.5 parts by mass or more, and more preferably 5 parts by mass or more.

Moreover, the content of the dispersant is preferably 1 to 100 parts by mass with respect to 100 parts by mass of the white pigment. The upper limit is preferably 80 parts by mass or less, and more preferably 60 parts by mass or less. The lower limit is preferably 2.5 parts by mass or more, and more preferably 5 parts by mass or more.

In addition, the content of the dispersant is preferably 1 to 100 parts by mass with respect to 100 parts by mass of titanium oxide. The upper limit is preferably 80 parts by mass or less, and more preferably 60 parts by mass or less. The lower limit is preferably 2.5 parts by mass or more, and more preferably 5 parts by mass or more.

<<Solvent>>

The composition for forming a white layer preferably contains a solvent. The solvent can be constituted with various organic solvents. Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, butyl diglycol acetate, and 3-methoxybutyl acetate. These organic solvents may be used individually or as a mixture.

In the present invention, a solvent having a small metal content is preferably used as the solvent. The metal content of the solvent is preferably, for example, 10 parts per billion (ppb) by mass or less. As desired, a solvent having a metal content at a level of parts per trillion (ppt) by mass may be used, and such a high-purity solvent is provided by, for example, Toyo Gosei Co., Ltd. (The Chemical Daily (Kagaku Kogyo Nippo), Nov. 13, 2015).

Examples of a method for removing impurities such as metals from the solvent include distillation (molecular distillation, thin film distillation, or the like) and filtration using a filter. As for the filter pore diameter of the filter used for the filtration, the pore size is preferably 10 μm or less, more preferably 5 μm or less, and still more preferably 3 μm or less. As for the materials of a filter, a polytetrafluoroethylene-made filter, a polyethylene-made filter, or a nylon-made filter is preferable.

The solvent may include isomers (compounds having the same number of atoms and different structures). Further, one kind or a plurality of kinds of the isomers may be included.

The content of the solvent is preferably such a content that the concentration of the solid content of the composition for forming a white layer becomes 25% to 70% by mass, and more preferably such a content that the concentration of the solid content of the composition for forming a white layer becomes 30% to 60% by mass.

<<Curable Compound>>

The composition for forming a white layer preferably contains a curable compound.

For the curable compound, a compound which can be crosslinked (the crosslinking includes polymerization and condensation) by a radical, an acid, or heat can be used. Examples of the curable compound used in the present invention include a compound having an ethylenically unsaturated bond-containing group, a compound having an epoxy group, and a compound having a methylol group, with the compound having an ethylenically unsaturated bond-containing group being preferable. Examples of the ethylenically unsaturated bond-containing group include a vinyl group, a (meth)allyl group, and a (meth)acryloyl group, and the curable compound is preferably the (meth) acryloyl group.

In the present invention, the curable compound is preferably a radically polymerizable compound. Examples of the radically polymerizable compound include a compound having a group having an ethylenically unsaturated bond. Hereinafter, in a case where a polymerizable compound is referred unless otherwise specified, it means a radically polymerizable compound.

The content of the curable compound is preferably 1% to 70% by mass with respect to the total solid content of the composition for forming a white layer. The lower limit is preferably 3% by mass or more, and more preferably 5% by mass or more. The upper limit is preferably 60% by mass or less, and more preferably 50% by mass or less. These ranges are preferable from the viewpoints of a pattern shape, heat resistance, and L*. The curable compounds used in the composition for forming a white layer may be of one kind or two or more kinds thereof. In a case where the curable compounds are of two or more kinds thereof, the total amount thereof preferably falls within the range.

In a case where a polymerizable compound is used as the curable compound, the content of the polymerizable compound is preferably 1% to 70% by mass with respect to the total solid content of the composition for forming a white layer. The lower limit is preferably 3% by mass or more, and more preferably 5% by mass or more. The upper limit is preferably 60% by mass or less, and more preferably 50% by mass or less. The polymerizable compound used in the composition for forming a white layer may be of one kind or of two or more kinds thereof. In a case where the polymerization compounds are of two or more kinds thereof, the total amount thereof preferably falls within the range.

In addition, the content of the polymerizable compound is preferably 10% to 100% by mass, and more preferably 30% to 100% by mass, with respect to the total mass of the curable compound.

(Polymerizable Compound)

The polymerizable compound is preferably a compound having at least one ethylenically unsaturated bond-containing group, and more preferably a compound having at least one terminal ethylenically unsaturated bond-containing group, or preferably two or more terminal ethylenically unsaturated bond-containing groups. Further, the polymerizable compound is preferably a compound having 6 or more ethylenically unsaturated bond-containing groups, more preferably a compound having 3 or 4 ethylenically unsaturated bond-containing groups, and still more preferably a compound having 3 or 4 ethylenically unsaturated bond-containing groups.

The polymerizable compound may be in any form of a monomer and a polymer, with the monomer being preferable. The monomer type polymerizable compound preferably has a molecular weight of 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, more preferably a trifunctional to hexafunctional (meth)acrylate compound, and still more preferably a trifunctional or tetrafunctional (meth)acrylate compound, from the viewpoint of a pattern shape. According to this aspect, the solvent resistance of the obtained film, the adhesiveness to a substrate, or the pattern shape can be improved. Further, the polymerizable compound is preferably a hexafunctional or higher (meth)acrylate compound.

The polymerizable compound is preferably a compound having an ethylenically unsaturated bond-containing group, with a boiling point of 100° C. or higher at normal pressure, in which the compound has at least one addition-polymerizable ethylene group. Examples thereof include monofunctional acrylates or methacrylates such as polyethylene glycol mono(meth)acrylate, polypropylene glycol mono(meth)acrylate, and phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl) ether, tri(acryloyloxyethyl) isocyanurate, and a mixture thereof, and the polymerizable compound is preferably pentaerythritol tetra(meth)acrylate.

As the polymerizable compound, the polymerizable compounds represented by Formulae (MO-1) to (MO-5) can be suitably used. Further, in a case where T is an oxyalkylene group in the formula, a terminal on the side of the carbon atom is bonded to R.

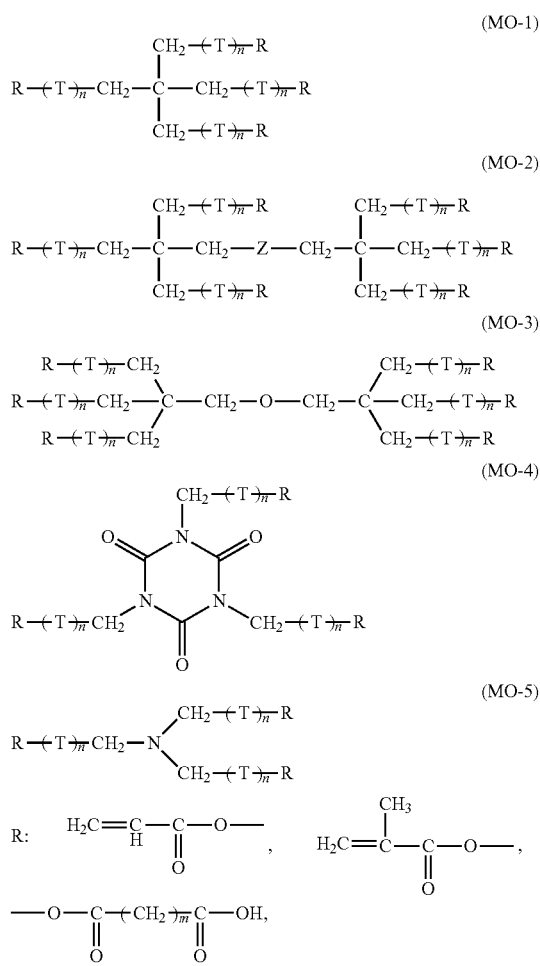

-continued

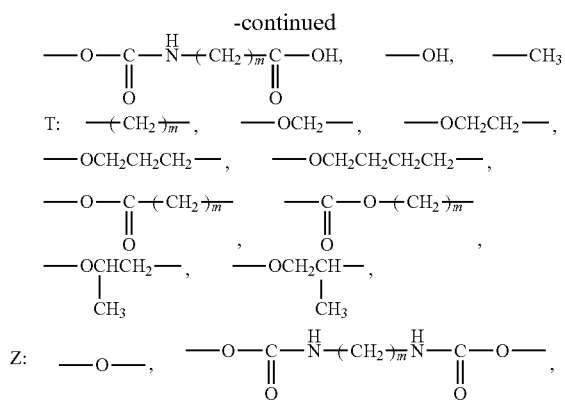

In the formulae, n is 0 to 14, and m is 1 to 8. A plurality of R's and T's which are present in the same molecule may be the same as or different from each other.

In each of the polymerizable compounds represented by Formulae (MO-1) to (MO-5), at least one of the plurality of R's represents a group represented by —OC(=O)CH=CH$_2$ or —OC(=O)C(CH$_3$)=CH$_2$.

Specific examples of the polymerizable compounds represented by Formulae (MO-1) to (MO-5) include the compounds described in paragraph Nos. 0248 to 0251 of JP2007-269779A.

Furthermore, a compound obtained by adding ethylene oxide or propylene oxide to a polyfunctional alcohol, followed by (meth)acrylation, which is described in JP1998-062986A (JP-H10-062986A), can also be used as the polymerizable compound.

As the polymerizable compound, pentaerythritol tetraacrylate (NK ESTER A-TMMT as a commercially available product; manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), or dipentaerythritol hexa(meth)acrylate (KAYARAD DPHA as a commercially available product; manufactured by Nippon Kayaku Co., Ltd.) is preferable, and pentaerythritol tetraacrylate is more preferable from the viewpoint of a pattern shape.

The polymerizable compound may have an acid group such as a carboxyl group, a sulfo group, and a phosphoric acid group. The polymerizable compound having an acid group is obtained by a method including (meth)acrylating a hydroxyl group in a part of a polyhydric alcohol, and subjecting the remaining hydroxyl group to an addition reaction with an acid anhydride to form a carboxyl group, or the like. Examples of the polymerizable compound having an acid group include an ester of an aliphatic polyhydroxy compound with an unsaturated carboxylic acid. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably, in this ester, the aliphatic polyhydroxy compound is at least one of pentaerythritol or dipentaerythritol. Examples of the commercially available product thereof include ARONIX series M-305, M-510, and M-520 as a polybasic acid-modified acryl oligomer manufactured by TOAGOSEI, CO., LTD. The acid value of the polymerizable compound having an acid group is preferably 0.1 to 40 mgKOH/g. The lower limit is preferably 5 mgKOH/g or more. The upper limit is preferably 30 mgKOH/g or less.

Moreover, it is also a preferred aspect that the polymerizable compound is a compound having a caprolactone structure. The polymerizable compound having a caprolactone structure is not particularly limited as long as it has a caprolactone structure in a molecule thereof. Examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. With regard to the polymerizable compound having a caprolactone structure, reference can be made to the descriptions in paragraph Nos. 0091 to 0107 of JP2016-006475A, the contents of which are incorporated herein by reference. Examples of the commercially available product of the polymerizable compound include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As the polymerizable compound, the urethane acrylates described in JP1973-041708B (JP-S48-041708B), JP1976-037193A (JP-S51-037193A), JP1990-032293B (JP-H02-032293B), and JP1990-016765B (JP-H02-016765B) or urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. In addition, the addition-polymerizable compounds having an amino structure or a sulfide structure in a molecule, which are described in JP1988-277653A (JP-S63-277653A), JP1988-260909A (JP-S63-260909A), and JP1989-105238A (JP-H01-105238A), are also preferable.

Examples of commercially available products of the polymerizable compound include urethane oligomers UAS-10 and UAB-140 (manufactured by Sanyo-Kokusaku Pulp, Co., Ltd.), U-4HA, U-6LPA, UA-32P, U-10HA, U-10PA, UA-122P, UA-1100H, and UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600, and AI-600 (manufactured by Kyoeisha Chemical Co., Ltd.), and UA-9050 and UA-9048 (manufactured by BASF).

Furthermore, it is another preferred aspect that the polymerizable compound is a polymerizable compound having a Si atom in the molecule thereof. Examples of a commercially available product of the polymerizable compound is a polymerizable compound having a Si atom in the molecule thereof include EBECRYL 1360 (manufactured by Daicel-Allnex Ltd.) which is a siloxane bond-containing polyfunctional acrylate, and VINYLTRIISOPROPENOXYSILANE (manufactured by AZmax Co., Ltd.) which is a Si atom-containing polyfunctional vinyl compound.

As for these polymerizable compounds, details of the method of use such as the structure of the compounds, single use or use of a combination, and the amount to be added may be arbitrarily set in accordance with the final performance design of the curable compositions. For example, from the viewpoint of sensitivity, a structure having a high content of unsaturated groups per one molecule is preferable, and in many cases, biofunctionality or higher functionality is preferred. Further, from the viewpoint of increasing the strength of a cured film, a trifunctional or higher compound is desirable, and in addition, it is also effective to use a method of controlling both the sensitivity and the strength by using a combination of compounds with at least one of functionalities or polymerizable groups being different. In addition, it is also preferable to use a polymerizable compound having a different ethylene oxide chain form as a trifunctional or higher compound in combination. According to this aspect, it is possible to control developability of the composition for forming a white layer, and an excellent pattern shape is formed. Further, at least one of the selection or the method of use of the polymerizable compounds is also an important factor for at least one of the compatibility with or the dispersibility of other components (for example, a photopolymerization initiator and a resin) contained in the composition for forming a white layer, and for example, the compatibility or the like can be improved by using a low-purity compound or using a combination of two or more kinds of other components.

(Compound Having Epoxy Group)

For the composition for forming a white layer, a compound having an epoxy group can also be used as the curable compound. According to this aspect, the solvent resistance of the obtained film can be improved. Examples of the compound having an epoxy group include a monofunctional or polyfunctional glycidyl ether compound and a polyfunctional aliphatic glycidyl ether compound. Further, a compound having an alicyclic epoxy group can also be used.

Examples of the compound having an epoxy group include a compound having one or more epoxy groups per molecule, and the number of epoxy groups per molecule is preferably 1 to 100. The upper limit can be set to, for example, 10 or less, or to 5 or less. The lower limit is preferably 2 or more.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low molecular compound (for example, further, a molecular weight of less than 1,000) or a polymer compound (macromolecule) (for example, a molecular weight of 1,000 or more, and in the case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 10,000 or less, more preferably 5,000 or less, and still more preferably 3,000 or less. It is preferable that the compound having an epoxy group is an aliphatic epoxy resin from the viewpoint of solvent resistance.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used.

<<Polymerization Initiator>>

The composition for forming a white layer preferably includes a polymerization initiator.

The content of the polymerization initiator is preferably 0.1% to 50% by mass with respect to the total solid content of the composition for forming a white layer from the viewpoints of solvent resistance and a coloring property, more preferably 0.5 to 30% by mass, and still more preferably 1% to 20% by mass. The composition may have one kind or two or more kinds of the polymerization initiators. In a case where two or more kinds of the polymerization initiators are included, the total amount thereof preferably falls within the range.

As the polymerization initiator, a photopolymerization initiator or a thermal polymerization initiator is preferable, with the photopolymerization initiator being preferable. The thermal polymerization initiator is not particularly limited, known compounds can be used.

(Photopolymerization Initiator)

The composition for forming a white layer can contain a photopolymerization initiator. In particular, in a case where the composition for forming a white layer includes a polymerizable compound, it is preferable that the composition contains a photopolymerization initiator. The photopolymerization initiator is not particularly limited, and can be appropriately selected from known photopolymerization initiators. For example, a compound having photosensitivity with respect to light rays in a range ranging from an ultraviolet region to visible light region is preferable. Further, the photopolymerization initiator is preferably a photoradical polymerization initiator.

Examples of the photopolymerization initiator include halogenated hydrocarbon derivatives (for example, a derivative having a triazine skeleton and a derivative having an oxadiazole skeleton), acylphosphine compounds such as acylphosphine oxide, hexaaryl biimidazole, oxime compounds such as an oxime derivative, organic peroxide, thio compounds, ketone compounds, aromatic onium salts, ketoxime ethers, aminoacetophenone compounds, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-058241A (JP-S62-058241A), the compounds described in JP1993-281728A (JP-H05-281728A), the compounds described in JP1993-034920A (JP-H05-034920A), and the compounds described in U.S. Pat. No. 4,212,976A.

Furthermore, from the viewpoint of exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound, and a derivative of these, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also suitably be used. More specifically, for example, the aminoacetophenone-based initiators described in JP1998-291969A (JP-H10-291969A) and the acylphosphine-based initiators described in JP4225898B can also be used. As the hydroxyacetophenone-based initiator, IRGACURE 184, DAROCUR-1173, IRGACURE 500, IRGACURE 2959, and IRGACURE 127 (trade names: all manufactured by BASF) can be used. As the aminoacetophenone-based initiator, IRGACURE 907, IRGACURE 369, IRGACURE 379, and IRGACURE 379EG (trade names: all manufactured by BASF) which are commercially available products can be used. As the aminoacetophenone-based initiator, the compound described in JP2009-191179A can be used.

As the acylphosphine-based initiator, IRGACURE 819 or IRGACURE TPO (trade name: both manufactured by BASF) which are commercially available products can be used.

From the viewpoint of a coloring property, an oxime compound, an aminoacetophenone-based initiator, or an acylphosphine-based initiator is preferable.

Furthermore, as the photopolymerization initiator, KAYACURE DETX-S (manufactured by Nippon Kayaku Co., Ltd.) can also be used.

As the photopolymerization initiator, an oxime compound can also be preferably used. As the oxime compound, an oxime ester compound is more preferable. As the specific examples of the oxime compounds, the compound described in JP2001-233842A, the compound described in JP2000-080068A, the compound described in JP2006-342166A, or the compound described in JP2016-021012A can be used.

In the present invention, examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Furthermore, examples of the oxime compound also include the compounds described in J. C. S. Perkin II (1979), pp. 1653-1660, J. C. S. Perkin II (1979), pp. 156-162, Journal of Photopolymer Science and Technology (1995), pp. 202-232, and each publication of JP2000-066385A, JP2000-080068A, JP2004-534797A, and JP2006-342166A, and the like. As the commercially available products thereof, IRGACURE OXE01, IRGACURE OXE02, IRGACURE-OXE03, and IRGACURE-OXE04 (manufactured by BASF) and IRGACURE OXE02 (manufactured by BASF) are also suitably used. In addition, TR-PBG-304 (manufactured by Changzhou Tronly New Electronic Materials Co., Ltd.), ADEKA ARKLS NCI-930 (manufactured by ADEKA Corporation), or ADEKA OPTOMER N-1919 (manufactured by ADEKA Corporation, or the photopolymerization initiator 2 described in JP2012-014052A) can also be used.

Furthermore, as oxime compounds other than the above, the compounds described in JP2009-519904A in which oxime is linked to an N-position of the carbazole ring, the compounds described in U.S. Pat. No. 7,626,957B in which a hetero-substituent is introduced into a benzophenone moiety, the compounds described in JP2010-015025A and US2009-292039A in which a nitro group is introduced into a coloring agent moiety, the ketoxime compounds described in WO2009/131189A, the compounds described in U.S. Pat. No. 7,556,910B, which contain a triazine skeleton and an oxime skeleton in the same molecule, the compounds described in JP2009-221114A, which have a maximum absorption wavelength at 405 nm and have excellent sensitivity to a light source of g-rays, the compounds described in paragraph Nos. 0076 to 0079 of JP2014-137466A, and the like, may be used.

In addition, a compound represented by Formula (OX-1) is preferable as the oxime compound. The oxime compound may be an oxime compound in which an N—O bond of oxime forms an (E) isomer, an oxime compound in which the N—O bond of oxime forms a (Z) isomer, or an oxime compound in which the N—O bond forms a mixture of an (E) isomer and a (Z) isomer.

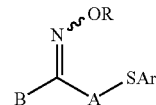

(OX-1)

In Formula (OX-1), R and B each independently represent a monovalent substituent, A represents a divalent organic group, and Ar represents an aryl group.

In Formula (OX-1), a monovalent non-metal atomic group is preferable as the monovalent substituent represented by R. Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above substituents may further be substituted with other substituents. Examples of the substituents include a halogen atom, an aryloxy group, an alkoxycarbonyl group, an aryloxycarbonyl group, an acyloxy group, an acyl group, an alkyl group, and an aryl group.

In Formula (OX-1), an aryl group, a heterocyclic group, an arylcarbonyl group, or a heterocyclic carbonyl group is preferable as the monovalent substituent represented by B. These groups may have one or more substituents. Examples of the substituent include the above-mentioned substituents.

In Formula (OX-1), an alkylene group having 1 to 12 carbon atoms, a cycloalkylene group, or an alkynylene group is preferable as the divalent organic group represented by A. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is preferably used in the form of a dimer. Specific examples of the oxime compound having a nitro group include the compounds described in paragraph Nos. 0031 to 0047 of JP2013-114249A and paragraph Nos. 0008 to 0012, and 0070 to 0079 of JP2014-137466A, the compounds described in paragraph Nos. 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound which is preferably used in the present invention are shown below, but the present invention is not limited thereto.

(C-1)
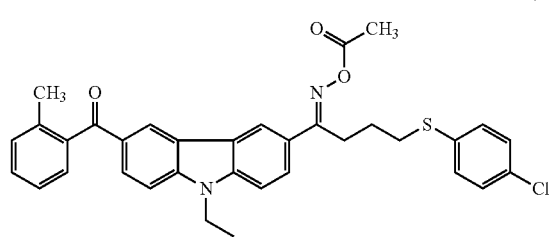

(C-2)
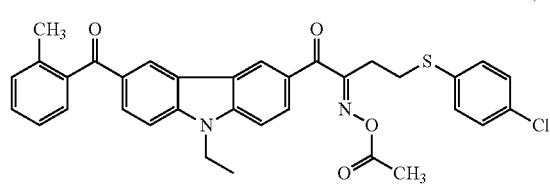

(C-3)
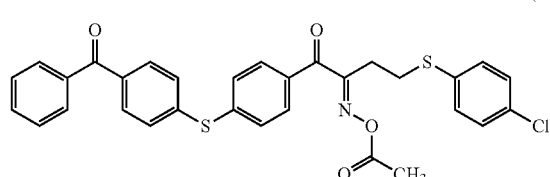

(C-4)
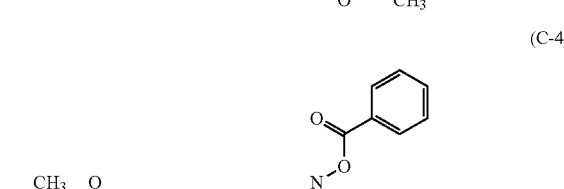

(C-5)
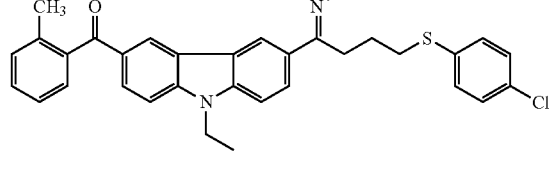

-continued (C-6)
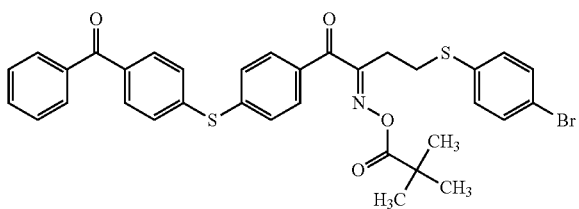

(C-7)
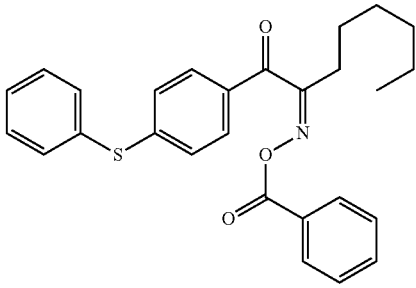

(C-8)
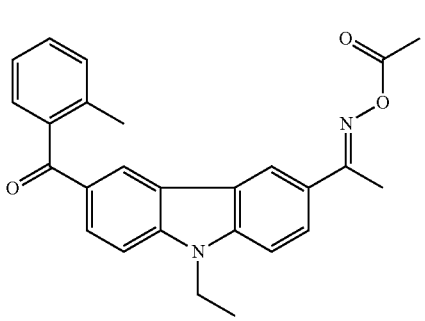

(C-9)
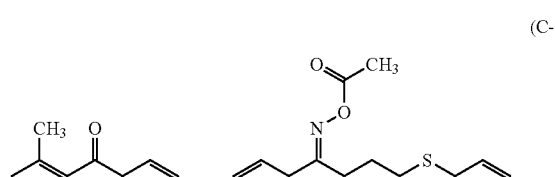

(C-10)
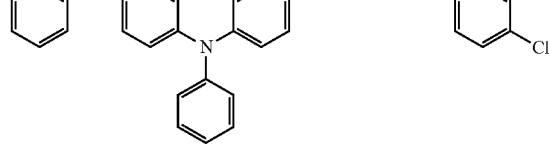

-continued

(C-11)

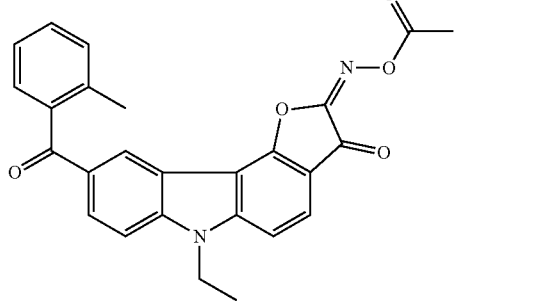
(C-12)

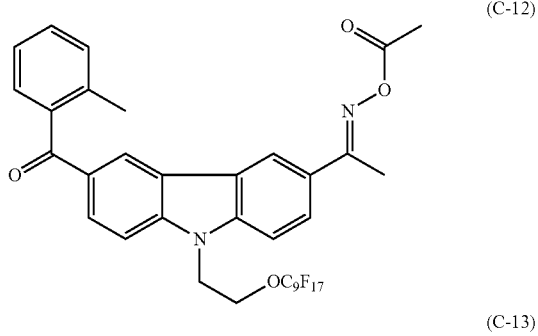
(C-13)

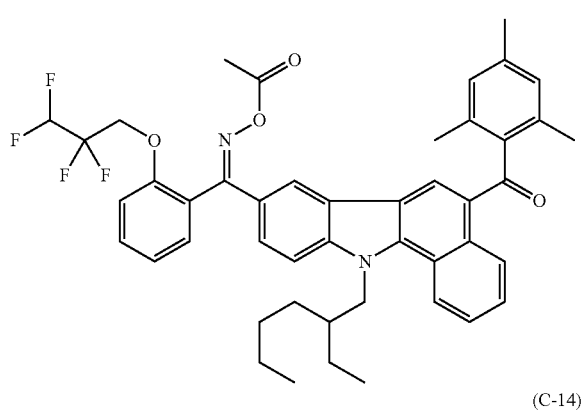
(C-14)

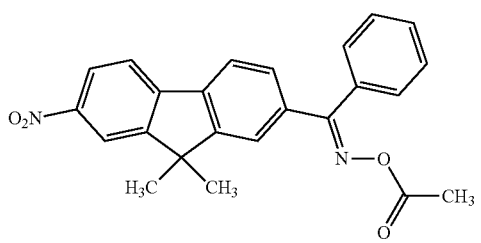

The oxime compound is the compound having a maximum absorption wavelength in a wavelength range of preferably 350 nm to 500 nm, more preferably the compound having a maximum absorption wavelength in a wavelength range of 360 nm to 480 nm, and particularly preferably the compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

In the present invention, it is also preferable that the photopolymerization initiator is used in combination of two or more kinds thereof. For example, it is preferable to use a combination of a photopolymerization initiator with a light absorption coefficient at 365 nm in methanol of $1.0 \times 10^3$ mL/gcm or more and a photopolymerization initiator with a light absorption coefficient at 365 nm in methanol of $1.0 \times 10^2$ mL/gcm or less and a light absorption coefficient at 254 nm in methanol of $1.0 \times 10^3$ mL/gcm or more. Specific examples of use of combinations include use of a combination of an aminoacetophenone compound and an oxime compound. According to this aspect, it is possible to produce a film having excellent curability even under a low-temperature condition. For example, in the pattern forming step, by exposing the composition for forming a white layer in two steps before the developing step and after the developing step, the composition for forming a white layer can be suitably cured with the initial exposure, and approximately the entirety of the composition for forming a white layer can be cured by the next exposure. As a result, the curability of the composition for forming a white layer can be improved even under the low-temperature condition.

<<Coloring Inhibitor>>

The composition for forming a white layer preferably contains a coloring inhibitor. The coloring inhibitor described in the present specification can also be used as the antioxidant, and the antioxidant can also be used as the coloring inhibitor. Examples of the coloring inhibitor include a phenol compound, a phosphorous acid ester compound, and a thioether compound, and the coloring inhibitor is more preferably a phenol compound having a molecular weight of 500 or more, a phosphorous acid ester compound having a molecular weight of 500 or more, or a thioether compound having a molecular weight of 500 or more is more preferable. Further, the coloring inhibitor is preferably a phenol compound, and more preferably a phenol compound having a molecular weight of 500 or more.

As the phenol compound, any of phenol compounds known as the phenol-based coloring inhibitor can be used. Preferred examples of the phenol compound include a hindered phenol compound. Particularly, a compound having a substituent at a site (ortho-position) adjacent to the phenolic hydroxyl group is preferable. As the above-mentioned substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. Further, a compound having a phenol group and a phosphorous acid ester group in the same molecule is also preferable.

As the phenol-based hydroxyl group-containing compound, in particular, multi-substituted phenol compounds are preferably used.

The multi-substituted phenol-based compounds are mainly classified into three types having different substitution positions and structures, based on reactivity to peroxy radicals captured due to stable phenoxy radical generation, as follows: a hindered type of Formula (A), a semi-hindered type of Formula (B), and a less-hindered type of Formula (C).

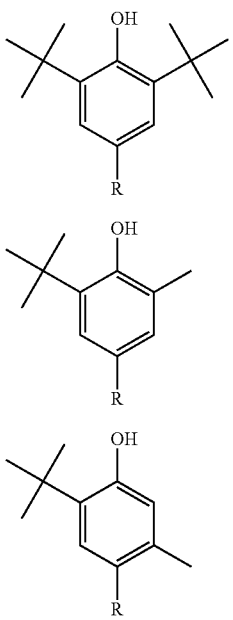

In Formulae (A) to (C), R is a hydrogen atom or a substituent. R is preferably a hydrogen atom, a halogen atom, an amino group which may have a substituent, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent, and more preferably the amino group which may have a substituent, the alkyl group which may have a substituent, the aryl group which may have a substituent, the alkoxy group which may have a substituent, the aryloxy group which may have a substituent, the alkylamino group which may have a substituent, or the arylamino group which may have a substituent.

In a more preferred aspect, the compound is a composite type coloring inhibitor in which a plurality of structures expressing a coloration-preventing function, represented by Formulae (A) to (C) are present, in the same molecule, and specifically, the compound preferably has 2 to 4 structures expressing a coloration-preventing function, represented by Formulae (A) to (C) in the same molecule. Among these, the semi-hindered type of Formula (B) is more preferable from the viewpoint of a coloring property.

Examples of the phenol-based hydroxyl group-containing compound include a compound selected from the group consisting of paramethoxyphenol, di-t-butyl-paracresol, pyrogallol, t-butylcatechol, 4,4-thiobis(3-methyl-6-t-butylphenol), 2,2'-methylenebis(4-methyl-6-t-butylphenol), phenol resins, and cresol resins.

As representative examples of the coloring inhibitor which is available as a commercially available product, examples of (A) include Sumilizer BHT (manufactured by Sumitomo Chemical Co., Ltd.), Irganox 1010 and 1222 (manufactured by BASF), and ADK STAB AO-20, AO-50, and AO-60 (manufactured by ADEKA Corporation). Examples of (B) include Sumilizer BBM-S (manufactured by Sumitomo Chemical Co., Ltd.), Irganox 245 (manufactured by BASF), ADK STAB AO-80 (manufactured by ADEKA Corporation). Examples of (C) include ADK STAB AO-30 and AO-40 (manufactured by ADEKA Corporation).

Examples of the phosphorous acid ester compound include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-ditert-butyl-6-methylphenyl) phosphite.

Representative examples of the phosphorous acid ester compound that can be available as a commercially available product include ADEKA STAB PEP-36A (manufactured by ADEKA Corporation).

As the thioether compound, for example, dialkylthiodipropionates such as dilauryl thiodipropionate, dimyristyl thiodipropionate, and distearyl thiodipropionate, and pentaerythritol tetra(β-propionic acid)esters; pentaerythritol tetrakis(3-laurylthiopropionate), dilauryl-3,3'-thiodipropionate, dimyristyl-3,3'-thiodipropionate, distearyl-3,3'-thiodipropionate, and the like; tetrakis[methylene-3-(laurylthio)propionate]methane, bis(methyl-4-[3-n-alkyl (C12/C14)thiopropionyloxy]5-t-butylphenyl)sulfide, ditridecyl-3,3'-thiodipropionate, dilauryl-3,3'-thiodipropionate, dimyristyl-3,3'-thiodipropionate, distearyl-3,3'-thiodipropionate, lauryl/stearyl thiodipropionate, 4,4'-thiobis(6-t-butyl-m-cresol), 2,2'-thiobis(6-t-butyl-p-cresol), and distearyl-disulfide are preferable.

Representative examples of the thioether compound that is available as a commercially available product include ADEKA STAB AO-412S (CAS: 29598-76-3, manufactured by ADEKA Corporation), ADEKA STAB AO-503 (CAS: 10595-72-9, manufactured by ADEKA Corporation), and KEMINOX PLS (CAS: 29598-76-3, manufactured by Chemipro Kasei Kaisha, Ltd.).

In addition to the above-mentioned representative example, other examples of a commercially available product of the coloring inhibitor include ADEKA STAB AO-50F, ADEKA STAB AO-60G, and ADEKA STAB AO-330 (ADEKA Corporation).

From the viewpoints of a coloring property and solvent resistance, the content of the coloring inhibitor is preferably 0.01% to 20% by mass, more preferably 0.1% to 15% by mass, and particularly preferably 0.3% to 5% by mass, with respect to the total solid content of the composition for forming a white layer. The coloring inhibitor may be of one kind or of two or more kinds. In a case where the coloring inhibitors are of two or more kinds thereof, the total amount thereof preferably falls within the range.

<<Ultraviolet Absorber>>

The composition for forming a white layer may contain an ultraviolet absorber. The ultraviolet absorber is preferably a conjugated diene-based compound, and more preferably a compound represented by Formula (I).

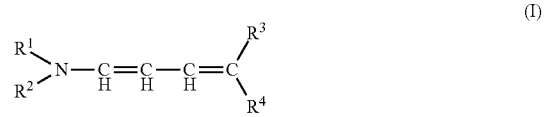

(I)

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the may be the same as or different from each other, but do not represent a hydrogen atom at the same time in any case.

With regard to the descriptions of the substituent of the ultraviolet absorber represented by Formula (I), reference can be made to paragraph Nos. 0024 to 0033 of WO2009/123109A (paragraph Nos. 0040 to 0059 of the corresponding US2011/0039195A), the contents of which are incorporated herein by reference. With regard to specific preferred examples of the compound represented by Formula (I), reference can be made to the exemplary compounds (1) to (14) in paragraph Nos. 0034 to 0037 of WO2009/123109A (paragraph No. 0060 of the corresponding US2011/0039195A), the contents of which are incorporated herein by reference. Specific examples of the ultraviolet absorber represented by Formula (I) include the following compound.

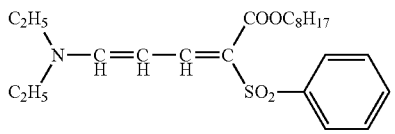

From the viewpoints of a pattern shape and solvent resistance, the content of the ultraviolet absorber is preferably 0.1% to 10% by mass, more preferably 0.1% to 7% by mass, particularly preferably 0.1% to 5% by mass, and still more preferably 0.1% to 3% by mass, with respect to the total solid content of the composition for forming a white layer. Further, in the present invention, the ultraviolet absorber may be of one kind or of two or more kinds thereof. In a case where the ultraviolet absorbers are used of two or more kinds thereof, the total amount thereof preferably falls within the range.

As the ultraviolet absorber, UVINUL A (manufactured by BASF) can also be used. Further, as the ultraviolet absorber, ultraviolet absorbers such as an aminodiene compound, a salicylate compound, a benzophenone compound, a benzotriazole compound, an acrylonitrile compound, and a triazine compound can be used, and specific examples thereof include the compounds described in JP2013-068814A. As the benzotriazole compound, MYUA series (manufactured by Miyoshi Oil&Fat Co., Ltd.; (The Chemical Daily (Kagaku Kogyo Nippo), Feb. 1, 2016) may be used.

<<Adhesive>>

The composition for forming a white layer preferably further contains an adhesive. The adhesive is not particularly limited, and known adhesives can be used. Examples of the adhesive include a silane coupling agent. According to this aspect, the adhesiveness of a film to a substrate can be improved.

In the present invention, the silane coupling agent means a silane compound having a hydrolyzable group and other functional groups. Further, the hydrolyzable group refers to a substituent which can be directly linked to a silicon atom to generate a siloxane bond by at least one of a hydrolysis reaction or a condensation reaction. Examples of the hydrolyzable group include a halogen atom, an alkoxy group, and an acyloxy group, with the alkoxy group being preferable. That is, the silane coupling agent is preferably a compound having an alkoxysilyl group. Further, a functional group other than the hydrolyzable group preferably has a group which interacts with a resin or forms a bond, and thus, exhibits affinity. Examples thereof include a (meth)acryloyl group, a phenyl group, a mercapto group, an epoxy group, and an oxetanyl group, with the (meth)acryloyl group and the epoxy group being preferable. That is, the silane coupling agent is preferably a compound having at least one of an alkoxysilyl group, a (meth)acryloyl group, or an epoxy group.

The number of carbon atoms of the alkoxy groups in the alkoxysilyl group is preferably 1 to 5, more preferably 1 to 3, and particularly preferably 1 or 2. The number of alkoxysilyl groups contained in the same molecule is preferably 2 or more, and more preferably 2 or 3.

Specific examples of the silane coupling agent include 3-methacryloxypropyltrimethoxysilane, 3-methacryloxypropyltriethoxysilane, 3-acryloxypropyltrimethoxysilane, 3-acryloxypropyltriethoxysilane, 3-mercaptopropyltrimethoxysilane, 3-aminopropyltriethoxysilane, phenyltrimethoxysilane, methyltrimethoxysilane, dimethyldimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, hexamethyldisilazane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, parastyryltrimethoxysilane, 3-methacryloxypropylmethyldimethoxysilane, 3-methacryloxypropylmethyldiethoxysilane, N-2-(aminomethylethyl)-3-aminopropylmethyldimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-triethoxysilyl-N-(1,3-dimethyl-butylidene)propylamine, N-phenyl-3-aminopropyltrimethoxysilane, a basic salt of N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, bis(triethoxysilylpropyl)tetrasulfide, and 3-isocyanatopropyltriethoxysilane. Incidentally, in addition to those, an alkoxy oligomer can be used. Further, the following compounds can also be used.

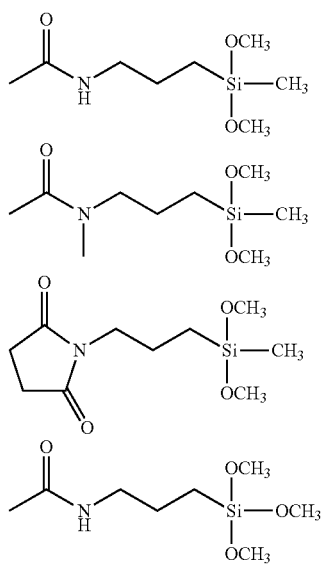

-continued

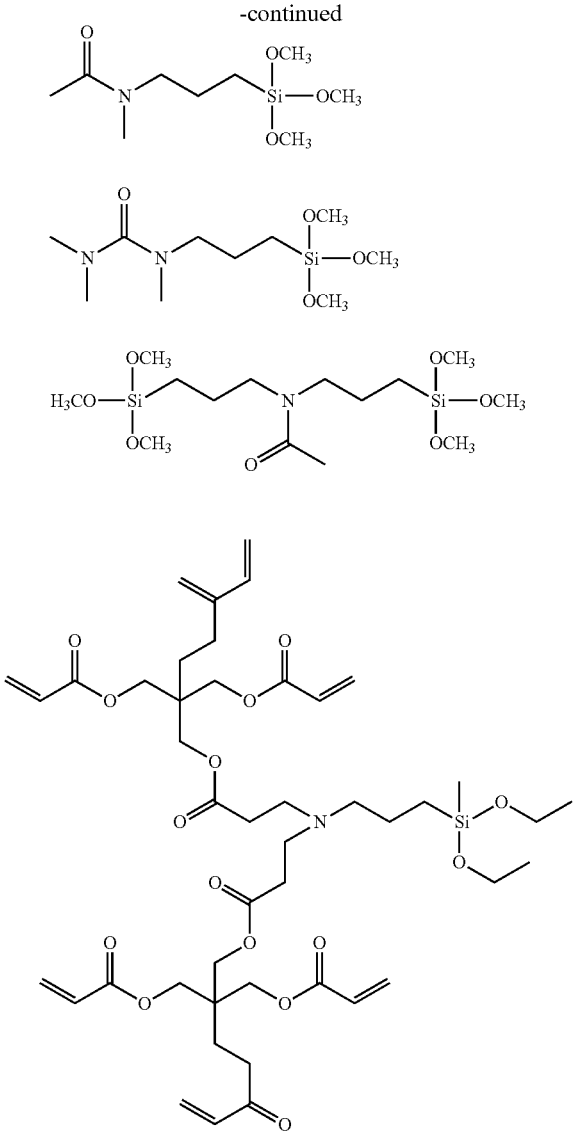

Examples of a commercially available product thereof include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059 A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238, manufactured by Shin-Etsu Chemical Co., Ltd. Further, examples of the silane coupling agent include the compounds described in paragraph Nos. 0018 to 0036 of JP2009-288703A, and the compounds described in paragraph Nos. 0056 to 0066 of JP2009-242604A, the contents of which are incorporated herein by reference.

As the silane coupling agent, the specific silane compounds described in paragraph Nos. 0011 to 0037 of JP2009-288703A can also be used by reference, the contents of which are incorporated herein by reference.

The content of the adhesive is preferably 0.01% to 10% by mass, more preferably 0.1% to 7% by mass, and particularly preferably 1% to 5% by mass, with respect to the total solid content of the composition for forming a white layer. The content within these ranges is preferable from the viewpoints of adhesiveness and defects. Further, in the present invention, the adhesive contained in the composition may be of one kind or of two or more kinds. In a case where the adhesives are of two or more kinds thereof, the total amount thereof preferably falls within the range.

<<Chain Transfer Agent>>

The composition for forming a white layer preferably contains a chain transfer agent. According to this aspect, it is possible to accelerate the curing of a film surface (pattern surface) by the exposure during pattern formation. Thus, reduction in the film thickness during the exposure, and the like can be suppressed, and a pattern having more excellent rectangularity and adhesiveness is easily formed.

Examples of the chain transfer agent include an alkyl N,N-dialkylaminobenzoate ester and a thiol compound, with the thiol compound being preferable. As the chain transfer agent, the thiol compound is preferably a compound having 2 or more (preferably 2 to 8, and more preferably 3 to 6) mercapto groups in the molecule thereof. Specific examples of the thiol compound include a heterocycle-containing thiol compound such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6(1H,3H,5H)-trione, and an aliphatic thiol compound such as pentaerythritoltetrakis(3-mercaptobutyrate) and 1,4-bis(3-mercaptobutyryloxy)butane. Furthermore, examples of the commercially available product of the chain transfer agent include PEMP (manufactured by SC Organic Chemical Co., Ltd., thiol compound), SANCELER M (manufactured by Sanshin Chemical Industry Co., Ltd., thiol compound), and KARENZ MT BD1 (manufactured by Showa Denko K. K., a thiol compound). Furthermore, the following compounds are also preferably used.

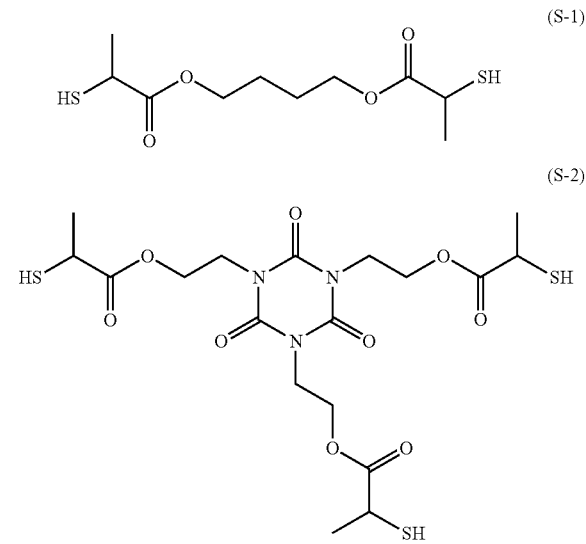

(S-3)

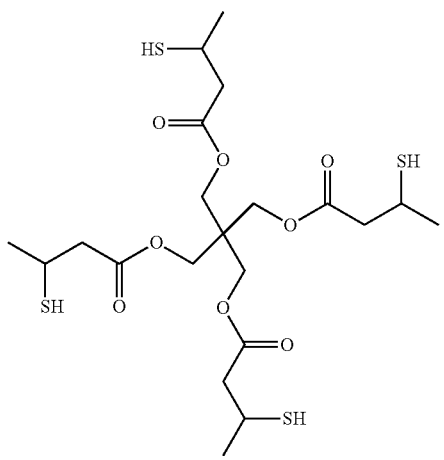

(S-4)

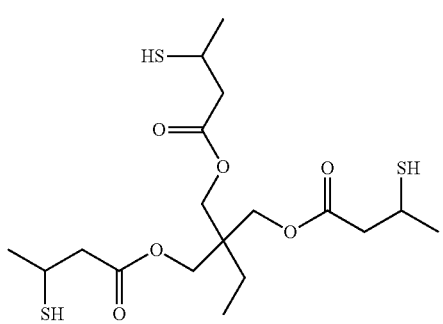

(S-5)

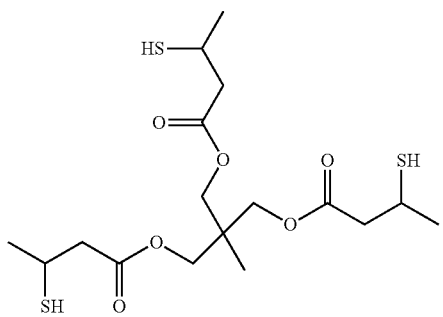

(S-6)

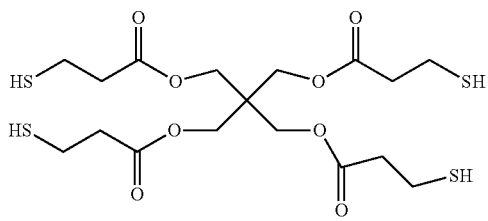

The content of the chain transfer agent is preferably 0.2% to 5.0% by mass, and more preferably 0.4% to 3.0% by mass, with respect to the total solid content of the composition for forming a white layer. Further, the content of the chain transfer agent is preferably 1 to 40 parts by mass, and more preferably 2 to 20 parts by mass, with respect to 100 parts by mass of the polymerizable compound. The chain transfer agent may be of one kind or of two or more kinds thereof. In a case where the chain transfer agents may be of one kind or of two or more kinds, the total amount thereof preferably falls within the range.

<<Sensitizer>>

The composition for forming a white layer may contain a sensitizer for the purposes of improving radical generation efficiency of the photopolymerization initiator, and shifting the sensitive wavelength to a longer wavelength. The sensitizer preferably sensitizes the photopolymerization initiator by the electron transfer mechanism or the energy transfer mechanism. Examples of the sensitizer include a compound having a maximum absorption wavelength in the wavelength range of 300 nm to 450 nm. Specifically, reference can be made to the descriptions in paragraph Nos. 0231 to 0253 of JP2010-106268A (paragraph Nos. 0256 to 0273 of the corresponding US2011/0124824A), the contents of which are incorporated herein by reference.

The content of the sensitizer is preferably 0.1% to 20% by mass, and more preferably 0.5% to 15% by mass, with respect to the total solid content of the composition for forming a white layer. The sensitizer may be of one kind or of two or more kinds thereof. In a case where the sensitizers are used in combination of two or more kinds thereof, the total amount thereof preferably falls within the range.

<<Co-Sensitizer>>

It is also preferable that the composition for forming a white layer further contains a co-sensitizer. The co-sensitizer has functions of further improving the sensitivity of a photopolymerization initiator or a sensitizer to active radiation, suppressing the polymerization inhibition of the polymerizable compound due to oxygen, and the like. With regard to the co-sensitizer, specifically, reference can be made to the descriptions in paragraph Nos. 0254 to 0257 of JP2010-106268A (paragraph Nos. 0277 to 0279 of the corresponding US2011/0124824A), the contents of which are incorporated herein by reference.

From the viewpoint of increasing the polymerization growth rate and the curing rate, the content of the co-sensitizer is preferably 0.1% to 30% by mass, more preferably 1% to 25% by mass, and still more preferably 1.5% to 20% by mass, with respect to the total solid content of the composition for forming a white layer. The co-sensitizer may be of one kind or of two or more kinds thereof. In a case where the co-sensitizers are used in combination of two or more kinds thereof, the total amount thereof preferably falls within the range.

<<Polymerization Inhibitor>>

It is preferable that a polymerization inhibitor is added to the composition for forming a white layer. Examples of the polymerization inhibitor include the following compounds:

a compound containing a phenol-based hydroxyl group (preferably a compound selected from the group consisting of hydroquinone, para-methoxyphenol, di-t-butyl-para-cresol, pyrogallol, t-butyl catechol, benzoquinone, 4,4-thiobis(3-methyl-6-t-butyl phenol), 2,2'-methylenebis(4-methyl-6-t-butyl phenol), 2,6-di-t-butyl-4-methylphenol (BHT), phenolic resins, and cresol resins);

N-oxide compounds (preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide);

piperidine 1-oxyl free radical compounds (preferably a compound selected from the group consisting of piperidine 1-oxyl free radicals, 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide-2,2,6,6-tetramethylpiperidine 1-oxyl free radicals, and 4-phosphonooxy-2,2,6,6-tetramethylpiperidine 1-oxyl free radicals);

pyrrolidine 1-oxyl free radical compounds (preferably 3-carboxy proxy free radicals (3-carboxy-2,2,5,5-tetramethylpyrrolidine 1-oxyl free radicals));

N-nitroso phenyl hydroxylamines (preferably a compound selected from the group consisting of an N-nitrosophenylhydroxylamine cerous salt and an N-nitrosophenylhydroxylamine aluminum salt);

diazonium compounds (preferably a compound selected from the group consisting of hydrogen sulfate of 4-diazophenyldimethylamine, tetrafluoroborate of 4-diazodiphenylamine, and hexafluorophosphate of 3-methoxy-4-diazodiphenylamine);

cationic dyes;

sulfide group-containing compounds;

nitro group-containing compounds; and transition metal compounds such as $FeCl_3$ and $CuCl_2$.

Furthermore, the polymerization inhibitor may be, among such the compounds, composite compounds in which a plurality of structures showing a polymerization inhibition function, such as a phenol skeleton and a phosphorus-containing skeleton, are present in the same molecule. For example, the compounds described in JP1998-046035A (JP-H10-046035A) and the like are also suitably used.

Specific examples of the polymerization inhibitor include the compounds described in paragraphs 0211 to 0223 of JP2015-034961A, the contents of which are incorporated herein by reference.

Furthermore, the content of the polymerization inhibitor is preferably 0.01% to 10% by mass, more preferably 0.01% to 8% by mass, and most preferably 0.01% to 5% by mass, with respect to the total solid content of the composition for forming a white layer. Further, the content of the polymerization inhibitor is preferably 0.01 parts by mass to 10 parts by mass, more preferably 0.01 to 8 parts by mass, and most preferably 0.01 to 5 parts by mass, with respect to 100 parts by mass of the photopolymerization initiator. By setting the content within the range, suppression of a curing reaction in a non-image area and acceleration of a curing reaction in an image area are sufficiently performed, and thus, the pattern shape and the sensitivity are improved. The polymerization inhibitor may be of one kind or of two or more kinds thereof. In a case where the polymerization inhibitors are of two or more kinds thereof, the total amount thereof preferably falls within the range.

<<Surfactant>>

From the viewpoint of further improving coatability, various surfactants may be incorporated into the composition for forming a white layer. As the surfactant, various surfactants such as a fluorine-based surfactant, a nonionic surfactant, a cationic surfactant, an anionic surfactant, and a silicon-based surfactant can be used.

By incorporating a fluorine-based surfactant into the composition for forming a white layer, liquid characteristics (in particular, fluidity) in a case of preparation of a coating liquid using the composition are further improved, and thus, the evenness of coating thickness or a liquid saving property can be further improved. That is, in a case where a film is formed using a coating liquid to which a composition containing a fluorine-based surfactant has been applied, the interface tension between a surface to be coated and the coating liquid is reduced to improve wettability with respect to the surface to be coated, and enhance coatability with respect to the surface to be coated. Thus, a film with an even thickness which exhibits a small extent of thickness unevenness can be more suitably formed.

The fluorine content in the fluorine-based surfactant is preferably 3% to 40% by mass, more preferably 5% to 30% by mass, and particularly preferably 7% to 25% by mass. The fluorine-based surfactant having a fluorine content which falls within the above-mentioned range is effective in terms of the thickness evenness of the coating film and the liquid saving property, and the solubility in the composition is also good.

Specific examples of the fluorine-based surfactant include the surfactants described in paragraph Nos. 0060 to 0064 of JP2014-041318A (paragraph Nos. 0060 to 0064 of the pamphlet of the corresponding WO2014/017669A) and the like, and the surfactants described in paragraph Nos. 0117 to 0132 of JP2011-132503A, and the contents of the publications are incorporated herein by reference. Examples of a commercially available product of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (all manufactured by ASAHI GLASS Co., Ltd.), and PolyFox PF636, PF656, PF6320, PF6520, and PF7002 (manufactured by OMNOVA Solutions Inc.).

In addition, as the fluorine-based surfactant, an acrylic compound which is a molecular structure having a functional group containing a fluorine atom, in which upon application of heat thereonto, the functional group is cut and the fluorine atom is volatilized, can also be suitably used. Examples of such a fluorine-based surfactant include MEGAFACE DS series (manufactured by DIC Corporation, The Chemical Daily (Kagaku Kogyo Nippo), Feb. 22, 2016) (Nikkei Business Daily, Feb. 23, 2016), for example, MEGAFACE DS-21, which can be used.

As the fluorine-based surfactant, a block polymer can also be used. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also preferably used. The following compounds are also exemplified as a fluorine-based surfactant for use in the present invention.

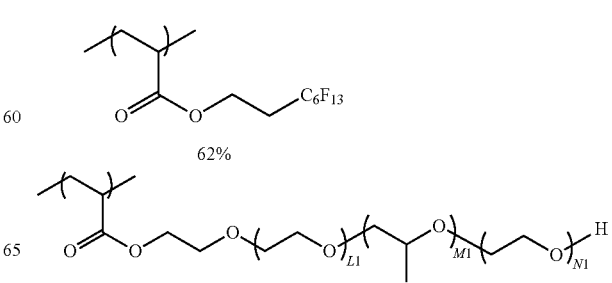

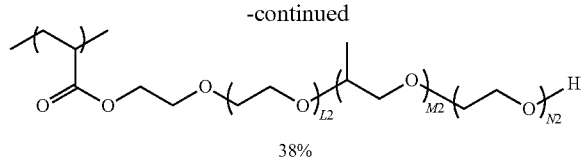

38%

L1 + N1 + L2 + N2 = 14
M1 + M2 = 17

The weight-average molecular weight of the compounds is preferably 3,000 to 50,000, and is, for example, 14,000. % expressing the proportions of repeating units is % by mass.

Furthermore, for the fluorine-based surfactant, a fluorine-containing polymer having an ethylenically unsaturated bond-containing group in a side chain can also be used. Specific examples thereof include the compounds described in paragraph Nos. 0050 to 0090 and paragraph Nos. 0289 to 0295 of JP2010-164965A, such as MEGAFACE RS-101, RS-102, RS-718K, and RS-72-K, all manufactured by DIC Corporation. For the fluorine-based surfactant, the compounds described in paragraph Nos. 0015 to 0158 of JP2015-117327A can also be used.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF Corporation), TETRONIC 304, 701, 704, 901, 904, and 150R1 (manufactured by BASF Corporation), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), OLFINE E1010, and SURFYNOL 104, 400, and 440 (manufactured by Nissin Chemical Co., Ltd.).

Examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and SANDET BL (manufactured by Sanyo Kasei Co., Ltd.).

Examples of the silicon-based surfactant include SILICONE DC3PA, SILICONE SH7PA, SILICONE DC11PA, SILICONE SH21PA, SILICONE SH28PA, SILICONE SH29PA, SILICONE SH30PA, and SILICONE SH8400 (all manufactured by Toray Dow Corning Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The surfactant may be used singly or in combination of two or more kinds thereof. The content of the surfactant is preferably 0.001% by mass to 2.0% by mass, and more preferably 0.005% to 1.0% by mass, with respect to the total solid content of the composition for forming a white layer.

<<Other Additives>>

The composition for forming a white layer may contain known additives such as a plasticizer and a sensitizer. Examples of the plasticizer include dioctyl phthalate, didodecyl phthalate, triethylene glycol dicaprylate, dimethyl glycol phthalate, tricresyl phosphate, dioctyl adipate, dibutyl sebacate, and tryacetyl glycerin. The content of the plasticizer is preferably 10% by mass or less with respect to the total mass of the polymerizable compound and the resin.

<Method for Preparing Composition for Forming White Layer>

The composition for forming a white layer can be prepared by mixing the above-mentioned components.

In the preparation of the composition for forming a white layer, the respective components may be mixed with each other collectively or may be mixed with each other sequentially after at least one of being dissolved or being dispersed in a solvent. In addition, the order of addition or working conditions during blending is not particularly limited.

Furthermore, in the preparation of the composition for forming a white layer, a process for dispersing particles such as a white pigment is preferably included. In the process for dispersing the particles, examples of a mechanical force for the dispersion of the particles include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the particles in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing particles, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the particles, a refining treatment of particles in a salt milling process may be performed. With regard to the materials, the equipment, the process conditions, and the like used in the salt milling process, reference can be made to, for example, the descriptions in JP2015-194521A and JP2012-046629A.

It is preferable that in the preparation of the composition for forming a white layer, filtration is performed using a filter for the purpose of removing foreign matters, reducing defects, or the like. As the filter, any filters that have been used in the related art for filtration use and the like may be used without particular limitation. Examples of the filter include filters using materials including, for example, a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 μm, preferably approximately 0.01 to 3.0 m, and more preferably approximately 0.05 to 0.5 μm. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters (for example, a first filter and a second filter) may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NIEY and the like), Advantec Toyo Kaisha, Ltd., Nihon Entegris K. K. (formerly Nippon Microlith Co., Ltd.), Kitz Micro Filter Corporation, or the like, for example.

As the second filter, a filter formed of the same material as that of the first filter, or the like may be used.

For example, the filtration through the first filter may be carried out with only a dispersion liquid, the other components may be mixed, and then the filtration through the second filter may be carried out.

<Composition for Forming Infrared-Shielding Layer>

Next, the composition for forming an infrared-shielding layer will be described.

The composition for forming an infrared-shielding layer contains an infrared absorber. Examples of the infrared absorber include a compound having a maximum absorption wavelength in the range of 700 to 1,500 nm. The infrared absorber is preferably a compound having a maximum absorption wavelength in the range of 800 to 1,500 nm, more preferably a compound having a maximum absorption wavelength in the range of 800 to 1,300 nm, and still more preferably a compound having a maximum absorption wavelength in the range of 800 to 1,200 nm. Further, the infrared absorber is preferably at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex, more preferably the tungsten oxide containing an alkali metal, the pyrrolopyrrole compound, or the copper complex, and still more preferably the tungsten oxide containing an alkali metal. According to this aspect, a laminate having excellent light resistance or heat resistance can be obtained. With regard to the details of the infrared absorber, reference can be made to the above-mentioned materials, and a preferred range thereof is also the same.

The content of the infrared absorber can be appropriately adjusted depending on the types of the infrared absorber. For example, the content is preferably 10% to 50% by mass, and more preferably 20% to 40% by mass, with respect to the total solid content of the composition for forming an infrared-shielding layer. Further, for example, in a case of the tungsten oxide containing an alkali metal, the content is preferably 10% to 50% by mass, and more preferably 20% to 40% by mass, with respect to the total solid content of the composition for forming an infrared-shielding layer. Incidentally, in a case of an organic colorant such as a pyrrolopyrrole compound, a cyanine compound, a phthalocyanine compound, a tetraazaporphyrin compound, a diimmonium compound, and a squarylium compound, the content is preferably 10% to 50% by mass, and more preferably 20% to 40% by mass, with respect to the total solid content of the composition for forming an infrared-shielding layer. In addition, in a case of the copper complex, the content is preferably 10% to 50% by mass, and more preferably 20% to 40% by mass, with respect to the total solid content of the composition for forming an infrared-shielding layer.

The composition for forming an infrared-shielding layer may further include additives such as a resin (a binder, an alkali-soluble resin, a dispersant, and the like), a curable compound (a radically polymerizable compound, a compound having an epoxy group, and the like), a polymerization initiator, a solvent, a surfactant, a polymerization inhibitor, an ultraviolet absorber, a coloring inhibitor, an adhesive, a chain transfer agent, a sensitizer, and a co-sensitizer. With regard to the details thereof, reference can be made to the descriptions of the composition for forming a white layer, and a preferred range thereof is also the same.

In a case where the composition for forming an infrared-shielding layer contains a resin, the content of the resin is preferably 5% to 90% by mass, and more preferably 10% to 60% by mass, with respect to the total solid content of the composition for forming an infrared-shielding layer.

In a case where the composition for forming an infrared-shielding layer contains a curable compound, the content of the curable compound is preferably 1% to 70% by mass, with respect to the total solid content of the composition for forming an infrared-shielding layer. The lower limit is preferably 3% by mass or more, and more preferably 5% by mass or more. The upper limit is preferably 60% by mass or less, and more preferably 50% by mass or less. Further, in a case where a polymerizable compound is used as the curable compound, the content of the polymerizable compound is preferably 1% to 70% by mass with respect to the total solid content of the composition for forming an infrared-shielding layer. The lower limit is preferably 3% by mass or more, and more preferably 5% by mass or more. The upper limit is preferably 60% by mass or less, and more preferably 50% by mass or less. In addition, the content of the polymerizable compound is preferably 10% to 100% by mass, and more preferably 30% to 100% by mass, with respect to the total mass of the curable compound.

In a case where the composition for forming an infrared-shielding layer contains a polymerization initiator, the content of the polymerization initiator is preferably 0.1% to 50% by mass, more preferably 0.5% to 30% by mass, and still more preferably 1% to 20% by mass, with respect to the total solid content of the composition for forming an infrared-shielding layer.

In a case where the composition for forming an infrared-shielding layer contains a solvent, the content of the solvent is preferably such an amount that the concentration of the solid content of the composition for forming an infrared-shielding layer becomes 25% to 70% by mass, and more preferably such an amount that the concentration of the solid content of the composition for forming an infrared-shielding layer becomes 30% to 60% by mass.

In a case where the composition for forming an infrared-shielding layer contains a surfactant, the content of the surfactant is preferably 0.001% to 2.0% by mass, and more preferably 0.005% to 1.0% by mass, with respect to the total solid content of the composition for forming an infrared-shielding layer.

In a case where the composition for forming an infrared-shielding layer contains a polymerization inhibitor, the content of the polymerization inhibitor is preferably 0.01% to 10% by mass, more preferably 0.01% to 8% by mass, and most preferably 0.01% to 5% by mass, with respect to the total solid content of the composition for forming an infrared-shielding layer.

In a case where the composition for forming an infrared-shielding layer contains a co-sensitizer, the content of the co-sensitizer is preferably 0.1% to 30% by mass, more preferably 1% to 25% by mass, and still more preferably 1.5% to 20% by mass, with respect to the total solid content of the composition for forming an infrared-shielding layer.

In a case where the composition for forming an infrared-shielding layer contains a sensitizer, the content of the sensitizer is preferably 0.1% to 20% by mass, and more preferably 0.5% to 15% by mass, with respect to the total solid content of the composition for forming an infrared-shielding layer.

In a case where the composition for forming an infrared-shielding layer contains a chain transfer agent, the content of the chain transfer agent is preferably 0.2% to 5.0% by mass, and more preferably 0.4% to 3.0% by mass, with respect to the total solid content of the composition for forming an infrared-shielding layer.

In a case where the composition for forming an infrared-shielding layer contains an adhesive, the content of the adhesive is preferably 0.01% to 10% by mass, more preferably 0.1% to 7% by mass, and particularly preferably 1% to 5% by mass, with respect to the total solid content of the composition for forming an infrared-shielding layer.

In a case where the composition for forming an infrared-shielding layer contains an ultraviolet absorber, the content of the ultraviolet absorber is preferably 0.1% to 10% by mass, more preferably 0.1% to 7% by mass, still more preferably 0.1% to 5% by mass, and particularly preferably 0.1% to 3% by mass, with respect to the total solid content of the composition for forming an infrared-shielding layer.

In a case where the composition for forming an infrared-shielding layer contains a coloring inhibitor, the content of the coloring inhibitor is preferably 0.01% to 20% by mass, more preferably 0.1% to 15% by mass, and still more preferably 0.3% to 5% by mass, with respect to the total solid content of the composition for forming an infrared-shielding layer.

The components may be used singly or in combination of two or more kinds thereof. In a case where the components are used in combination of two or more kinds thereof, the total amount of the two kinds preferably falls within the range.

The composition for forming an infrared-shielding layer can be prepared by the same method as the method described for the above-mentioned composition for forming a white layer.

<Composition for Forming High-Refractive-Index Layer and Composition for Forming Low-Refractive-Index Layer>

Next, the composition for forming a high-refractive-index layer and the composition for forming a low-refractive-index layer will be described. As described above, the composition for forming a high-refractive-index layer and the composition for forming a low-refractive-index layer can be alternately applied onto a support or the like, and dried to form a dielectric multilayer film.

(Composition for Forming High-Refractive-Index Layer)

It is preferable that the composition for forming a high-refractive-index layer has a high refractive index, and includes inorganic colorless, white or transparent particles. Examples of the particles include titanium (Ti) oxide particles, zirconium (Zr) oxide particles, aluminum (Al) oxide particles, silicon (Si) oxide particles, zinc (Zn) oxide particles, or magnesium (Mg) oxide particles, and the particles are preferably titanium dioxide ($TiO_2$) particles or zirconium dioxide ($ZrO_2$) particles, and more preferably titanium dioxide particles. The primary particle diameter of the inorganic particles is preferably 1 to 100 nm, more preferably 1 to 80 nm, and still more preferably 1 to 50 nm. As an index for the primary particle diameter, an average particle diameter can also be used. The average particle diameter of the inorganic particles can be measured by diluting a mixed liquid or dispersion liquid including metal oxide particles to 80 times with propylene glycol monomethyl ether acetate and measuring the obtained diluent by a dynamic light scattering method. With respect to the metal oxide particles, reference can be made to the descriptions in paragraph Nos. 0023 to 0027 of JP2014-062221A, the contents of which are incorporated herein by reference.

The content of the inorganic particles in the composition for forming a high-refractive-index layer is preferably 10% by mass or more, more preferably 25% by mass or more, and still more preferably 40% by mass or more. The upper limit is not particularly limited, but is preferably 90% by mass or less, and more preferably 80% by mass or less.

The composition for forming a high-refractive-index layer may further include additives such as a resin (a binder, an alkali-soluble resin, a dispersant, and the like), a curable compound (a radically polymerizable compound, a compound having an epoxy group, and the like), a polymerization initiator, a solvent, a surfactant, a polymerization inhibitor, an ultraviolet absorber, a coloring inhibitor, an adhesive, a chain transfer agent, a sensitizer, and a co-sensitizer. With regard to the details thereof, reference can be made to the descriptions of the composition for forming a white layer, and a preferred range thereof is also the same.

(Composition for Forming Low-Refractive-Index Layer)

The composition for forming a low-refractive-index layer preferably includes silica particles. As the silica particles, colloidal silica particles are preferable. With regard to the details of the colloidal silica particles, reference can be made to the descriptions in JP2015-166449A, the contents of which are incorporated herein by reference.

The content of the silica particles in the composition for forming a low-refractive-index layer is preferably 10% by mass or more, more preferably 15% by mass or more, and still more preferably 20% by mass or more. The upper limit is not particularly limited, but is preferably 40% by mass or less, and more preferably 30% by mass or less.

The composition for forming a low-refractive-index layer may further include additives such as a resin (a binder, an alkali-soluble resin, a dispersant, and the like), a curable compound (a radically polymerizable compound, a compound having an epoxy group, and the like), a polymerization initiator, a solvent, a surfactant, a polymerization inhibitor, an ultraviolet absorber, a coloring inhibitor, an adhesive, a chain transfer agent, a sensitizer, and a co-sensitizer. With regard to the details thereof, reference can be made to the descriptions of the composition for forming a white layer, and a preferred range thereof is also the same.

<Kit>

Next, the kit of an embodiment of the present invention will be described. The kit of the embodiment of the present invention is a kit for forming a laminate, having an infrared-shielding layer and a white layer, which has a composition for forming an infrared-shielding layer containing a compound having a maximum absorption wavelength in a wavelength range at 800 to 1,500 nm, and a composition for forming a white layer, including a white pigment and having a value of L* of 35 to 75 in a L*a*b* color coordinate system of CIE 1976 in a case of forming a film with a thickness of 3 µm. With regard to the details of the composition for forming an infrared-shielding layer and the composition for forming a white layer, mention may be made of the contents described above for the composition for forming an infrared-shielding layer and the composition for forming a white layer, and preferred ranges thereof are also the same. The kit of the embodiment of the present invention is preferably the above-mentioned kit for forming a laminate of the embodiment of the present invention.

<Optical Sensor>

The optical sensor of an embodiment of the present invention has the laminate of the embodiment of the present invention. Examples of the optical sensor include a solid-state imaging device.

EXAMPLES

Hereinbelow, the present invention will be specifically described with reference to Examples, but the present invention is not limited to these Examples. In addition, "parts" and "%" are on a mass basis unless otherwise specified.

<Measurement of Weight-Average Molecular Weight (Mw)>

The weight-average molecular weight (Mw) of a resin was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 µL (sample concentration: 0.1% by mass)

Device name: HLC-8220GPC manufactured by Tosoh Corporation

Detector: Refractive index (RI) detector

Calibration curve base resin: Polystyrene

<Method for Measuring Acid Value>

The acid value is a representation of the mass of potassium hydroxide required to neutralize acidic components per gram of the solid content. A measurement sample was dissolved in a mixed solvent of tetrahydrofuran/water=9/1 (mass ratio), and the obtained solution was titration by neutralization with a 0.1-mol/L aqueous sodium hydroxide solution, using a potentiometric titrator (trade name: AT-510, manufactured by Kyoto Denshi K. K.) at 25° C. By using the inflection point in a titration pH curve as a titration end point, an acid value was calculated by the following equation.

$$A=56.11 \times Vs \times 0.5 \times f/w$$

A: Acid value (mgKOH/g)

Vs: Used amount (mL) of a 0.1-mol/L aqueous sodium hydroxide solution required for titration f: Titer of a 0.1-mol/L aqueous sodium hydroxide solution w: Mass (g) (in terms of a solid content) of a measurement sample <Method for Measuring Amine Value>

The amine value is a representation of the mass of potassium hydroxide (KOH) equivalent to the basic components per gram of the solid content. A measurement sample was dissolved in a mixed solvent of acetic acid, and the obtained solution was titration by neutralization with a 0.1-mol/L perchloric acid/acetic acid solution, using a potentiometric titrator (trade name: AT-510, manufactured by Kyoto Denshi K. K.) at 25° C. By using the inflection point in a titration pH curve as a titration end point, an amine value was calculated by the following equation.

$$B=56.11 \times Vs \times 0.1 \times f/w$$

B: Amine Value (mgKOH/g)

Vs: Used amount (mL) of a 0.1-mol/L perchloric acid/acetic acid solution required for titration f: Titer of a 0.1-mol/L perchloric acid/acetic acid solution w: Mass (g) (in terms of a solid content) of a measurement sample <Measurement of Average Particle Diameter of White Pigment>

The average primary particle diameter of the white pigment was determined by observing the white pigment with a transmission electron microscope (TEM), and measuring a portion in which the particles of the white pigment were not aggregated (primary particles). Specifically, a transmission electron microscopic image of the primary particles of the white pigment was taken using a transmission electron microscope, and then an image treatment was performed with an image treatment device to measure the particle size distribution of the white pigment. As the average primary particle diameter of the white pigment, the arithmetic mean diameter on the basis of the number calculated from the particle size distribution was taken as an average primary particle diameter. An electron microscope (H-7000) manufactured by Hitachi High-Technologies Corporation was used as the transmission electron microscope, and LUZEX AP manufactured by NIRECO Corporation was used as the image treatment device.

<Measurement of Refractive Index of White Pigment>

Firstly, dispersion was performed using a white pigment and a resin (dispersant) with a known refractive index, and propylene glycol monomethyl ether acetate (PGMEA). Thereafter, the prepared dispersion liquid and a resin having a known refractive index were mixed to prepare coating liquids having concentrations of the white pigment in the total solid content of the coating liquid of 10% by mass, 20% by mass, 30% by mass, and 40% by mass, respectively. After these coating liquids were used on a silicon wafer to form a film in 300 nm, and then the refractive index of the obtained film was measured using ellipsometry (Lambda Ace RE-3300 (trade name), Dainippon Screen Mfg. Co., Ltd.). Thereafter, by plotting the concentration of the white pigment and the refractive index on a graph, and performing extrapolation, the refractive index of the white pigment was derived.

<Production of Dispersion Liquid>

A mixed solution with the composition described in the following table was subjected to the following dispersion treatment, using Ultra Apex Mill manufactured by Kotobuki Industries Co., Ltd. as a circulation-type dispersing device (beads mill), thereby obtaining a dispersion liquid. After initiating the dispersion, the average particle diameter of the particles was measured every 30 minutes. The average particle diameter of the particles decreased over the dispersion time, but a change amount thereof gradually decreased. At a point of time that the change amount d50 (integrated value 50%) in the particle size distribution has disappeared, dispersion was finished.

Bead diameter: Diameter of 0.2 mm

Bead filling ratio: 65% by volume

Circumferential speed: 6 m/sec

Pump supply amount: 10.8 kg/hour

Cooling water: Tap water

Inner volume of beads mill annular passage: 0.15 L

Amount of mixed liquid to be subjected to dispersion treatment: 0.65 kg

TABLE 1

| | White pigment | | Dispersant | | Solvent | |
|---|---|---|---|---|---|---|
| | Type | Addition amount (parts by mass) | Type | Addition amount (parts by mass) | Type | Addition amount (parts by mass) |
| Dispersion liquid 1 | A-1 | 38.5 | H-1 | 11.5 | PGMEA | 50 |
| Dispersion liquid 2 | A-2 | 38.5 | H-1 | 11.5 | PGMEA | 50 |
| Dispersion liquid 3 | A-3 | 38.5 | H-1 | 11.5 | PGMEA | 50 |
| Dispersion liquid 4 | A-4 | 38.5 | H-1 | 11.5 | PGMEA | 50 |
| Dispersion liquid 5 | A-5 | 38.5 | H-1 | 11.5 | PGMEA | 50 |
| Dispersion liquid 12 | A-12 | 38.5 | H-1 | 11.5 | PGMEA | 50 |
| Dispersion liquid 13 | A-13 | 38.5 | H-1 | 11.5 | PGMEA | 50 |
| Dispersion liquid 14 | A-14 | 38.5 | H-1 | 11.5 | PGMEA | 50 |
| Dispersion liquid 19 | A-4 | 31.3 | H-1 | 18.8 | PGMEA | 50.0 |
| Dispersion liquid 20 | A-4 | 45.5 | H-1 | 4.5 | PGMEA | 50.0 |
| Dispersion liquid 21 | A-4 | 38.5 | H-2 | 11.5 | PGMEA | 50 |
| Dispersion liquid 22 | A-4 | 38.5 | H-3 | 11.5 | PGMEA | 50 |
| Dispersion liquid 23 | A-4 | 38.5 | H-4 | 11.5 | PGMEA | 50 |
| Dispersion liquid 25 | A-20 | 38.5 | H-1 | 11.5 | PGMEA | 50 |
| Dispersion liquid 26 | A-21 | 38.5 | H-1 | 11.5 | PGMEA | 50 |
| Dispersion liquid 27 | A-22 | 38.5 | H-1 | 11.5 | PGMEA | 50 |
| Dispersion liquid 28 | A-23 | 38.5 | H-1 | 11.5 | PGMEA | 50 |
| Dispersion liquid 29 | A-24 | 38.5 | H-1 | 11.5 | PGMEA | 50 |
| Dispersion liquid 30 | A-25 | 38.5 | H-1 | 11.5 | PGMEA | 50 |
| Dispersion liquid 31 | A-26 | 38.5 | H-1 | 11.5 | PGMEA | 50 |
| Dispersion liquid 32 | A-27 | 38.5 | H-1 | 11.5 | PGMEA | 50 |
| Dispersion liquid 33 | A-4 | 38.5 | H-1/H-5 | 9/2.5 | PGMEA cyclohexanone | 35 15 |
| Dispersion liquid 34 | A-4 | 38.5 | H-1/H-6 | 9/2.5 | PGMEA BDGAC | 35 15 |

(White Pigment)

As the white pigment, the following white pigment was used.

TABLE 2

| | Particles | Material | Surface treating agent | Manufacturer | Average primary particle diameter | Density (g/cm$^3$) | Refractive index |
|---|---|---|---|---|---|---|---|
| A-1 | TTO-80A | Titanium oxide | Aluminum hydroxide | Manufactured by Ishihara Sangyo Kaisha, Ltd. | 60 nm | 4.1 | 2.7 |
| A-2 | PT-401M | Titanium oxide | None | Manufactured by Ishihara Sangyo Kaisha, Ltd. | 70 nm | 4.1 | 2.7 |
| A-3 | MPT-140 | Titanium oxide | Aluminum hydroxide | Manufactured by Ishihara Sangyo Kaisha, Ltd. | 74 nm | 4.1 | 2.7 |
| A-4 | MPT-141 | Titanium oxide | Aluminum hydroxide | Manufactured by Ishihara Sangyo Kaisha, Ltd. | 91 nm | 4.1 | 2.7 |
| A-5 | PT-401L | Titanium oxide | None | Manufactured by Ishihara Sangyo Kaisha, Ltd. | 130 nm | 4.1 | 2.7 |

TABLE 2-continued

| | Particles | Material | Surface treating agent | Manufacturer | Average primary particle diameter | Density (g/cm³) | Refractive index |
|---|---|---|---|---|---|---|---|
| A-12 | MT-700B | Titanium oxide | None | Manufactured by Teika Co. | 80 nm | 4.1 | 2.7 |
| A-13 | MT-700Z | Titanium oxide | Aluminum hydroxide, stearic acid | Manufactured by Teika Co. | 80 nm | 4.1 | 2.7 |
| A-14 | MT-700BS | Titanium oxide | Hydrogen dimethicone | Manufactured by Teika Co. | 80 nm | 4.1 | 2.7 |
| A-20 | A-220 | Titanium oxide | Aluminum hydroxide | Manufactured by Ishihara Sangyo Kaisha, Ltd. | 160 nm | 4.1 | 2.7 |
| A-21 | PT-501R | Titanium oxide | None | Manufactured by Ishihara Sangyo Kaisha, Ltd. | 180 nm | 4.1 | 2.7 |
| A-22 | R-21 | Titanium oxide | Aluminum oxide, silica | Manufactured by Sakai Chemical Industry Co., Ltd. | 200 nm | 4.1 | 2.7 |
| A-23 | R-62N | Titanium oxide | Aluminum oxide, silica | Manufactured by Sakai Chemical Industry Co., Ltd. | 260 nm | 4.1 | 2.7 |
| A-24 | R-45M | Titanium oxide | Aluminum oxide, silica | Manufactured by Sakai Chemical Industry Co., Ltd. | 290 nm | 4.1 | 2.7 |
| A-25 | SW-100 | Strontium titanate | None | Manufactured by Titanium Kogyo K.K. | 80 nm | 4.8 | 2.4 |
| A-26 | Zincox Super F-1 | Zinc oxide | None | Manufactured by Hakusui Tech Co., Ltd. | 100 nm | 5.6 | 2.0 |
| A-27 | TTO-55(C) | Titanium oxide | Aluminum hydroxide, stearic acid | Manufactured by Ishihara Sangyo Kaisha, Ltd. | 40 nm | 4.1 | 2.7 |

(Dispersant)

H-1: Solsperse 36000, manufactured by The Lubrizol Corporation

H-2: Solsperse 41000, manufactured by The Lubrizol Corporation

H-3: Resin having the following structure (acid value=51.7 mgKOH/g and Mw=13,000). The numerical values shown together with the respective repeating units represent the contents [mass ratios] of the respective repeating units. The numerical values shown together with the repeating sites of the side chain represent the repetition numbers of the repeating sites.

H-4: Resin having the following structure (acid value=32 mgKOH/g, amine value=45 mgKOH/g, and Mw=15,000). The numerical values shown together with the respective repeating units represent the contents [mass ratios] of the respective repeating units. The numerical values shown together with the repeating sites of the side chain represent the repetition numbers of the repeating sites. The wavy line bond represents a cis/trans mixture.

H-5: LIGHT ESTER P-1M, manufactured by Kyoei-Sha Chemical Co., Ltd.

H-6: LIGHT ESTER P-2M, manufactured by Kyoei-Sha Chemical Co., Ltd.

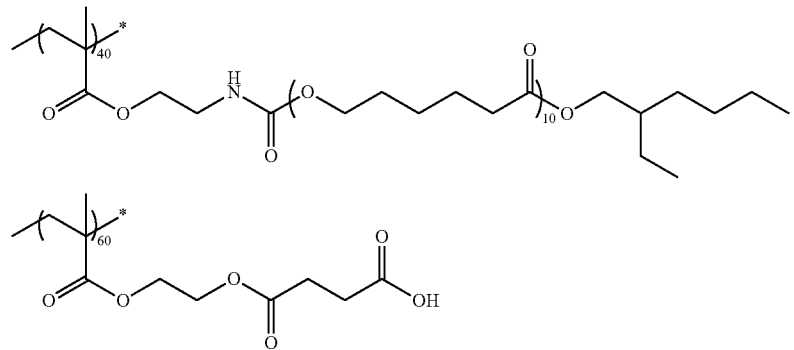

(H-3)

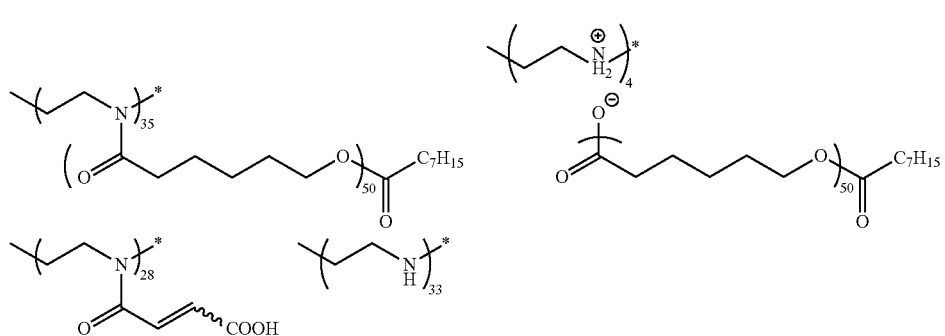

(H-4)

(Solvent)
PGMEA: Propylene glycol monomethyl ether acetate
BDGAC: Butyl diglycol acetate <Preparation of Composition for Forming White Layer>
The raw materials described in the following table were mixed to prepare a composition for forming a white layer.

TABLE 3

| | Dispersion liquid | | Content (% by mass with respect to total solid content) of white pigment | Alkali-soluble resin | | Polymerizable compound | | Photopolymerization initiator | | Solvent | |
|---|---|---|---|---|---|---|---|---|---|---|---|
| | Type | Parts by mass | | Type | Parts by mass | Type | Parts by mass | Type | Parts by mass | Type | Parts by mass |
| Composition 1-1 | Dispersion liquid 4 | 52 | 43.1 | C-1 | 8.4 | D-1 | 9.3 | E-1 | 2.8 | PGMEA | 27.5 |
| Composition 1-2 | Dispersion liquid 4 | 52 | 42.8 | C-1 | 8.4 | D-1 | 9.3 | E-1 | 2.8 | PGMEA | 27.2 |
| Composition 1-3 | Dispersion liquid 4 | 52 | 42.8 | C-1 | 8.4 | D-1 | 9.3 | E-1 | 2.8 | PGMEA | 27.2 |
| Composition 1-4 | Dispersion liquid 4 | 52 | 42.8 | C-1 | 8.4 | D-1 | 9.3 | E-1 | 2.8 | PGMEA | 27.2 |
| Composition 1-5 | Dispersion liquid 4 | 52 | 42.8 | C-1 | 8.4 | D-1 | 9.3 | E-1 | 2.8 | PGMEA | 27.2 |
| Composition 1-6 | Dispersion liquid 4 | 52 | 40.9 | C-1 | 8.4 | D-1 | 9.3 | E-1 | 2.8 | PGMEA | 25.0 |
| Composition 1-7 | Dispersion liquid 4 | 52 | 40.9 | C-1 | 8.4 | D-1 | 9.3 | E-1 | 2.8 | PGMEA | 25.0 |
| Composition 1-8 | Dispersion liquid 4 | 52 | 42.7 | C-2 | 8.4 | D-2 | 9.3 | E-1 | 2.8 | PGMEA | 27.1 |
| Composition 1-9 | Dispersion liquid 4 | 52 | 40.6 | C-1 | 8.4 | D-1 | 9.3 | E-1 | 2.8 | PGMEA | 24.7 |
| Composition 1-10 | Dispersion liquid 4 | 52 | 40.6 | C-2 | 8.4 | D-1 | 9.3 | E-1 | 2.8 | PGMEA | 24.7 |
| Composition 1-11 | Dispersion liquid 4 | 52 | 40.6 | C-2 | 8.4 | D-2 | 9.3 | E-1 | 2.8 | PGMEA | 24.7 |
| Composition 1-12 | Dispersion liquid 4 | 52 | 40.6 | C-2 | 8.4 | D-2 | 9.3 | E-2 | 2.8 | PGMEA | 24.7 |
| Composition 1-13 | Dispersion liquid 4 | 52 | 40.6 | C-1/ C-2 | 3.0/ 5.4 | D-1/ D-2 | 2/ 7.3 | E-1/ E-4 | 0.5/ 2.3 | PGMEA/ cyclohexanone | 12.1/ 12.1 |
| Composition 1-14 | Dispersion liquid 4 | 52 | 40.6 | C-2 | 8.4 | D-2 | 9.3 | E-3 | 2.8 | PGMEA | 24.7 |
| Composition 1-15 | Dispersion liquid 1 | 52 | 40.0 | C-2 | 8.4 | D-2 | 9.3 | E-1 | 2.8 | PGMEA | 23.9 |
| Composition 1-16 | Dispersion liquid 2 | 52 | 40.0 | C-2 | 8.4 | D-2 | 9.3 | E-1 | 2.8 | PGMEA | 23.9 |
| Composition 1-17 | Dispersion liquid 3 | 52 | 40.0 | C-2 | 8.4 | D-2 | 9.3 | E-1 | 2.8 | PGMEA | 23.9 |
| Composition 1-18 | Dispersion liquid 4 | 52 | 40.0 | C-2 | 8.4 | D-2 | 9.3 | E-1 | 2.8 | PGMEA | 23.9 |
| Composition 1-19 | Dispersion liquid 5 | 52 | 40.0 | C-2 | 8.4 | D-2 | 9.3 | E-1 | 2.8 | PGMEA | 23.9 |
| Composition 1-20 | Dispersion liquid 12 | 52 | 40.0 | C-2 | 8.4 | D-2 | 9.3 | E-1 | 2.8 | PGMEA | 23.9 |
| Composition 1-21 | Dispersion liquid 13 | 52 | 40.0 | C-2 | 8.4 | D-2 | 9.3 | E-1 | 2.8 | PGMEA | 23.9 |
| Composition 1-22 | Dispersion liquid 14 | 52 | 40.0 | C-2 | 8.4 | D-2 | 9.3 | E-1 | 2.8 | PGMEA | 23.9 |

TABLE 3-continued

| | | | | | | | | | | | |
|---|---|---|---|---|---|---|---|---|---|---|---|
| Composition 1-23 | Dispersion liquid 19 | 64 | 40.0 | C-2 | 2.3 | D-2 | 9.3 | E-1 | 2.8 | PGMEA | 18.0 |
| Composition 1-24 | Dispersion liquid 20 | 44 | 40.0 | C-2 | 12.4 | D-2 | 9.3 | E-1 | 2.8 | PGMEA | 27.9 |

| | Coloring inhibitor | | Compound having epoxy group | | Ultraviolet absorber | | Adhesive | | Chain transfer agent | | Surfactant |
|---|---|---|---|---|---|---|---|---|---|---|---|
| | Type | Parts by mass | Type | Parts by mass | Type | Parts by mass | Type | Parts by mass | Type | Parts by mass | Parts by mass |
| Composition 1-1 | — | | — | | — | | — | | — | | 0.03 |
| Composition 1-2 | F-1 | 0.3 | — | | — | | — | | — | | 0.03 |
| Composition 1-3 | F-2 | 0.3 | — | | — | | — | | — | | 0.03 |
| Composition 1-4 | F-3 | 0.3 | — | | — | | — | | — | | 0.03 |
| Composition 1-5 | F-4 | 0.3 | — | | — | | — | | — | | 0.03 |
| Composition 1-6 | F-3 | 0.3 | G-1 | 2.2 | — | | — | | — | | 0.03 |
| Composition 1-7 | F-3 | 0.3 | G-2 | 2.2 | — | | — | | — | | 0.03 |
| Composition 1-8 | F-3 | 0.3 | — | | J-1 | 0.1 | — | | — | | 0.03 |
| Composition 1-9 | F-3 | 0.3 | — | | — | | I-1 | 2.5 | — | | 0.03 |
| Composition 1-10 | F-3 | 0.3 | — | | — | | I-1 | 2.5 | — | | 0.03 |
| Composition 1-11 | F-3 | 0.3 | — | | — | | I-1 | 2.5 | — | | 0.03 |
| Composition 1-12 | F-3 | 0.3 | — | | — | | I-1 | 2.5 | — | | 0.03 |
| Composition 1-13 | F-3 | 0.3 | — | | — | | I-1 | 2.5 | — | | 0.03 |
| Composition 1-14 | F-3 | 0.3 | — | | — | | I-1 | 2.5 | — | | 0.03 |
| Composition 1-15 | F-3 | 0.3 | — | | — | | I-1 | 2.5 | K-1 | 0.8 | 0.03 |
| Composition 1-16 | F-3 | 0.3 | — | | — | | I-1 | 2.5 | K-1 | 0.8 | 0.03 |
| Composition 1-17 | F-3 | 0.3 | — | | — | | I-1 | 2.5 | K-1 | 0.8 | 0.03 |
| Composition 1-18 | F-3 | 0.3 | — | | — | | I-1 | 2.5 | K-1 | 0.8 | 0.03 |
| Composition 1-19 | F-3 | 0.3 | — | | — | | I-1 | 2.5 | K-1 | 0.8 | 0.03 |
| Composition 1-20 | F-3 | 0.3 | — | | — | | I-1 | 2.5 | K-1 | 0.8 | 0.03 |
| Composition 1-21 | F-3 | 0.3 | — | | — | | I-1 | 2.5 | K-1 | 0.8 | 0.03 |
| Composition 1-22 | F-3 | 0.3 | — | | — | | I-1 | 2.5 | K-1 | 0.8 | 0.03 |
| Composition 1-23 | F-3 | 0.3 | — | | — | | I-1 | 2.5 | K-1 | 0.8 | 0.03 |
| Composition 1-24 | F-3 | 0.3 | — | | — | | I-1 | 2.5 | K-1 | 0.8 | 0.03 |

TABLE 4

| | Dispersion liquid | | | Alkali-soluble resin | | Polymerizable compound | | Photopolymerization initiator | | Solvent | |
|---|---|---|---|---|---|---|---|---|---|---|---|
| | Type | Parts by mass | Content (% by mass with respect to total solid content) of white pigment | Type | Parts by mass | Type | Parts by mass | Type | Parts by mass | Type | Parts by mass |
| Composition 1-25 | Dispersion liquid 20 | 60.5 | 54.9 | C-2 | 7.7 | D-2 | 6.8 | E-3 | 2 | PGMEA | 19.6 |
| Composition 1-26 | Dispersion liquid 20 | 33 | 30.1 | C-2 | 15.5 | D-2 | 11 | E-3 | 3.1 | PGMEA | 34.6 |
| Composition 1-27 | Dispersion liquid 21 | 52 | 40.0 | C-2 | 8.4 | D-2 | 9.3 | E-1 | 2.8 | PGMEA | 23.9 |
| Composition 1-28 | Dispersion liquid 22 | 52 | 40.0 | C-2 | 8.4 | D-2 | 9.3 | E-1 | 2.8 | PGMEA | 23.9 |
| Composition 1-29 | Dispersion liquid 23 | 52 | 40.0 | C-2 | 8.4 | D-2 | 9.3 | E-1 | 2.8 | PGMEA | 23.9 |
| Composition 1-30 | Dispersion liquid 25 | 52 | 40.0 | C-2 | 8.4 | D-2 | 9.3 | E-1 | 2.8 | PGMEA | 23.9 |
| Composition 1-31 | Dispersion liquid 26 | 52 | 40.0 | C-2 | 8.4 | D-2 | 9.3 | E-1 | 2.8 | PGMEA | 23.9 |
| Composition 1-32 | Dispersion liquid 27 | 52 | 40.0 | C-2 | 8.4 | D-2 | 9.3 | E-1 | 2.8 | PGMEA | 23.9 |
| Composition 1-33 | Dispersion liquid 28 | 52 | 40.0 | C-2 | 8.4 | D-2 | 9.3 | E-1 | 2.8 | PGMEA | 23.9 |
| Composition 1-34 | Dispersion liquid 29 | 52 | 40.0 | C-2 | 8.4 | D-2 | 9.3 | E-1 | 2.8 | PGMEA | 23.9 |
| Composition 1-35 | Dispersion liquid 30 | 52 | 40.0 | C-2 | 8.4 | D-2 | 9.3 | E-1 | 2.8 | PGMEA | 23.9 |
| Composition 1-36 | Dispersion liquid 31 | 52 | 40.0 | C-2 | 8.4 | D-2 | 9.3 | E-1 | 2.8 | PGMEA | 23.9 |
| Composition 1-37 | Dispersion liquid 4 Dispersion liquid 3 | 40 12 | 40.0 | C-2 | 8.4 | D-2 | 9.3 | E-1 | 2.8 | PGMEA | 23.9 |
| Composition 1-38 | Dispersion liquid 4 Dispersion liquid 12 | 40 12 | 40.0 | C-2 | 8.4 | D-2 | 9.3 | E-1 | 2.8 | PGMEA | 23.9 |

TABLE 4-continued

| | | | | | | | | | | |
|---|---|---|---|---|---|---|---|---|---|---|
| Composition 1-39 | Dispersion liquid 32 | 52 | 40.0 | C-2 | 8.4 | D-2 | 9.3 | E-1 | 2.8 | PGMEA | 23.9 |
| Composition 1-40 | Dispersion liquid 33 | 52 | 40.0 | C-2 | 8.4 | D-2 | 9.3 | E-1 | 2.8 | PGMEA | 23.9 |
| Composition 1-41 | Dispersion liquid 34 | 52 | 40.0 | C-2 | 8.4 | D-2 | 9.3 | E-1 | 2.8 | PGMEA | 23.9 |

| | Coloring inhibitor | | Compound having epoxy group | | Ultraviolet absorber | | Adhesive | | Chain transfer agent | | Surfactant |
|---|---|---|---|---|---|---|---|---|---|---|---|
| | Type | Parts by mass | Type | Parts by mass | Type | Parts by mass | Type | Parts by mass | Type | Parts by mass | Parts by mass |
| Composition 1-25 | F-3 | 0.3 | — | | | | I-1 | 2.5 | K-1 | 0.6 | 0.03 |
| Composition 1-26 | F-3 | 0.3 | — | | | | I-1 | 2.5 | K-1 | 1 | 0.03 |
| Composition 1-27 | F-3 | 0.3 | — | | — | | I-1 | 2.5 | K-1 | 0.8 | 0.03 |
| Composition 1-28 | F-3 | 0.3 | — | | — | | I-1 | 2.5 | K-1 | 0.8 | 0.03 |
| Composition 1-29 | F-3 | 0.3 | — | | — | | I-1 | 2.5 | K-1 | 0.8 | 0.03 |
| Composition 1-30 | F-3 | 0.3 | — | | — | | I-1 | 2.5 | K-1 | 0.8 | 0.03 |
| Composition 1-31 | F-3 | 0.3 | — | | — | | I-1 | 2.5 | K-1 | 0.8 | 0.03 |
| Composition 1-32 | F-3 | 0.3 | — | | — | | I-1 | 2.5 | K-1 | 0.8 | 0.03 |
| Composition 1-33 | F-3 | 0.3 | — | | — | | I-1 | 2.5 | K-1 | 0.8 | 0.03 |
| Composition 1-34 | F-3 | 0.3 | — | | — | | I-1 | 2.5 | K-1 | 0.8 | 0.03 |
| Composition 1-35 | F-3 | 0.3 | — | | — | | I-1 | 2.5 | K-1 | 0.8 | 0.03 |
| Composition 1-36 | F-3 | 0.3 | — | | — | | I-1 | 2.5 | K-1 | 0.8 | 0.03 |
| Composition 1-37 | F-3 | 0.3 | — | | — | | I-1 | 2.5 | K-1 | 0.8 | 0.03 |
| Composition 1-38 | F-3 | 0.3 | — | | — | | I-1 | 2.5 | K-1 | 0.8 | 0.03 |
| Composition 1-39 | F-3 | 0.3 | — | | — | | I-1 | 2.5 | K-1 | 0.8 | 0.03 |
| Composition 1-40 | F-3 | 0.3 | — | | — | | I-1 | 2.5 | K-1 | 0.8 | 0.03 |
| Composition 1-41 | F-3 | 0.3 | — | | — | | I-1 | 2.5 | K-1 | 0.8 | 0.03 |

The raw materials described in the table are as follows.

(Dispersion Liquid)

Dispersion liquids 1 to 34: Dispersion liquids 1 to 34 above.

(Alkali-Soluble Resin)

C-1: Resin having the following structure (acid value=113 mgKOH/g and Mw=33,000). The numerical values shown together with the respective repeating units represent the contents [mass ratios] of the respective repeating units.

C-2: Resin having the following structure (acid value=32 mgKOH/g and Mw=14,000). The numerical values shown together with the respective repeating units represent the contents [mass ratios] of the respective repeating units.

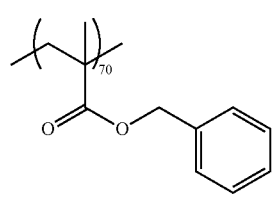

C-1

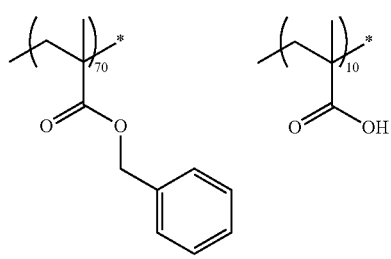

C-2

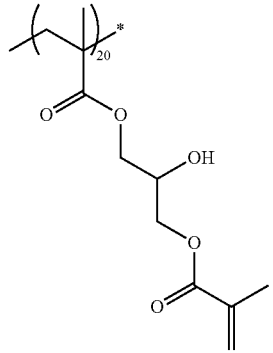

(Polymerizable Compound)
D-1: KAYARAD DPHA (manufactured by Nippon Kayaku Co., Ltd.)
D-2: NK ESTER A-TMMT (manufactured by Shin-Nakamura Chemical Co., Ltd.)
(Photopolymerization Initiator)
E-1: The following compound

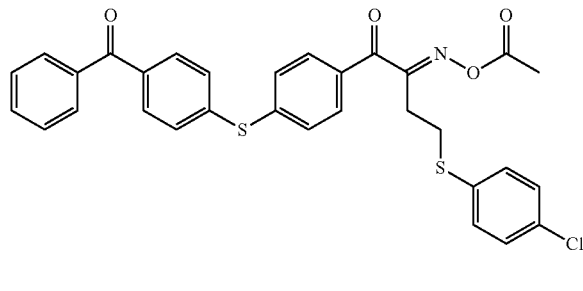 [SMILES: CC(=O)O/N=C(\CCSc1ccc(Cl)cc1)C(=O)c1ccc(Sc2ccc(C(=O)c3ccccc3)cc2)cc1]

E-2: IRGACURE 379 (manufactured by BASF)
E-3: IRGACURE TPO (manufactured by BASF)
E-4: IRGACURE 819 (manufactured by BASF)
(Solvent)
PGMEA: Propylene glycol monomethyl ether acetate
(Coloring Inhibitor)
F-1: ADEKA STAB PEP-36A (manufactured by ADEKA Corporation, the following structure)
F-2: ADEKA STAB AO-50 (manufactured by ADEKA Corporation, the following structure)
F-3: ADEKA STAB AO-80 (manufactured by ADEKA Corporation, the following structure)
F-4: ADEKA STAB AO-412S (manufactured by ADEKA Corporation, the following structure)

(Compound Having Epoxy Group)
G-1: EHPE 3150 (manufactured by Daicel Corporation)
G-2: EPICLON N-695 (manufactured by DIC Corporation)
(Ultraviolet Absorber)
J-1: The following compound
(Adhesive)
I-1: The following compound
(Chain Transfer Agent)
K-1: The following compound

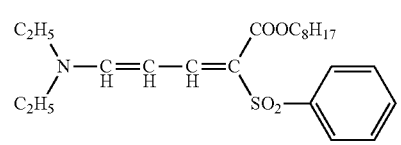

(J-1)

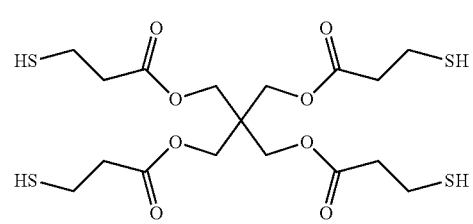

(K-1)

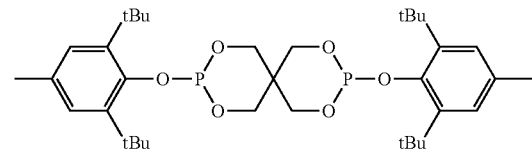

(F-1)

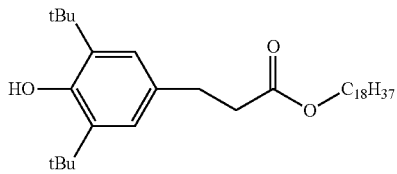

(F-2)

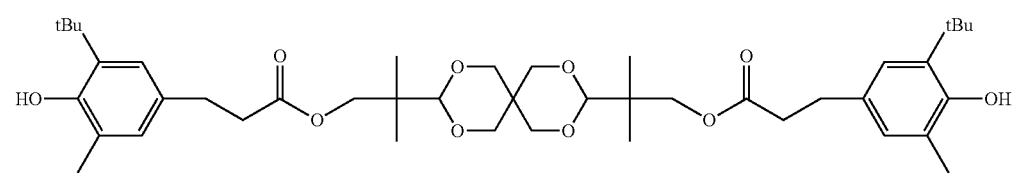

(F-3)

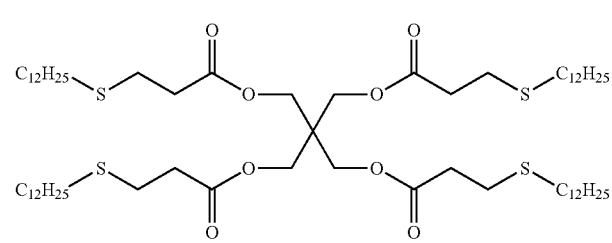

(F-4)

-continued

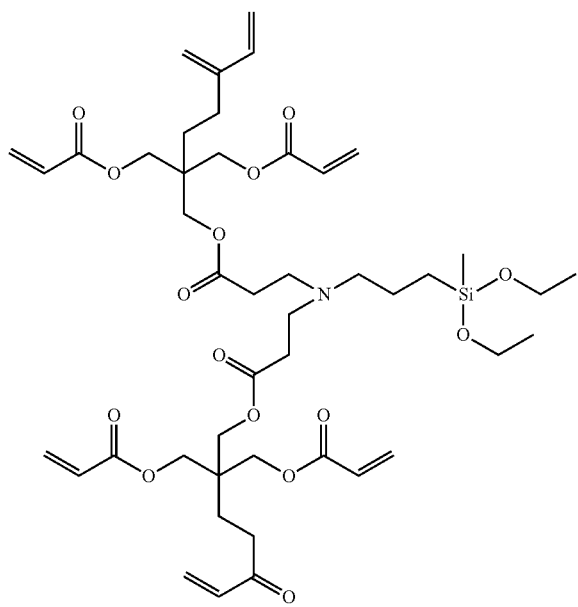

(I-1)

(Surfactant)

The following mixture (Mw=14,000, % expressing the proportion of the repeating units is % by mass)

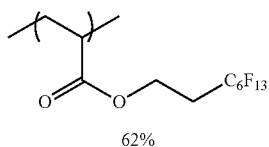

62%

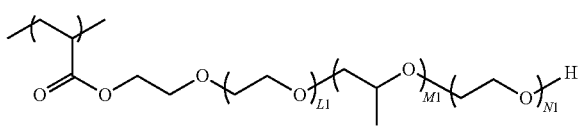

38%

L1 + N1 + L2 + N2 = 14
M1 + M2 = 17

<Value of L*, Value of a*, and Value of b*>

Each of the compositions obtained above was applied onto an 8-inch (1 inch equals to 2.54 cm) glass wafer with an undercoat layer (CT-4000L manufactured by FUJIFILM Electronic Materials Co., Ltd.; a film thickness of 0.1 μm) using a spin coater such that the film thickness after drying became 3.0 μm, and subjected to a heating treatment (prebaking) using a hot plate at 110° C. for 120 seconds.

Subsequently, exposure was performed through a mask with a pattern in 2 cm×2 cm at 1,000 mJ/cm$^2$ with light at a wavelength of 365 nm, using an i-ray stepper exposure device FPA-3000i5+ (manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 65 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. In the present specification, the L* is measured in the state where the amount of the solvent included in the film is 1% by mass or less.

The value of the L*, the value of a*, and the value of b* in a L*a*b* color coordinate system of CIE 1976 of the obtained white pattern were measured using a spectrophotometer (X-Rite 528, manufactured by X-Rite Inc.). A D65 light source was used as a light source, an observation field of view was set to 20, and a white reference was set using a white patch of a calibration reference plate included in the spectrophotometer (X-Rite 528, manufactured by X-Rite Inc.).

<Temporal Liquid Stability>

Each of the obtained compositions was dried under a condition of 160° C. and 1 hour, using an oven. The volatilization amount was determined by measuring each of the mass before and after drying, and a difference between the mass before drying and the volatilized amount of each of the compositions was calculated to determine "the solid content before the centrifugation treatment".

Furthermore, the obtained composition was subjected to a centrifugation treatment under the conditions of room temperature and 3,400 rpm for 50 minutes, and for the resulting supernatant, "the solid content after the centrifugation treatment" was calculated by the same method as above.

A difference between "the solid content after the centrifugation treatment" and "the solid content before the centrifugation treatment" was divided by "the solid content before the centrifugation treatment" to calculate sedimentations of the solid contents in percentages, which were classified as follows and used for evaluation of temporal liquid stability. With regard to the temporal liquid stability, A, B, or C is evaluated as being preferable, A or B is evaluated as being more preferable, and A is evaluated as being still more preferable. The obtained results are shown in the following table.

A: The sedimentation of the solid content is in the range of 2% by mass or less.

B: The sedimentation of the solid content is in the range of more than 2% by mass and 5% by mass or less.

C: The sedimentation of the solid content is in the range of more than 5% by mass and 10% by mass or less.

D: The sedimentation of the solid content is in the range of more than 10% by mass and 15% by mass or less.

E: The sedimentation of the solid content is in the range of more than 15% by mass.

<Light Resistance>

Each of the obtained compositions was applied onto an 8-inch glass wafer with an undercoat layer (CT-4000L manufactured by FUJIFILM Electronic Materials Co., Ltd.; a film thickness of 0.1 µm) using a spin coater such that the film thickness after drying became 5.0 µm, and subjected to a heating treatment (pre-baking) using a hot plate at 105° C. for 120 seconds.

Subsequently, exposure was performed through a mask with a pattern in 2 cm×2 cm at 1,000 mJ/cm$^2$ with light at a wavelength of 365 nm, using an i-ray stepper exposure device FPA-3000i5+ (manufactured by Canon Inc.).

Thereafter, the glass wafer having the exposed film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. Thereafter, the glass wafer was subjected to a heating treatment (post-baking) for 5 minutes, using a hot plate at 200° C., and the film thickness after post-baking was measured using a stylus film thickness measuring device, DEKTAK.

Then, the film thickness after irradiation with light at a luminance of 100,000 lux for 50 hours was measured using a Super Xenon Weather Meter SX75 manufactured by Suga Test Instruments Co., Ltd., and taken as a film thickness after the light resistance test.

The ratio (%) of the film thickness after the light resistance test to the film thickness after post-baking was classified as follows and evaluated for the light resistance. With regard to the light resistance, A, B, C, or D is evaluated as being preferable, A, B, or C is evaluated as being more preferable, A or B is evaluated as being particularly preferable, and A is evaluated as being more particularly preferable. The obtained results are shown in the following table.

A: The ratio of the film thickness after the light resistance test to the film thickness after post-baking is in the range of more than 95% and 100% or less.

B: The ratio of the film thickness after the light resistance test to the film thickness after post-baking is in the range of 90% or more and less than 95%.

C: The ratio of the film thickness after the light resistance test to the film thickness after post-baking is in the range of 80% or more and less than 90%.

D: The ratio of the film thickness after the light resistance test to the film thickness after post-baking is in the range of 70% or more and less than 80%.

E: The ratio of the film thickness after the light resistance test to the film thickness after post-baking is in the range of less than 70%.

<Coloring Property>

The spectra (L*, a*, b*) of the white pattern prepared in the measurement of the value of the L*, the value of a*, and the value of b* were measured using a spectrophotometer. Next, the prepared white pattern was heated at 265° C. for 15 minutes using a hot plate, the spectrum of the white pattern after heating was measured, and a color difference ΔE*ab of the pattern between before and after heating in a L*a*b* color coordinate system of CIE 1976 was calculated. In addition, the calculation equation of the color difference ΔE*ab is as follows.

$$\Delta E^*ab = [(\Delta L^*)^2 + (\Delta a^*)^2 + (\Delta b^*)^2]^{1/2}$$

A: The color difference ΔE*ab is 0 or more and less than 0.5.

B: The color difference ΔE*ab is 0.5 or more and less than 1.0.

C: The color difference ΔE*ab is 1.0 or more and less than 2.0.

D: The color difference ΔE*ab is 2.0 or more and less than 3.0.

E: The color difference ΔE*ab is 3.0 or more.

<Defects>

Each of the compositions obtained above was applied onto an 8-inch silicon wafer with an undercoat layer (CT-4000L manufactured by FUJIFILM Electronic Materials Co., Ltd.; a film thickness of 0.1 m) using a spin coater such that the film thickness after drying became 3.0 µm, and subjected to a heating treatment (pre-baking) using a hot plate at 110° C. for 120 seconds, thereby forming a composition layer.

With respect to the substrate having the composition layer formed thereon, the number of impurities having a size of 5.0 µm or more was counted using a defect inspector, ComPLUS (manufactured by Applied Materials, Inc.).

This evaluation was carried out on the composition layer immediately after the preparation thereof and the composition layer which had been placed at room temperature (23° C.) for one month from the preparation thereof, and an increase rate in impurities was evaluated in accordance with the following decision standard.

The increase rate in impurities was calculated as (number of impurities which had been placed at room temperature for one month/number of impurities immediately after the preparation). With regard to evaluation of the defects, A, B, C, or D is evaluated as being preferable, A, B, or C is evaluated as being more preferable, A or B is evaluated as being still more preferable, and A is evaluated as being particularly preferable. The obtained results are shown in the following table.

A: Less than 1.1

B: 1.1 or more and less than 1.3

C: 1.3 or more and less than 1.5

D: 1.5 or more and less than 3.0

E: 3.0 or more

TABLE 5

|  | Value of L* in case of film thickness of 3.0 μm | Value of a* in case of film thickness of 3.0 μm | Value of b* in case of film thickness of 3.0 μm | Temporal liquid stability | Light resistance | Colorability | Defects |
| --- | --- | --- | --- | --- | --- | --- | --- |
| Composition 1-1 | 62.4 | −3.2 | −20.5 | B | A | D | A |
| Composition 1-2 | 62.1 | −3.0 | −20.3 | B | A | C | A |
| Composition 1-3 | 62.1 | −3.5 | −21.1 | B | A | B | A |
| Composition 1-4 | 62.5 | −3.3 | −20.6 | B | A | A | A |
| Composition 1-5 | 63.0 | −4.0 | −20.4 | B | A | C | A |
| Composition 1-6 | 61.5 | −3.6 | −20.4 | B | A | A | A |
| Composition 1-7 | 62.0 | −3.5 | −20.7 | B | A | A | A |
| Composition 1-8 | 62.3 | −3.3 | −20.7 | B | A | A | A |
| Composition 1-9 | 62.4 | −3.1 | −20.5 | B | A | A | A |
| Composition 1-10 | 62.5 | −3.0 | −21.0 | B | A | A | A |
| Composition 1-11 | 62.4 | −3.4 | −20.6 | B | A | A | A |
| Composition 1-12 | 62.4 | −3.4 | −20.5 | B | A | A | A |
| Composition 1-13 | 62.8 | −3.7 | −20.4 | B | A | A | A |
| Composition 1-14 | 62.9 | −3.7 | −20.6 | B | A | A | A |
| Composition 1-15 | 41.0 | −3.1 | −30.6 | A | A | A | A |
| Composition 1-16 | 54.0 | −2.5 | −17.9 | A | D | A | A |
| Composition 1-17 | 47.1 | −3.6 | −29.5 | A | A | A | A |
| Composition 1-18 | 62.4 | −4.1 | −20.5 | B | A | A | A |
| Composition 1-19 | 63.1 | −4.1 | −18.8 | B | D | A | A |
| Composition 1-20 | 50.2 | −4.3 | −32.5 | A | D | A | A |
| Composition 1-21 | 50.6 | −4.1 | −28.9 | A | A | A | A |
| Composition 1-22 | 51.0 | −4.5 | −29.0 | A | C | A | A |
| Composition 1-23 | 62.3 | −3.6 | −20.4 | B | A | A | B |
| Composition 1-24 | 62.7 | −3.7 | −20.8 | B | A | A | B |
| Composition 1-25 | 69.7 | −3.0 | −19.5 | B | A | A | A |
| Composition 1-26 | 47.9 | −3.9 | −24.5 | B | A | A | A |
| Composition 1-27 | 63.0 | −4.1 | −20.6 | B | A | A | A |
| Composition 1-28 | 63.1 | −3.5 | −20.7 | B | A | A | A |
| Composition 1-29 | 62.1 | −3.6 | −20.5 | B | A | B | A |
| Composition 1-30 | 63.5 | −3.5 | −15.5 | C | A | A | B |
| Composition 1-31 | 71.0 | −3.5 | −14.9 | C | A | A | B |
| Composition 1-32 | 69.7 | −3.0 | −13.9 | D | A | A | A |
| Composition 1-33 | 71.4 | −3.5 | −10.3 | D | A | A | A |
| Composition 1-34 | 72.3 | −2.9 | −7.7 | D | A | B | A |
| Composition 1-35 | 36.0 | −4.3 | −33.3 | A | A | A | C |
| Composition 1-36 | 58.5 | −4.1 | −21.0 | B | A | A | C |
| Composition 1-37 | 59.2 | −4.0 | −23.9 | B | A | A | A |
| Composition 1-38 | 50.5 | −4.3 | −28.9 | B | C | A | A |
| Composition 1-39 | 35.5 | −3.5 | −32.3 | A | A | A | A |
| Composition 1-40 | 62.3 | −3.6 | −20.4 | B | A | A | A |
| Composition 1-41 | 62.5 | −3.3 | −20.7 | B | A | A | A |

<Preparation of Composition for Forming Infrared-Shielding Layer>

The raw materials shown below were mixed to prepare compositions A to F.

(Composition A)

Propylene glycol monomethyl ether acetate (PGMEA): 1.1 parts by mass

40%-by-mass PGMEA Solution of resin (I): 39.5 parts by mass

NK ESTER A-TMMT (manufactured by Shin-Nakamura Chemical Co., Ltd.): 6.8 parts by mass IRGACURE 369 (manufactured by BASF): 1.6 parts by mass KAYACURE DETX-S (manufactured by Nippon Kayaku Co., Ltd.): 0.6 parts by mass Ultraviolet absorber ((J-1) above): 0.4 parts by mass Surfactant (0.2%-by-mass PGMEA solution of the following polymer (Mw=14,000, % expressing the proportion of the repeating units is % by mass)): 0.1 parts by mass

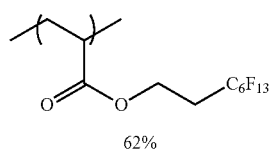

62%

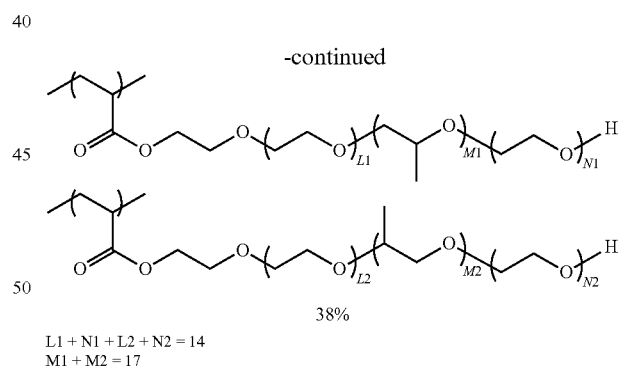

38%

L1 + N1 + L2 + N2 = 14
M1 + M2 = 17

YMS-01A-2 (cesium oxidation tungsten dispersion liquid, manufactured by Sumitomo Metal mining Co., Ltd.): 49.9 parts by mass (Composition B)

Copper complex (Cu-1): 3.3 parts by mass

Copper complex (Cu-2): 9.8 parts by mass

Resin (II): 31 parts by mass

KBM-3066 (manufactured by Shin-Etsu silicones Co., Ltd.): 3.4 parts by mass

Aluminum acetylacetonate (manufactured by Sigma-Aldrich Co., LLC.): 0.01 parts by mass IRGACURE OXE-01 (manufactured by BASF): 2.5 parts by mass
Cyclopentanone: 50 parts by mass
(Composition C)
Cyclohexanone: 64.8 parts by mass
40%-by-mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Pyrrolopyrrole compound (pp-1): 2.4 parts by mass
(Composition D)
Cyclohexanone: 64.8 parts by mass
40%-by-mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Pyrrolopyrrole compound (pp-2): 2.4 parts by mass
(Composition E)
Cyclohexanone: 64.8 parts by mass
40%-by-mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Diiminium compound (im-1): 2.4 parts by mass
(Composition F)
Cyclohexanone: 68.7 parts by mass
40%-by-mass PGMEA Solution of resin (I): 16.1 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Squarylium compound (sq-1): 5 parts by mass
Resin (I): Resin having the following structure (acid value=70 mgKOH/g, Mw=11,000). The numerical values shown together with the respective repeating units represent the contents [mass ratios] of the respective repeating units.

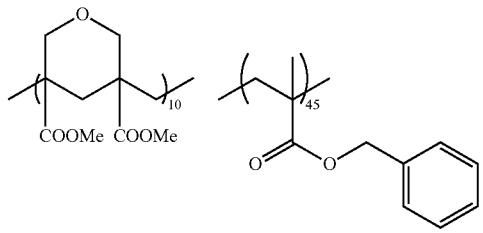

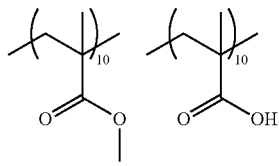

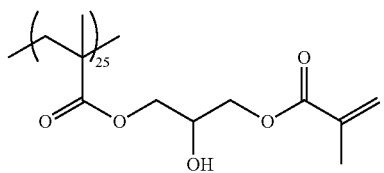

Resin (II): Resin having the following structure (Mw=16,000). The numerical values shown together with the respective repeating units represent the contents [mass ratios] of the respective repeating units.

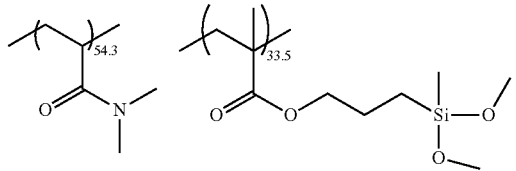

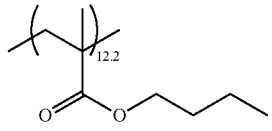

Copper complex (Cu-1), copper complex (Cu-2), pyrrolopyrrole compound (pp-1), pyrrolopyrrole compound (pp-2), diimmonium compound (im-1), and squarylium compound (sq-1): The following compounds

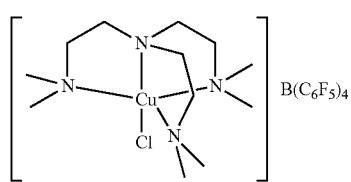
(Cu-1)

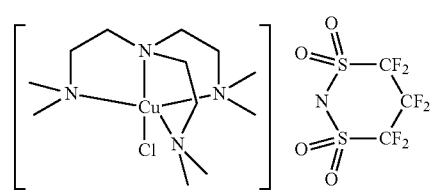
(Cu-2)

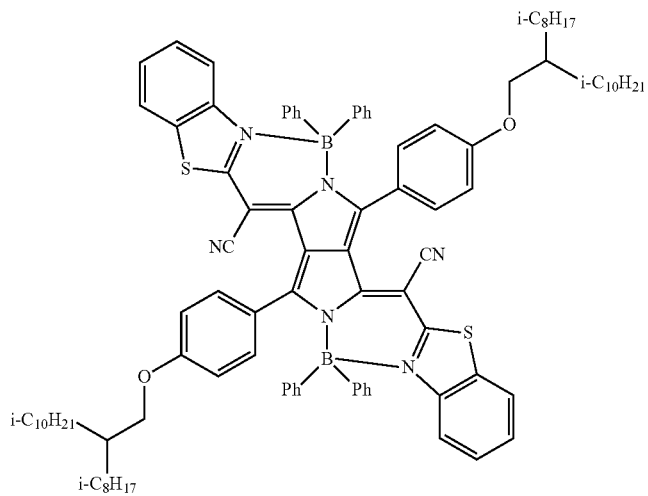
(pp-1)
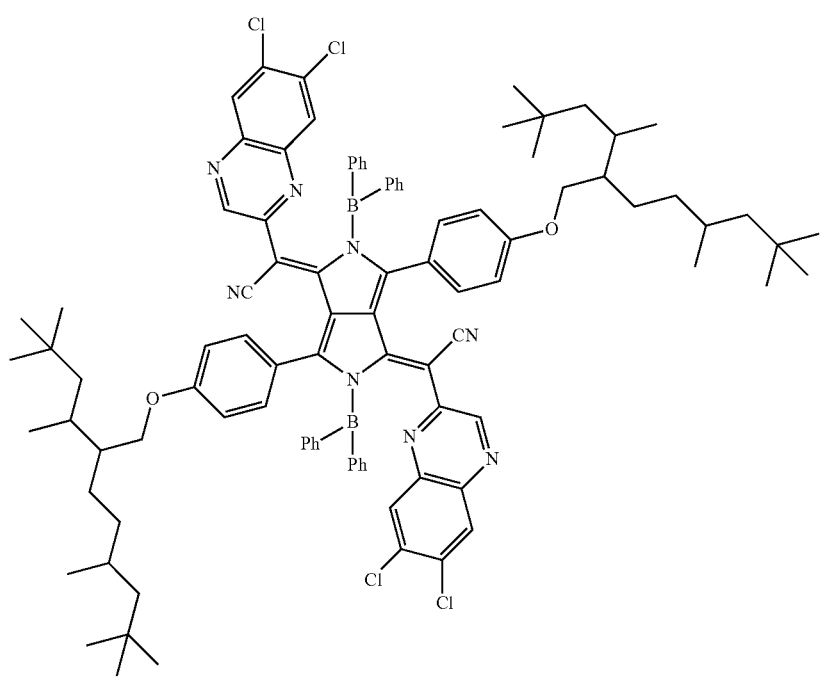
(pp-2)

-continued (im-1)

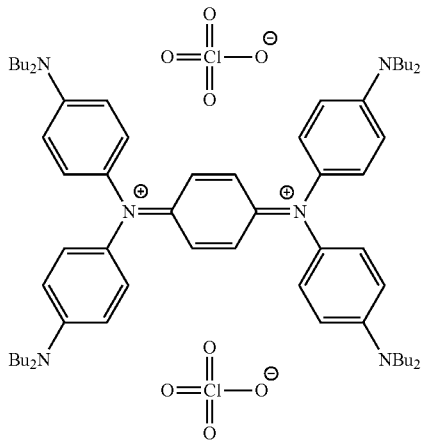

(sq-1)

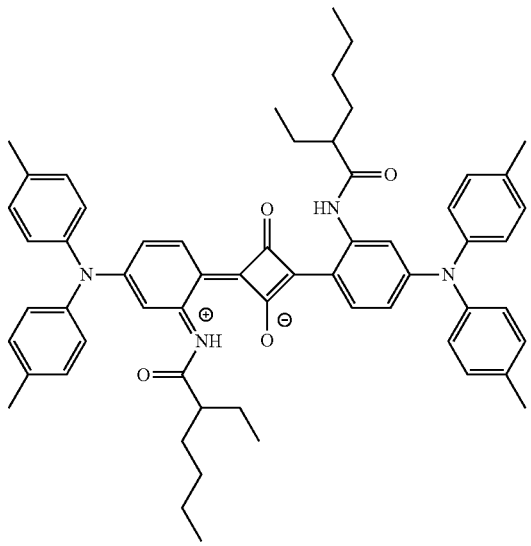

Test Example 1

A composition for a lower layer shown in the following table was applied onto an 8-inch glass wafer with a spin coater such that the film thickness after drying became a film thickness described in the following table, and then subjected to a heating treatment (pre-baking) using a hot plate at 100° C. for 120 seconds. Subsequently, entire-surface exposure was performed at 1,000 mJ/cm$^2$ with light at a wavelength of 365 nm, using an i-ray stepper exposure device FPA-3000i5+(manufactured by Canon Inc.). Then, a heating treatment (pre-baking) was performed using a hot plate at 200° C. for 5 minutes to prepare a lower layer. Subsequently, a composition for an upper layer shown in the following table was applied thereonto using a spin coater such that the film thickness after drying became a film thickness described in the following table, and subjected to a heating treatment (pre-baking) using a hot plate at 110° C. for 120 seconds. Then, exposure was performed through a mask with a pattern in 2 cm×2 cm at 1,000 mJ/cm$^2$ with light at a wavelength of 365 nm, using an i-ray stepper exposure device FPA-3000i5+(manufactured by Canon Inc.). Thereafter, the glass wafer having the exposed film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. Thereafter, a heating treatment (post-baking) was performed for 5 minutes using a hot plate at 200° C. to produce a laminate. For the obtained laminate, evaluation of visible light transmittance, an infrared-shielding property, heat resistance, and light resistance was performed.

<Visible Light Transmittance>

For the visible light transmittance, light was incident from a direction perpendicular to the laminate obtained in Test Example 1, and the transmittance at 400 nm to 700 nm was measured using UH-4150 equipped with a standard sphere with a diameter of 60 mm (4 holes/reflection sample incident angle: 10° on both the sample side and the control side) as the intensity of light transmitted through the laminate, and an average value thereof was used to evaluate the visible light transmittance. Incidentally, the transmittance of only the 8-inch glass wafer on which a lower layer and an upper layer had not been applied was used as a blank value.

With regard to evaluation of the visible light transmittance, A, B, C, or D is evaluated as being preferable, A, B, or C is evaluated as being more preferable, A or B is evaluated as being still more preferable, and A is evaluated as being particularly preferable. The obtained results are shown in the following table.

A: The average value of the transmittance at 400 nm to 700 nm is 25% or more.

B: The average value of the transmittance at 400 nm to 700 nm is 15% or more and less than 25%.

C: The average value of the transmittance at 400 nm to 700 nm is 10% or more and less than 15%.

D: The average value of the transmittance at 400 nm to 700 nm is 5% or more and less than 10%.

E: The average value of the transmittance at 400 nm to 700 nm is less than 5%.

<Infrared-Shielding Property>

For the infrared-shielding property, the transmittance at 700 nm to 1,200 nm was measured using the same method as for the evaluation of the visible light transmittance, and an average value thereof was used to evaluate the infrared-shielding property. With regard to evaluation of the infrared-shielding property, A, B, C, or D is evaluated as being preferable, A, B, or C is evaluated as being more preferable, A or B is evaluated as being still more preferable, and A is evaluated as being particularly preferable. The obtained results are shown in the following table.

A: The average value of the transmittance at 700 nm to 1,200 nm is less than 15%.

B: The average value of the transmittance at 700 nm to 1,200 nm is 15% or more and less than 25%.

C: The average value of the transmittance at 700 nm to 1,200 nm is 25% or more and less than 35%.

D: The average value of the transmittance at 700 nm to 1,200 nm is 35% or more and less than 45%.

E: The average value of the transmittance at 700 nm to 1,200 nm is 45% or more.

<Heat Resistance>

Light was incident from a direction perpendicular to the laminate obtained in Test Example 1, and the transmittance at 400 nm to 1,200 nm was measured using UH-4150 equipped with a standard sphere with a diameter of 60 mm (4 holes/reflection sample incident angle: 10° on both the sample side and the control side) with the intensity of light transmitted through the laminate, and an average value thereof was used to evaluate the visible light transmittance.

Subsequently, the transmittance after heating at 130° C. for 1,000 hours was measured using an oven and taken as a transmittance after the heat resistance test.

The differences (%) between the transmittance after the post-baking and the transmittance after the heat resistance test were classified as follows, and the heat resistance was evaluated. With regard to evaluation of the heat resistance, A, B, C, or D is evaluated as being preferable, A, B, or C is evaluated as being more preferable, A or B is evaluated as being particularly preferable, and A is evaluated as being more particularly preferable. The obtained results are shown in the following table.

A: The difference (%) between the transmittance after the post-baking and the transmittance after the heat resistance test is less than 1%.

B: The difference (%) between the transmittance after the post-baking and the transmittance after the heat resistance test is 1% or more and less than 5%.

C: The difference (%) between the transmittance after the post-baking and the transmittance after the heat resistance test is 5% or more and less than 10%.

D: The difference (%) between the transmittance after the post-baking and the transmittance after the heat resistance test is 10% or more and less than 20%.

E: The difference (%) between the transmittance after the post-baking and the transmittance after the heat resistance test is 20% or more.

<Light Resistance>

For the laminate obtained in Test Example 1, the transmittance at 400 nm to 1,200 nm was measured by the same method as for evaluation of the heat resistance.

Then, the transmittance after irradiation with light at a luminance of 100,000 lux for 50 hours was measured using a Super Xenon Weather Meter SX75 manufactured by Suga Test Instruments Co., Ltd., and taken as a transmittance after the light resistance test.

The differences (%) between the transmittance after the post-baking and the transmittance after the light resistance test were classified as follows, and the light resistance was evaluated. With regard to evaluation of the light resistance, A, B, C, or D is evaluated as being preferable, A, B, or C is evaluated as being more preferable, A or B is evaluated as being particularly preferable, and A is evaluated as being more particularly preferable. The obtained results are shown in the following table.

A: The differences (%) between the transmittance after the post-baking and the transmittance after the light resistance test is less than 1%.

B: The differences (%) between the transmittance after the post-baking and the transmittance after the light resistance test is 1% or more and less than 5%.

C: The differences (%) between the transmittance after the post-baking and the transmittance after the light resistance test is 5% or more and less than 10%.

D: The differences (%) between the transmittance after the post-baking and the transmittance after the light resistance test is 10% or more and less than 20%.

E: The differences (%) between the transmittance after the post-baking and the transmittance after the light resistance test is 20% or more.

Test Example 2

A composition for a lower layer shown in the following table was applied onto an 8-inch silicon wafer with a spin coater such that the film thickness after drying became a film thickness described in the following table, and then subjected to a heating treatment (pre-baking) using a hot plate at 100° C. for 120 seconds. Subsequently, entire-surface exposure was performed at 1,000 mJ/cm$^2$ with light at a wavelength of 365 nm, using an i-ray stepper exposure device FPA-3000i5+(manufactured by Canon Inc.). Then, a heating treatment (post-baking) was performed using a hot plate at 200° C. for 5 minutes to prepare a lower layer.

Subsequently, a composition for an upper layer shown in the following table was applied thereonto using a spin coater such that the film thickness after drying became a film thickness described in the following table, and subjected to a heating treatment (pre-baking) using a hot plate at 110° C. for 120 seconds. Then, exposure was performed through a mask with a pattern in 2 cm×2 cm at 1,000 mJ/cm$^2$ with light at a wavelength of 365 nm, using an i-ray stepper exposure device FPA-3000i5+(manufactured by Canon Inc.).

Thereafter, the glass wafer having the exposed film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. Thereafter, a heating treatment (post-baking) was performed for 5 minutes using a hot plate at 200° C. to produce a laminate.

<Whiteness>

The value of the L* of the white pattern in the laminate obtained in Test Example 2 in a L*a*b* color coordinate system of CIE 1976 of the obtained white pattern were measured using a spectrophotometer (X-Rite 528, manufactured by X-Rite Inc.). A D65 light source was used as a light source, an observation field of view was set to 20, and a white reference was set using a white patch of a calibration reference plate included in the spectrophotometer (X-Rite 528, manufactured by X-Rite Inc.).

With regard to evaluation of the whiteness, A, B, C, or D is evaluated as being preferable, A, B, or C is evaluated as being more preferable, A or B is evaluated as being particularly preferable, and A is evaluated as being more particularly preferable. The obtained results are shown in the following table.

A: The value of L* is 80 or more.
B: The value of L* is 70 or more and less than 80.
C: The value of L* is 60 or more and less than 70.
D: The value of L* is 50 or more and less than 60.
E: The value of L* is and less than 50.

jected to a heating treatment (pre-baking) using a hot plate at 100° C. for 120 seconds. Subsequently, entire-surface exposure was performed at 1,000 mJ/cm² with light at a wavelength of 365 nm, using an i-ray stepper exposure device FPA-3000i5+(manufactured by Canon Inc.). There-

TABLE 6

| | Lower layer | Film thickness of lower layer | Upper layer | Film thickness of upper layer | Whiteness | Visible light transmittance | Infrared-shielding property | Heat resistance | Light resistance |
|---|---|---|---|---|---|---|---|---|---|
| Example 1-1 | Composition A | 3.5 μm | Composition 1-18 | 6.4 μm | B | B | A | A | A |
| Example 1-2 | Composition A | 5.0 μm | Composition 1-18 | 6.4 μm | B | C | A | A | A |
| Example 1-3 | Composition A | 3.5 μm | Composition 1-18 | 3.2 μm | C | A | A | A | A |
| Example 1-4 | Composition A | 3.5 μm | Composition 1-18 | 9.6 μm | A | C | A | A | A |
| Example 1-5 | Composition B | 50 μm | Composition 1-18 | 6.4 μm | B | B | A | A | A |
| Example 1-6 | Composition B | 80 μm | Composition 1-18 | 6.4 μm | B | B | A | A | A |
| Example 1-7 | Composition C | 0.75 μm | Composition 1-18 | 6.4 μm | B | B | D | A | A |
| Example 1-8 | Composition C | 1.5 μm | Composition 1-18 | 6.4 μm | B | B | C | A | A |
| Example 1-9 | Composition D | 0.75 μm | Composition 1-18 | 6.4 μm | B | B | C | A | A |
| Example 1-10 | Composition D | 1.5 μm | Composition 1-18 | 6.4 μm | B | B | C | A | A |
| Example 1-11 | Composition E | 0.85 μm | Composition 1-18 | 6.4 μm | B | B | A | C | C |
| Example 1-12 | Composition E | 1.5 μm | Composition 1-18 | 6.4 μm | B | B | A | C | C |
| Example 1-13 | Composition F | 1.0 μm | Composition 1-18 | 6.4 μm | B | B | D | C | C |
| Example 1-14 | Composition F | 2.0 μm | Composition 1-18 | 6.4 μm | B | B | D | C | C |
| Example 1-15 | Composition A | 3.5 μm | Composition 1-15 | 6.4 μm | C | A | B | A | A |
| Example 1-16 | Composition A | 3.5 μm | Composition 1-16 | 6.4 μm | C | A | B | A | A |
| Example 1-17 | Composition A | 3.5 μm | Composition 1-17 | 6.4 μm | C | A | B | A | A |
| Example 1-18 | Composition A | 3.5 μm | Composition 1-19 | 6.4 μm | B | B | A | A | A |
| Example 1-19 | Composition A | 3.5 μm | Composition 1-25 | 6.4 μm | A | A | A | A | A |
| Example 1-20 | Composition A | 3.5 μm | Composition 1-26 | 6.4 μm | C | A | B | A | A |
| Example 1-21 | Composition A | 3.5 μm | Composition 1-30 | 6.4 μm | A | B | A | A | A |
| Example 1-22 | Composition A | 3.5 μm | Composition 1-31 | 6.4 μm | A | B | A | A | A |
| Example 1-23 | Composition A | 3.5 μm | Composition 1-32 | 6.4 μm | A | C | A | A | A |
| Example 1-24 | Composition A | 3.5 μm | Composition 1-33 | 6.4 μm | A | D | A | A | A |
| Example 1-25 | Composition A | 3.5 μm | Composition 1-34 | 6.4 μm | A | D | A | A | A |
| Example 1-26 | Composition A | 3.5 μm | Composition 1-35 | 6.4 μm | C | B | A | A | A |
| Example 1-27 | Composition A | 3.5 μm | Composition 1-36 | 6.4 μm | C | B | A | A | A |
| Comparative Example 1-1 | None | — | Composition 1-18 | 3.2 μm | C | A | E | A | A |
| Comparative Example 1-2 | None | — | Composition 1-18 | 6.4 μm | B | A | E | A | A |
| Comparative Example 1-3 | None | — | Composition 1-18 | 9.6 μm | A | B | E | A | A |
| Comparative Example 1-4 | Composition A | 5.0 μm | None | — | E | A | A | B | A |
| Comparative Example 1-5 | Composition B | 80 μm | None | — | E | A | A | A | A |
| Comparative Example 1-6 | Composition C | 1.5 μm | None | — | E | A | E | A | A |
| Comparative Example 1-7 | Composition D | 1.5 μm | None | — | E | A | D | A | A |
| Comparative Example 1-8 | Composition E | 1.5 μm | None | — | E | A | A | C | E |
| Comparative Example 1-9 | Composition F | 2.0 μm | None | — | E | A | E | C | E |

As shown in the above table, in Examples, the whiteness was good and the visible light transmittance was appropriate. Further, the infrared-shielding property was excellent. Incidentally, the lower layer in the laminates of Examples was a layer that shielded at least a part of a wavelength range at 800 to 1,500 nm. In addition, the upper layer in the laminates of Examples had a value of L* of 35 to 100, a value of a* of −10 to 0, and a value of b* of −35 to 0 in a L*a*b* color coordinate system of CIE 1976.

Test Example 3

<Evaluation of Residual Color Mixture>

A composition for a lower layer shown in the following table was applied onto an 8-inch glass wafer with a spin coater such that the film thickness after drying became a film thickness described in the following table, and then subafter, a heating treatment (post-baking) was performed using a hot plate at 200° C. for 5 minutes to prepare a lower layer, and the transmittance at 400 nm to 1,200 nm was measured by the same method as for evaluation of the heat resistance in Test Example 1.

Subsequently, a composition for an upper layer shown in the following table was applied thereonto using a spin coater such that the film thickness after drying became a film thickness described in the following table, and subjected to a heating treatment (pre-baking) using a hot plate at 110° C. for 120 seconds.

Thereafter, the glass wafer having the exposed film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to carry out the removal of the white layer. Then, the transmittance at 400 nm to 1,200 nm was measured by the same method as for evaluation of the heat resistance in Test Example 1.

The spectral variation (ΔT % max) in the maximum transmittance after the preparation of the lower layer and after the removal of the white layer of the upper layer by development was evaluated as a residual color mixture of the upper layer (white layer) remaining on the infrared-absorbing material formed as the lower layer. As the variation is smaller, it is more difficult to generate the residual color mixture, which is thus more preferable.

~Decision Standard~
A: ΔT % max≤0.5%
B: 0.5%<ΔT % max≤1.0%
C: 1.0%<ΔT % max≤3.0%
D: 3.0%<ΔT % max≤5.0%
E: ΔT % max>5.0%

In the decision standards, A to D are levels at which there is no problem in practical use.

Test Example 4

A composition for a lower layer shown in the following table was applied onto a silicon wafer with a spin coater such that the film thickness after drying became a film thickness described in the following table, and then subjected to a heating treatment (pre-baking) using a hot plate at 110° C. for 120 seconds. Subsequently, a composition for an upper layer shown in the following table was applied thereonto using a spin coater such that the film thickness after drying became a film thickness described in the following table, and subjected to a heating treatment (pre-baking) using a hot plate at 110° C. for 120 seconds. Subsequently, exposure (at an exposure dose of 1,000 mJ/cm$^2$) was performed through a mask to form an island pattern in 20 μm$^2$, using an i-ray stepper exposure device FPA-3000i5+(manufactured by Canon Inc.). Then, the composition layer after the exposure was subjected to development using a development apparatus (Act8 manufactured by Tokyo Electron Ltd.). The composition layer was subjected to shower development at 23° C. for 60 seconds, using a 0.3%-by-mass aqueous tetramethylammonium hydroxide (TMAH) solution as a developer. Thereafter, the composition layer was rinsed in spin shower using pure water to obtain a pattern. Thus, a laminate having patterns formed thereon was obtained.

<Pattern Shape>

The shape of the obtained pattern was observed (magnification: 5,000 times), using a scanning electron microscope (SEM) (S-4800H, manufactured by Hitachi High-Technologies Corporation), and evaluated. The evaluation standard of the pattern shape is as follows. With regard to evaluation of the pattern shape, A, B, C, or D is evaluated as being preferable, A, B, or C is evaluated as being more preferable, A or B is evaluated as being still more preferable, and A is evaluated as being particularly preferable.

A: One side of the pattern is linear as in (a) of FIG. 1.
B: Corners of the pattern are slightly rounded as in (b) of FIG. 1.
C: One side of the pattern is slightly rounded as in (c) of FIG. 1.
D: The pattern is rounded as in (d) of FIG. 1.
E: The entire pattern is rounded as in (e) of FIG. 1.

<Adhesiveness>

The adhesiveness between the upper layer and the lower layer was evaluated by the following method. A pattern group having a pattern size of 20 μm out of the patterns prepared in the evaluation of the pattern shape was observed with an optical microscope (manufactured by Olympus Corporation). The evaluation standard of the adhesiveness is as follows. With regard to evaluation of the adhesiveness, A, B, C, or D is evaluated as being preferable, A, B, or C is evaluated as being more preferable, A or B is evaluated as being still more preferable, and A is evaluated as being particularly preferable.

A: There is no peeling or chipping in the pattern.
B: The peeling or chipping of the pattern as observed is less than 5%.
C: The peeling or chipping of the pattern as observed is 5% or more and less than 10%.
D: The peeling or chipping of the pattern as observed is 10% or more and less than 30%.
E: The peeling or chipping of the pattern as observed is 30% or more.

TABLE 7

| | Lower layer | Film thickness of lower layer | Upper layer | Film thickness of film thickness | Residual color mixture with lower layer | Pattern shape | Adhesiveness |
|---|---|---|---|---|---|---|---|
| Example 2-1 | Composition A | 3.5 μm | Composition 1-1 | 3.5 μm | B | B | C |
| Example 2-2 | Composition A | 3.5 μm | Composition 1-2 | 3.5 μm | B | B | C |
| Example 2-3 | Composition A | 3.5 μm | Composition 1-3 | 3.5 μm | B | B | C |
| Example 2-4 | Composition A | 3.5 μm | Composition 1-4 | 3.5 μm | B | B | C |
| Example 2-5 | Composition A | 3.5 μm | Composition 1-5 | 3.5 μm | B | B | C |
| Example 2-6 | Composition A | 3.5 μm | Composition 1-6 | 3.5 μm | B | B | C |
| Example 2-7 | Composition A | 3.5 μm | Composition 1-7 | 3.5 μm | B | B | C |
| Example 2-8 | Composition A | 3.5 μm | Composition 1-8 | 3.5 μm | B | A | C |
| Example 2-9 | Composition A | 3.5 μm | Composition 1-9 | 3.5 μm | B | B | B |
| Example 2-10 | Composition A | 3.5 μm | Composition 1-10 | 3.5 μm | A | B | B |
| Example 2-11 | Composition A | 3.5 μm | Composition 1-11 | 3.5 μm | A | A | B |
| Example 2-12 | Composition A | 3.5 μm | Composition 1-12 | 3.5 μm | A | A | B |
| Example 2-13 | Composition A | 3.5 μm | Composition 1-13 | 3.5 μm | A | A | B |
| Example 2-14 | Composition A | 3.5 μm | Composition 1-14 | 3.5 μm | A | A | B |
| Example 2-15 | Composition A | 3.5 μm | Composition 1-15 | 3.5 μm | A | A | A |
| Example 2-16 | Composition A | 3.5 μm | Composition 1-16 | 3.5 μm | A | A | A |
| Example 2-17 | Composition A | 3.5 μm | Composition 1-17 | 3.5 μm | A | A | A |
| Example 2-18 | Composition A | 3.5 μm | Composition 1-18 | 3.5 μm | A | A | A |
| Example 2-19 | Composition A | 3.5 μm | Composition 1-19 | 3.5 μm | A | A | A |
| Example 2-20 | Composition A | 3.5 μm | Composition 1-20 | 3.5 μm | A | A | A |
| Example 2-21 | Composition A | 3.5 μm | Composition 1-21 | 3.5 μm | A | A | A |

TABLE 7-continued

| | Lower layer | Film thickness of lower layer | Upper layer | Film thickness of film thickness | Residual color mixture with lower layer | Pattern shape | Adhesiveness |
|---|---|---|---|---|---|---|---|
| Example 2-22 | Composition A | 3.5 μm | Composition 1-22 | 3.5 μm | A | A | A |
| Example 2-23 | Composition A | 3.5 μm | Composition 1-23 | 3.5 μm | A | A | A |
| Example 2-24 | Composition A | 3.5 μm | Composition 1-24 | 3.5 μm | B | A | A |
| Example 2-25 | Composition A | 3.5 μm | Composition 1-25 | 3.5 μm | B | A | A |
| Example 2-26 | Composition A | 3.5 μm | Composition 1-26 | 3.5 μm | A | A | A |
| Example 2-27 | Composition A | 3.5 μm | Composition 1-27 | 3.5 μm | A | A | A |
| Example 2-28 | Composition A | 3.5 μm | Composition 1-28 | 3.5 μm | B | A | B |
| Example 2-29 | Composition A | 3.5 μm | Composition 1-29 | 3.5 μm | B | A | A |
| Example 2-30 | Composition A | 3.5 μm | Composition 1-30 | 3.5 μm | A | A | A |
| Example 2-31 | Composition A | 3.5 μm | Composition 1-31 | 3.5 μm | A | A | A |
| Example 2-32 | Composition A | 3.5 μm | Composition 1-32 | 3.5 μm | B | A | A |
| Example 2-33 | Composition A | 3.5 μm | Composition 1-33 | 3.5 μm | B | A | A |
| Example 2-34 | Composition A | 3.5 μm | Composition 1-34 | 3.5 μm | B | A | A |
| Example 2-35 | Composition A | 3.5 μm | Composition 1-35 | 3.5 μm | B | A | A |
| Example 2-36 | Composition A | 3.5 μm | Composition 1-36 | 3.5 μm | A | A | A |
| Example 2-37 | Composition A | 3.5 μm | Composition 1-37 | 3.5 μm | A | A | A |
| Example 2-38 | Composition A | 3.5 μm | Composition 1-38 | 3.5 μm | A | A | A |
| Example 2-39 | Composition A | 3.5 μm | Composition 1-39 | 3.5 μm | A | A | A |
| Example 2-40 | Composition A | 3.5 μm | Composition 1-40 | 3.5 μm | A | A | A |
| Example 2-41 | Composition A | 3.5 μm | Composition 1-41 | 3.5 μm | A | A | A |

Also in the laminates of Examples 2-1 to 2-41, the visible transparency and the infrared-shielding property were excellent. Further, these laminates have a white layer having a whiteness, and thus, the whiteness was excellent. Further, the lower layer in the laminates of Examples was a layer that shielded at least a part of a wavelength range at 800 to 1,500 nm. Incidentally, the upper layer in the laminates of Examples had a value of L* of 35 to 100, a value of a* of −10 to 0, and a value of b* of −35 to 0 in a L*a*b* color coordinate system of CIE 1976.

<Composition for Forming High-Refractive-Index Layer>

[Preparation of Titanium Dioxide Dispersion Liquid (Dispersion Composition)]

A mixed liquid with the following composition was subjected to a dispersion treatment using NPM manufactured by Shinmaru Enterprises Corporation as a circular type dispersing device (beads mill) to obtain a titanium dioxide dispersion liquid as a dispersion composition.

~Composition~

Titanium dioxide (TTO-51(C) manufactured by Ishihara Sangyo Kaisha, Ltd., a crystalline form: rutile, a $TiO_2$ purity (%): 79% to 85%, surface-treated with $Al_2O_3$ and stearic acid, a specific surface area of 50 to 60 m$^2$/g, a primary particle diameter of 10 to 30 nm, and an oil absorption amount of 24 to 30 g/100 g): 150.0 parts by mass The following dispersion resin A-2 (a PGMEA solution with a solid content of 30% by mass): 110.1 parts by mass Propylene glycol monomethyl ether acetate (PGMEA): 235.3 parts by mass Dispersion resin A-2: Resin having the following structure (Mw=6,400, acid value=80 mgKOH/g). In the following structural formula, n is 14.

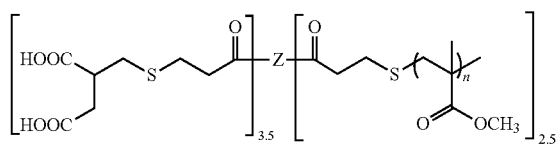

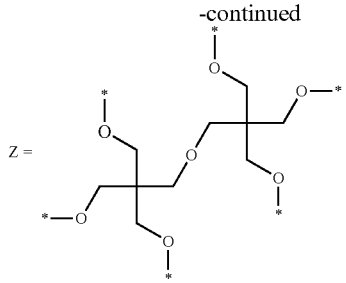

The dispersing device was operated under the following conditions.

Bead diameter: Diameter of 0.05 mm

Bead filling ratio: 60% by volume

Circumferential speed: 10 m/sec

Pump supply amount: 30 kg/hour

Cooling water: Tap water

Inner volume of beads mill annular passage: 1.0 L

Amount of mixed liquid to be subjected to dispersion treatment: 10 kg

After the initiation of dispersion, an average particle diameter was measured at a 30 minute interval (time for one pass). The average particle diameter decreased over the dispersion time (pass times), but the variation amounts gradually decreased. At a time point in which the change in the average particle diameter with an increase of the dispersion time by 30 minutes became 5 nm or less, the dispersion was stopped. Further, the average particle diameter of the titanium dioxide particles in the dispersion liquid was 40 nm. Incidentally, the average particle diameter of the titanium dioxide is a value obtained by 80-fold diluting a mixed liquid or dispersion liquid including titanium dioxide with PGMEA, and measuring the obtained diluted liquid using a dynamic light scattering method. This measurement was performed using MICROTRAC UPA-EX150 manufactured by Nikkiso Co., Ltd.

[Preparation of Composition for Forming High-Refractive-Index Layer]

Titanium dioxide dispersion liquid (dispersion composition) prepared above . . . 20.8 parts by mass
Solvent: PGMEA . . . 77.3 parts by mass
Compound having an epoxy group: JER157S65 (manufactured by Mitsubishi Chemical Corporation) . . . 1.7 parts by mass
Resin: Benzyl methacrylate/methacrylic acid copolymer (a PGMEA solution with a solid content of 40% by mass) (copolymerization ratio: 70/30 (% by mass), weight-average molecular weight: 30,000) . . . 0.2 parts
Surfactant 1: The following mixture (a weight-average molecular weight of 14,000, the following in the formula, % expressing the proportion of the repeating units is % by mass) . . . 0.03 parts by mass

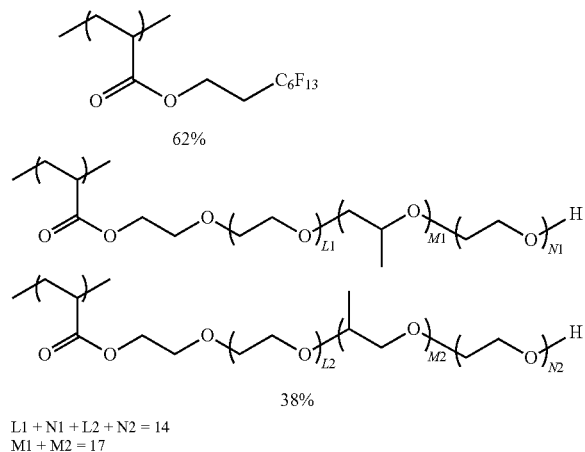

L1 + N1 + L2 + N2 = 14
M1 + M2 = 17

The obtained composition for forming a high-refractive-index layer was applied onto a silicon wafer to a film thickness of 0.1 μm, and then subjected to pre-baking (100° C. for 2 minutes) and post-baking (230° C. for 10 minutes) to form a film (high-refractive-index layer). The refractive index of the obtained film was measured using an ellipsometer manufactured by J. A. Woollam Japan Corp. The measurement conditions were set to 550 nm and 25° C., and an average value of five points was adopted and used. The refractive index was 1.90.

<Composition for Forming Low-Refractive-Index Layer>
[Preparation of Composition for Forming Low-Refractive-Index Layer]

A colloidal silica liquid was prepared by the method described in paragraph No. 0149 of JP2015-166449A.
The following components were blended to prepare a composition for forming a low-refractive-index layer.

A colloidal silica liquid prepared by the method described in paragraph No. 0149 of JP2015-166449A . . . 32.6 parts by mass
Solvent: ethyl lactate . . . 67.3 parts by mass
Surfactant 1: . . . 0.1 parts by mass The obtained composition for forming a low-refractive-index layer was applied onto a 4-inch silicon wafer to a film thickness of 0.1 μm, and then subjected to pre-baking (100° C. for 2 minutes) and post-baking (230° C. for 10 minutes) to form a film (low-refractive-index layer). The refractive index of the obtained film was measured by the same method as above. The refractive index was 1.23.

Test Example 5

A composition 1-18 was applied onto an 8-inch silicon wafer with a spin coater such that the film thickness after drying became 9.6 μm, and then subjected to a heating treatment (pre-baking) using a hot plate at 100° C. for 120 seconds. Subsequently, entire-surface exposure was performed at 1,000 mJ/cm² with light at a wavelength of 365 nm, using an i-ray stepper exposure device FPA-3000i5+ (manufactured by Canon Inc.). Then, a heating treatment (post-baking) was performed using a hot plate at 200° C. for 5 minutes to prepare a lower layer.

Subsequently, the low-refractive-index layers and the high-refractive-index layers, each having the thickness shown in the following table, were alternately laminated on the surface of the lower layer in the manner shown in the following table to form an infrared-shielding layer (dielectric multilayer film), and thus prepare a laminate. Further, starting from the film No. 1, the films were sequentially laminated on the surface of the lower layer. The low-refractive-index layer was formed by applying the composition for forming a low-refractive-index layer using a spin coater and drying on a hot plate at 100° C./120 sec. The high-refractive-index layer was formed by applying the composition for forming a high-refractive-index layer using a spin coater and drying on a hot plate at 200° C./3 min.

TABLE 8

| Layer No. | Layer configuration | Film thickness (nm) | Layer No. | Layer configuration | Film thickness (nm) |
| --- | --- | --- | --- | --- | --- |
| 15 | Low-refractive-index layer | 171 | 31 | Low-refractive-index layer | 87 |
| 14 | High-refractive-index layer | 131 | 30 | High-refractive-index layer | 103 |
| 13 | Low-refractive-index layer | 195 | 29 | Low-refractive-index layer | 175 |
| 12 | High-refractive-index layer | 121 | 28 | High-refractive-index layer | 99 |
| 11 | Low-refractive-index layer | 204 | 27 | Low-refractive-index layer | 166 |
| 10 | High-refractive-index layer | 127 | 26 | High-refractive-index layer | 101 |
| 9 | Low-refractive-index layer | 184 | 25 | Low-refractive-index layer | 169 |
| 8 | High-refractive-index layer | 114 | 24 | High-refractive-index layer | 87 |
| 7 | Low-refractive-index layer | 190 | 23 | Low-refractive-index layer | 166 |
| 6 | High-refractive-index layer | 110 | 22 | High-refractive-index layer | 104 |
| 5 | Low-refractive-index layer | 194 | 21 | Low-refractive-index layer | 136 |
| 4 | High-refractive-index layer | 118 | 20 | High-refractive-index layer | 98 |
| 3 | Low-refractive-index layer | 197 | 19 | Low-refractive-index layer | 157 |
| 2 | High-refractive-index layer | 119 | 18 | High-refractive-index layer | 82 |
| 1 | Low-refractive-index layer | 196 | 17 | Low-refractive-index layer | 134 |
|  |  |  | 16 | High-refractive-index layer | 87 |

The value of the L* in a L*a*b* color coordinate system of CIE 1976 of the white pattern in the obtained laminate was measured using a spectrophotometer (X-Rite 528, manufactured by X-Rite Inc.). A D65 light source was used as a light source, an observation field of view was set to 2°, and a white reference was set using a white patch of a calibration reference plate included in the spectrophotometer (X-Rite 528, manufactured by X-Rite Inc.). Thus, the value of L* was found to be 80 or more.

The obtained laminate had a good whiteness and an appropriate visible light transmittance. Further, the infrared-shielding property was excellent. Incidentally, in this laminate, the infrared-shielding layer (dielectric multilayer film) was a layer that shielded at least a part of a wavelength range at 800 to 1,500 nm.

Test Example 6

In the same manner as in (Test Example 5) except that the 8-inch silicon wafer was changed to an 8-inch glass wafer to form a lower layer (white layer) and an upper layer (dielectric multilayer film), and thus prepare a laminate. The obtained laminate had a good whiteness. For the laminate, evaluations of the visible light transmittance and the infrared-shielding property were performed by the same method as in Test Example 1. For the laminate, the average value of the transmittance at 400 nm to 700 nm was 15% or more and less than 25% and the average value of the transmittance at 700 nm to 1,200 nm was 15% or less.

What is claimed is:

1. A kit for forming a laminate having an infrared-shielding layer and a white layer, comprising:
a composition for forming an infrared-shielding layer containing a compound having a maximum absorption wavelength in a wavelength range at 800 to 1,500 nm; and
a composition for forming a white layer, including a white pigment and having a value of L* of 35 to 75 in a L*a*b* color coordinate system of CIE 1976 in a case of forming a film with a thickness of 3 μm,
wherein the composition for forming a white layer includes an alkali-soluble resin having an acid value of 30 to 120 mgKOH/g, a radically polymerizable compound having a molecular weight of 100 to 1,500, and a photopolymerization initiator.

2. The kit according to claim 1,
wherein the composition for forming a white layer includes a chain transfer agent.

3. The kit according to claim 1,
wherein the white pigment is in the form of particles having an average primary particle diameter of 50 to 150 nm.

4. The kit according to claim 3,
wherein the content of the particles having an average primary particle diameter of 50 to 150 nm is 30% to 60% by mass with respect to the total solid content of the composition for forming a white layer.

5. The kit according to claim 1,
wherein the white pigment is titanium oxide.

6. The kit according to claim 1,
wherein the composition for forming an infrared-shielding layer contains at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, and a copper complex.

7. The kit according to claim 1,
wherein the composition for forming an infrared-shielding layer contains tungsten oxide containing an alkali metal.

8. An optical sensor comprising a laminate, wherein:
the laminate comprises an infrared-shielding layer and a white layer,
the infrared-shielding layer is a layer that shields at least a part of a wavelength range at 800 to 1,500 nm, and has an average transmittance in a wavelength range of 400 to 700 nm of 60% to 100%, and
the white layer has a value of L* of 35 to 100, a value of a* of −20 to 20, and a value of b* of −40 to 30 in a L*a*b* color coordinate system of CIE 1976, and has an average transmittance in a wavelength range of 400 to 700 nm of 10% to 50%.

* * * * *